United States Patent [19]

Bozler et al.

[11] Patent Number: 5,588,994

[45] Date of Patent: *Dec. 31, 1996

[54] METHOD OF PRODUCING SHEETS OF CRYSTALLINE MATERIAL AND DEVICES MADE THEREFROM

[75] Inventors: Carl O. Bozler, Sudbury; John C. C. Fan, Chestnut Hill; Robert W. McClelland, Norwell, all of Mass.

[73] Assignee: Massachusetts Institute of Technology, Cambridge, Mass.

[ * ] Notice: The portion of the term of this patent subsequent to Feb. 23, 2005, has been disclaimed.

[21] Appl. No.: 468,530

[22] Filed: Jun. 6, 1995

Related U.S. Application Data

[63] Continuation of Ser. No. 291,389, Aug. 16, 1994, which is a continuation of Ser. No. 31,536, Mar. 15, 1993, Pat. No. 5,362,682, which is a continuation of Ser. No. 770,599, Oct. 3, 1991, abandoned, which is a continuation of Ser. No. 128,637, Dec. 4, 1987, abandoned, which is a continuation of Ser. No. 251,214, Apr. 6, 1981, Pat. No. 4,727,047, which is a continuation-in-part of Ser. No. 138,891, Apr. 10, 1980, abandoned.

[51] Int. Cl.[6] .................................................. C30B 29/06
[52] U.S. Cl. ...................... 117/89; 117/94; 117/95; 117/97; 117/913
[58] Field of Search .................. 117/913, 89, 94, 117/95, 97, 9, 43

[56] References Cited

U.S. PATENT DOCUMENTS

| | | | |
|---|---|---|---|
| 2,992,903 | 7/1961 | Imber | 23/273 |
| 3,031,275 | 4/1962 | Shockley | 23/301 |
| 3,112,997 | 12/1963 | Bezring et al. | 23/223.5 |
| 3,133,336 | 5/1964 | Marinace | 29/25.3 |
| 3,172,778 | 3/1965 | Gunther et al. | 117/213 |
| 3,186,880 | 6/1965 | Skaggs et al. | 148/1.6 |
| 3,247,576 | 4/1966 | Dill et al. | 29/155.5 |
| 3,336,159 | 8/1967 | Liebson | 117/201 |
| 3,341,376 | 9/1967 | Sperke et al. | 148/175 |
| 3,370,980 | 2/1968 | Anderson | 117/927 |
| 3,372,069 | 3/1968 | Bailey et al. | 148/175 |
| 3,425,879 | 2/1969 | Shaw et al. | 148/175 |
| 3,634,150 | 1/1972 | Horn | 148/175 |

(List continued on next page.)

FOREIGN PATENT DOCUMENTS

| | | |
|---|---|---|
| 1129220 | 7/1955 | France . |
| 1029941 | 5/1958 | Germany . |
| 1047911 | 12/1958 | Germany . |
| 1289831 | 2/1969 | Germany . |
| 958852 | 5/1962 | United Kingdom . |

OTHER PUBLICATIONS

Kirkpatrick et al, "A Nonconventional Approach to Thin Film Cell Fabrication" Conf. Record, 13th IEEE Photovoltacic Spec. Conf. Jun. 5–8, 1978 pp. 1342–1346.

IEEE Photovoltaic Specialist Conf.: "Peeled Film Technology for Solar Cells", A. G. Milnes, D. L. Feucht, 1975, pp. 338–341.

Journal of the Electrochemical Society: "Selective Epitaxial Deposition of Gallium Arsenide in Holes", Don W. Shaw, Sep. 1966, p. 90.

Solar Energy: Review Paper: "Solar Cells for Terrestrial Applications", Harold J. Hovel, vol. 19, 1977, pp. 605–615.

(List continued on next page.)

*Primary Examiner*—Robert Kunemund
*Attorney, Agent, or Firm*—Hamilton, Brook, Smith & Reynolds, P.C.

[57] ABSTRACT

A method of producing sheets of crystalline material is disclosed, as well as devices employing such sheets. In the method, a growth mask is formed upon a substrate and crystalline material is grown at areas of the substrate exposed through the mask and laterally over the surface of the mask to form a sheet of crystalline material. This sheet is optionally separated so that the substrate can be reused. The method has particular importance in forming sheets of crystalline semiconductor material for use in solid state devices.

26 Claims, 31 Drawing Sheets

U.S. PATENT DOCUMENTS

| | | | |
|---|---|---|---|
| 3,816,906 | 6/1974 | Falckenberg | 29/583 |
| 3,884,733 | 5/1975 | Bean | 148/175 |
| 3,900,943 | 8/1975 | Sirtl et al. | 29/572 |
| 4,027,053 | 5/1977 | Lesk | 427/53 |
| 4,046,618 | 9/1977 | Chaudhari et al. | 156/603 |
| 4,053,350 | 10/1977 | Olsen et al. | 156/659 |
| 4,094,704 | 6/1978 | Milnes | 136/89 |
| 4,116,751 | 9/1978 | Zaromb | 117/915 |
| 4,168,998 | 9/1979 | Hasegawa et al. | 148/175 |
| 4,224,750 | 1/1981 | Chenevas-Paule et al. | 136/255 |
| 4,381,201 | 4/1983 | Sakurai | 148/1.5 |
| 4,445,965 | 5/1984 | Milnes | 117/915 |
| 4,582,952 | 4/1986 | McNeely | 136/249 |
| 4,598,164 | 7/1986 | Tiedje et al. | 136/249 |
| 4,609,771 | 9/1986 | Guha et al. | 136/249 |
| 4,667,059 | 5/1987 | Olson | 136/249 |
| 4,680,422 | 7/1987 | Standbery | 136/249 |
| 4,681,982 | 7/1987 | Yoshida | 136/249 |
| 4,704,369 | 11/1987 | Nath et al. | 437/226 |
| 4,727,047 | 2/1988 | Bozler et al. | 437/89 |
| 4,816,420 | 3/1989 | Bozler et al. | 437/2 |
| 5,273,616 | 12/1993 | Bozler et al. | 117/915 |
| 5,362,682 | 11/1994 | Bozler et al. | 437/226 |

OTHER PUBLICATIONS

Abstract No. 224: "Thin Film GaAlAs–GaAs Solar Cells by Peeled Film Technology", by Makoto Konagai & Kiyoshi Takahasi, pp. 554–555.

"A Novel Crystal Growth Phenomenon: Single Crystal GaAs Overgro onto Silicon Dioxide ", F. W. Tausch, Jr. & A. G. Lapierre, III vol. 112, No. 7, pp. 706–709.

"Crystallographic orientation of silicon on an amorphous substrate using an artificial surface–relief grating and laser crystallization" by Geis et al. Lincoln Laboratory, Mass. Institute of Technology, Lexington, MA 02713.

*Applied Physics Letters*; "Lateral Epitaxy by Seeded Solidification for Growth of Single–Crystal Si Films on Insulators"; by Fan et al vol. 38, No. 5, Mar. 1, 1981; pp. 365–367.

IEEE Photovoltaic Specialist Conf.: "A Nonconventional Approach to Thin Film Cell Fabrication", Kirkpatrick et al., Jun. 5–8, 1978 pp. 1342–1346.

IBM Technical Disclosure Bulletin; "Producing Semiconductor Devices by Oriented Lateral Overgrowth", by W. Von Muench, vol. 10, No. 10, Mar. 1968; pp. 1469–1470.

Matzen et al., "A Device Model For The Tandem Junction Solar Cell" *Transactions On Electron Devices*, vol. ED–26:9(1365–1368), Sep. 1979.

Dupuis et al., "Stacked Multiple–Bandgap Solar Cells Prepared By CVD Techniques", *The Conference Record of the Fourteenth IEEE Photovoltaic Specialists Conference—1980* (pp. 1398–1399).

Fraas et a;, "Design Of High Efficiency Monolithic Stacked Multijunction Solar Cells" *The Conference Record of the Thirteenth IEEE Photovoltaic Specialists Conference—1978* (pp. 886–891).

Stouder, "Vers Un Rendement Optimal De l'energie Solaire" *La Revue Polytechnic*, No. 1385, May 1979 (473, 475 and 477).

```
┌─────────────────────────────────┐
│ FORM A GROWTH MASK ON A         │
│ CRYSTALLIZATION SUBSTRATE       │
└─────────────────────────────────┘
                │
┌─────────────────────────────────┐
│ DEPOSIT CRYSTALLINE MATERIAL AT │
│ EXPOSED AREAS OF THE SUBSTRATE  │
│ UNDER CONDITIONS WHEREBY CRYSTAL│
│ GROWTH COMMENCES                │
│ AT AREAS WHERE SUBSTRATE IS     │
│ EXPOSED AND SUSEQUENTLY         │
│ LATERALLY OVER THE SURFACE OF   │
│ THE MASK                        │
└─────────────────────────────────┘
                │
┌─────────────────────────────────┐
│ CONTINUE DEPOSITION AND CRYSTAL │
│ GROWTH UNTIL A SHEET OF         │
│ CRYSTALLINE MATERIAL HAVING     │
│ DESIRED DIMENSIONS HAS          │
│ FORMED OVER THE SURFACE OF      │
│ THE MASK                        │
└─────────────────────────────────┘
                │
┌─────────────────────────────────┐
│ SEPARATE THE SHEET OF CRYSTALLINE│
│ MATERIAL FROM THE SUBSTRATE     │
└─────────────────────────────────┘
                │
┌─────────────────────────────────┐
│ OPTIONALLY REUSE THE SUBSTRATE TO GROW│
│ ADDITIONAL SHEETS OF CRYSTALLINE│
│ MATERIAL                        │
└─────────────────────────────────┘
```

*FIG. 1*

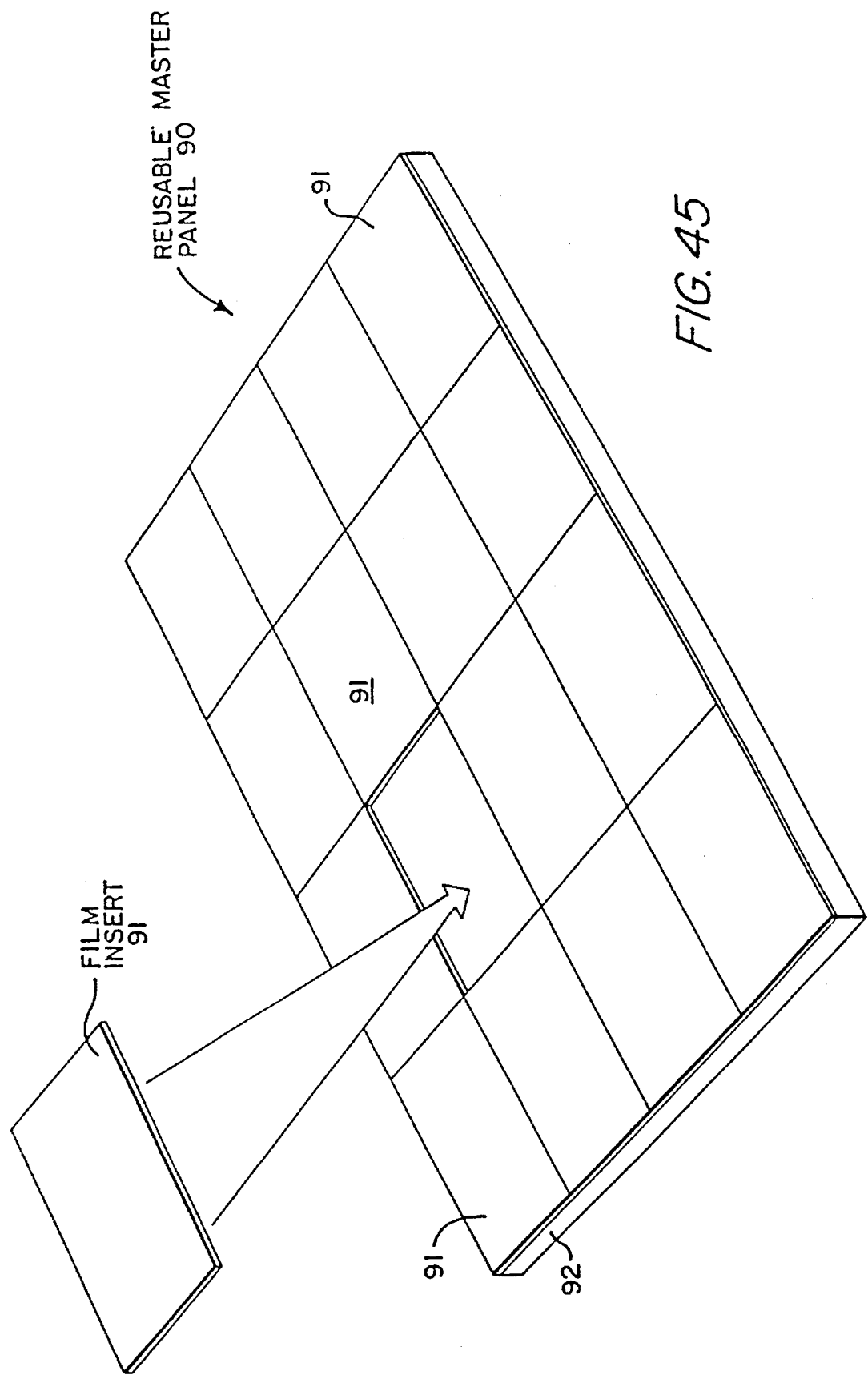

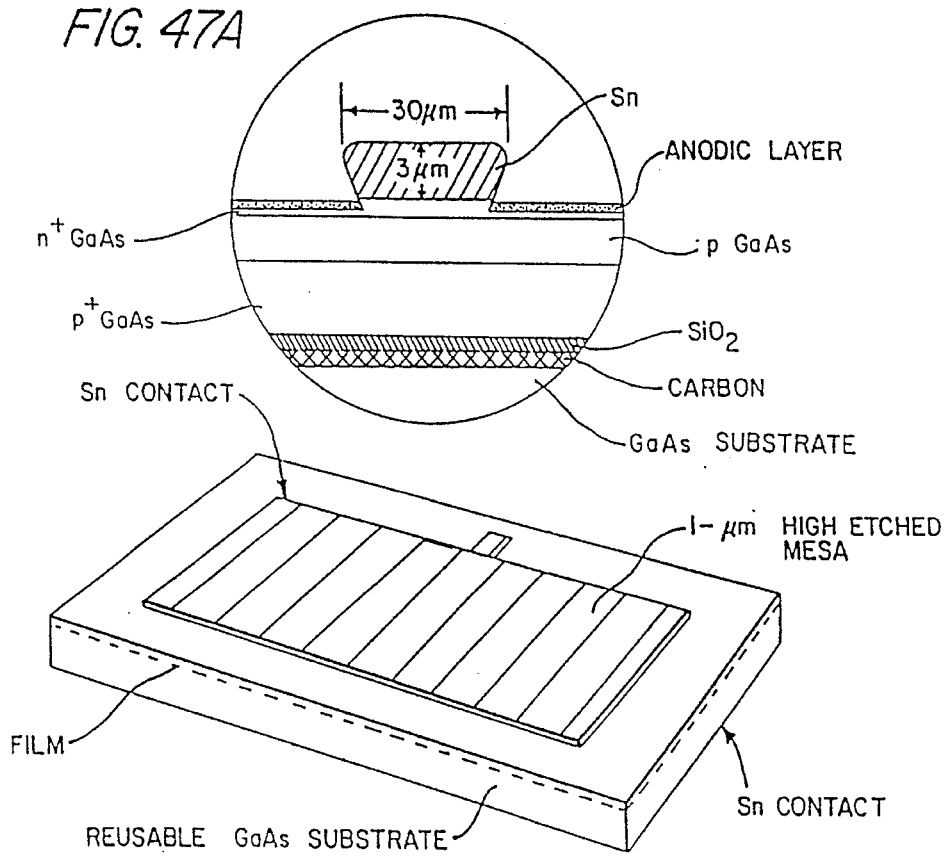
FIG. 47A
FIG. 47
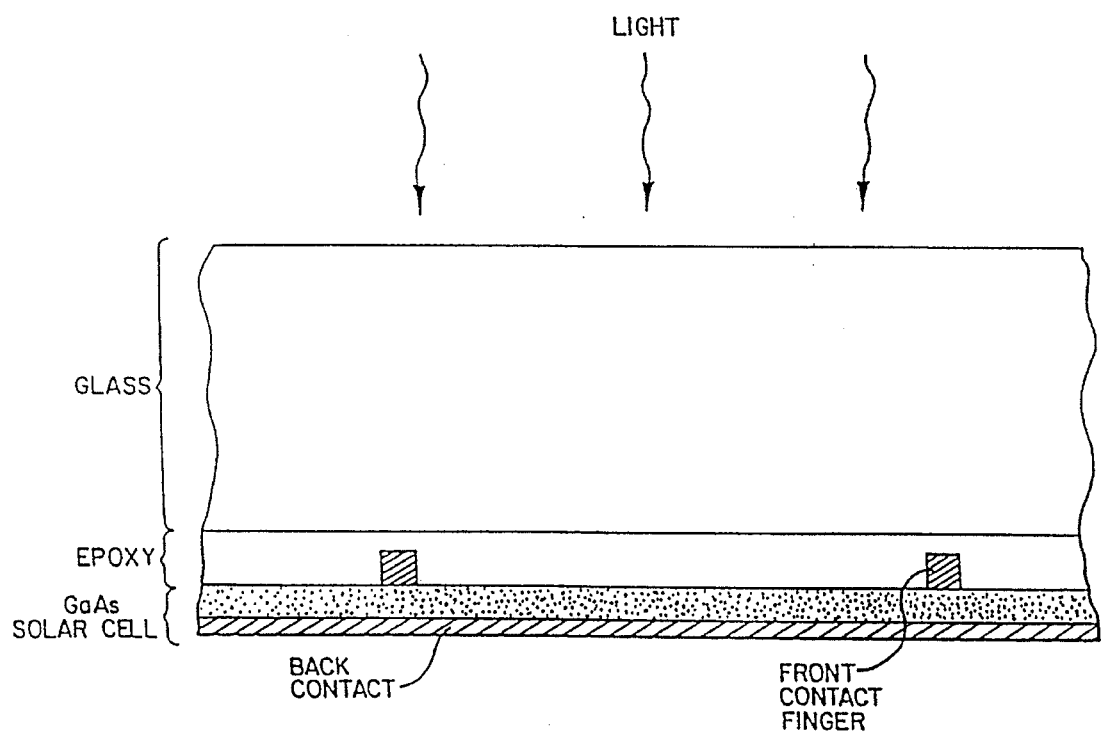
FIG. 48

METHOD OF PRODUCING SHEETS OF CRYSTALLINE MATERIAL AND DEVICES MADE THEREFROM

GOVERNMENT SUPPORT

Work described herein was supported by the U.S. Air Force.

RELATED APPLICATION

This application is a continuation of co-pending application Ser. No. 08/291,389 filed Aug. 16, 1994, which is a Continuation of U.S. Ser. No. 08/031,536 filed Mar. 15, 1993, which is a File Wrapper Continuation of U.S. Ser. No. 07/770,599 filed Oct. 3, 1991, abandoned which is a Continuation of U.S. Ser. No. 07/128,637 filed Dec. 4, 1987, abandoned, which is a Continuation of U.S. Ser. No. 06/251,214 filed Apr. 6, 1981 (U.S. Pat. No. 4,727,047), which is a Continuation-in-Part of U.S. Ser. No. 06/138,891 filed Apr. 10, 1980 (now abandoned). All of the above applications are incorporated herein by reference in their entirety.

TECHNICAL FIELD

This invention is in the field of materials, and more particularly relates to the production of sheets of crystalline material, including thin sheets of crystalline semiconductor materials grown epitaxially on single crystal substrates.

BACKGROUND ART

In many solid state electronic devices, the active volume of the device comprises or lies within a thin sheet, film or layer of crystalline semiconductor material, often in the single crystal or monocrystalline form. This is particularly true of devices or integrated circuits formed from semiconductors such as gallium arsenide, silicon, germanium, indium phosphide, cadmium telluride, etc. Present techniques for fabricating such devices, however, require that the crystalline sheets be formed upon or near the surface of relatively thick substrates of high-purity, single crystal semiconductor material, and the use of such substrates for each sheet produced tends to inordinately increase the cost of producing the thin sheets. The substrate costs come about from many causes which include the cost of raw materials, purification, crystal growth, cutting, polishing and cleaning.

It has been recognized that by employing a reuseable substrate all of the above costs could be reduced and many of the costs would be eliminated, and only a minimum of processing cost might be added back. Thus, attempts have been made to employ reuseable substrates in the production of thin sheets of single crystal semiconductor materials, and among these attempts are the following.

Milnes and Feucht have suggested a peeled film technology for fabricating thin films of single crystal silicon in the suggested procedure, a thin sheet of single crystal silicon is prepared by chemical vapor deposition of a thin silicon film on a silicon substrate previously coated with an epitaxial layer of a silicon-germanium alloy, thus forming a heteroepitaxy structure. The silicon film is then released from the substrate by melting the intermediate layer of silicon-germanium and subsequently peeling the silicon film from its substrate. The substrate may be reused in such peeled film technology. See Milnes, A. G. and Feucht, D. L., "Peeled Film Technology Solar Cells", *IEEE Photovoltaic Specialist Conference*, p. 338, 1975.

The Milnes and Feucht peeled film technology was subsequently extended to the production of gallium arsenide solar cells by employing a thin intermediate layer of gallium aluminum arsenide. In this case, the intermediate layer of gallium aluminum arsenide was selectively etched by hydrofluoric acid and the single crystal thin film of gallium-arsenide could then be removed from the substrate, which could be reused. See Konagai, M. and Takahashi, K., "Thin Film GaAlAs-GaAs Solar Cells by Peeled Film Technology," Abstract No. 224, *J. Electrochem. Soc.*, Extended Abstracts, Vol. 76-1, May, 1976.

Another technique for using a reuseable substrate to produce thin films of single crystal semiconductor materials is disclosed is U.S. Pat. No. 4,116,751, issued to Zaromb. In this technique, a continuous intermediate layer is also employed between a monocrystalline substrate and an outer material grown epitaxially to the substrate. The continuous intermediate layer can be broken up by cracking, sublimation, selective melting, or other techniques so that the outer layer can be removed from the substrate.

Such prior techniques for reusing single crystal substrates to produce sheets of single crystal material have suffered from certain inherent problems. As an example, these prior art techniques necessitated that the material chosen for the intermediate layer had very special properties. For example, the material employed for the intermediate layer in these techniques was required to be a different material from the substrate material and yet be a material which could be grown epitaxially on the substrate and one which would thereafter allow the sheet to be grown epitaxially on the intermediate layer. This greatly narrowed the class of candidate materials, but beyond these limitations, the intermediate material also had to have melting, sublimation, mechanical, etching or other properties significantly different from those of the substrate and overgrown film. Further, the epitaxial growth procedures required to produce the required heterostructures were found to be difficult to carry out, which further limited the application of such concepts as peeled film technology. Those procedures employing sublimation or melting of the intermediate layer to separate the film from the substrate required elevated temperatures in processing, and such elevated temperatures often had deleterious effects on the device being fabricated.

Techniques employing selective etching were particularly difficult to perform on a practical basis. Since the intermediate layer was relatively thin and continuous, it was found to be difficult to circulate an etchant through the small openings formed at the edges of substrates having films thereon, especially over the large distances required to produce large area sheets. As noted, the preferential etching properties required for the material of the intermediate layer produced further restraints on materials which could be selected for this layer.

As a result, previously suggested approaches to using reuseable substrates were found to be impractical for the production of sheets of crystalline material, particularly large area, thin sheets of semiconductor material, at competitive costs. For any particular semiconductor material, there was an extremely narrow class of materials which could be chosen for the intermediate layer required and the epitaxial growth techniques required to form heterostructures were difficult to carry out. Because of such problems, these techniques never achieved general acceptance for the production of crystalline sheets of semiconductor material.

DISCLOSURE OF THE INVENTION

This invention relates to the production of sheets of crystalline material, particularly thin sheets of crystalline semiconductor material grown epitaxially on single crystal substrates which can be optionally reuseable.

In one embodiment of this invention, a growth mask is formed on a crystallization substrate and crystalline material is then grown at areas of the crystallization substrate which are exposed through the growth mask. Growth conditions are selected and employed so that crystalline material grows up through exposed areas of the mask and then laterally out over the surface of the mask. Deposition and growth of crystalline material are continued, allowing further growth, especially in the lateral direction, to thereby form a sheet of crystalline material over the surface of the mask and crystallization substrate. When the sheet has reached the desired dimensions, growth is discontinued and the sheet of crystalline material is separated from its substrate, which can optionally be reused. Separation can be achieved by employing a variety of techniques, including the use of mechanical shock fronts to cleave the sheet of crystalline semiconductor material along a cleavage plane.

In an alternative embodiment, lateral overgrowth of sheets of crystalline material is achieved without the necessity for a growth mask. This embodiment employs a substrate having thin strips of crystalline material on the surface thereof or exposed areas of embedded crystalline material. Further growth can then occur laterally from these strips or areas to form sheets of crystalline material.

In still other embodiments, various devices are fabricated without separating the sheets of crystalline material from the substrate.

The method for producing sheets of crystalline material on reuseable substrates described herein has advantages over previously suggested methods for employing reuseable substrates in such production. One such advantage is the elimination of the requirement to employ heteroepitaxy techniques to produce an intermediate layer. A much wider class of materials can be employed as suitable growth masks according to this invention than the class suitable for the intermediate layers of the prior art techniques. The material employed for the growth mask, for example, need not be single crystal, nor even crystalline. Further, the growth mask need not be grown epitaxially to the substrate, and there are, in fact, a wide variety of methods for applying the growth mask which would not be possible for intermediate layers of the prior art.

A further advantage is that the crystal quality for laterally overgrown crystalline layers according to this invention can be superior in most cases to crystalline layers grown by heteroepitaxy techniques.

A still further advantage is obtained because there are no continuous intermediate layers required and separation is more easily achieved because of the discontinuous nature of areas of attachment between the substrate and overgrown film. Techniques such as cleavage are thus made possible. On the other hand, it is still possible to employ preferential melting, sublimation or etching techniques, if desired, with or without heteroepitaxy structures. Even where such heteroepitaxy techniques are employed, the selective melting, sublimation or etching can be expected to be more easily carried out because the areas of contact between film and substrate are discontinuous and have only relatively small quantities of material which need to be selectively melted, sublimed or etched for separation. In short, the use of the lateral overgrowth techniques of this invention makes the growth and separation of sheets of crystalline material on reuseable substrates practical.

It is known that thin (e.g., about 50 μm) silicon solar cells have great potential for both space and terrestrial applications. Unfortunately, the present technology for preparing such thin silicon &beets includes wasteful etching and polishing steps, is time consuming and also often produces a wavy surface finish. See Ho, F. and Iles, P. A., 13th IEEE Photovoltaic Specialists Conference, Washington, D.C. 1978, p 454. On the other hand, the invention described herein can bypass these problems in solar cell fabrication. Continuous silicon layers, about 50 μm thick, can be deposited on silicon substrates with a growth mask configuration thereon. The silicon layers can then be separated, as discussed below, to produce thin silicon sheets without the necessity of the conventional steps of crystal cutting, wafer polishing and etching.

In addition to those advantages which result from reusing substrates in the production of thin semiconductor sheets, there are advantages to the invention described herein even when the crystallization substrate is not reused.

For example, it is desirable for the manufacture of integrated circuits that thin sheets of semiconductor (e.g., about 1 μm thick) be provided on a low-loss insulating substrate. One example of such a coimbination is silicon on sapphire (SOS) which is currently widely used for integrated circuits. The silicon film in SOS is known to have many defects and low lifetime, whereas the separated films described in this invention are likely to be of much higher quality, and will also allow a much wider combination of substrates and semiconductors. Since the material cost is often not a major factor in the cost of an integrated circuit, the substrate might not be reused for this application.

BRIEF DESCRIPTION OF THE DRAWINGS

FIG. 1 is a process flow diagram for one embodiment of a process according to this invention;

FIG. 45 is a schematic view of a reuseable master panel for forming solar panels according to this invention;

FIG. 47A is an expanded view of a portion of FIG. 47.

BEST MODE FOR CARRYING OUT THE INVENTION

Figure 2A:
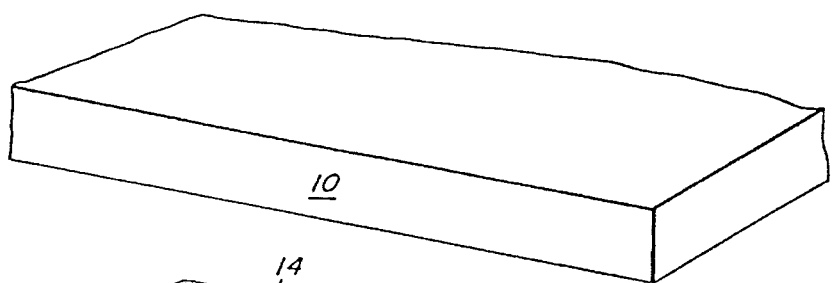
FIGS. 2A–2F present a series of schematic views illustrating the production of a thin sheet of crystalline material on a reusable crystallization substrate according to the embodiment of FIG. 1.

A variety of specific embodiments of this invention will now be illustrated with reference to the Figures. In these Figures, like elements have been given like numerals.

FIG. 1 is a process flow sheet presenting the steps for one embodiment of this invention. In the first step of this process, a crystal growth mask is formed on a crystallization substrate to cover portions of the substrate and to leave a pattern of exposed substrate areas. The crystallization substrate can be a single crystal substrate, such as a single crystal of gallium arsenide or other semiconductor, or any other substrate capable of supporting crystal growth on at least Some exposed area of the surface. The growth mask is formed from a material which will not support crystal growth under the growth conditions employed, or will only support slight crystal growth which is not significant compared to the crystal growth rate at areas of substrate exposed through the mask.

In the next step of this embodiment, crystalline material is deposited at exposed areas of the substrate. This might be done, for example, by placing the masked substrate in a crystal growth reactor, such as a vapor-phase epitaxy reactor. Crystalline material deposits at those areas of the substrate exposed by the growth mask, and when growth reaches the surface of the mask, under proper growth conditions, further crystal growth occurs laterally out over the surface of the mask.

Crystal deposition and growth are then continued so that lateral growth of material from the exposed masked aras continues until a sheet of crystalline material having the desired dimensions has formed. Although it is not always necessary, in many cases lateral overgrowth is continued until a continuous sheet of material has formed from the discontinuous growth regions formed at exposed areas of substrate.

A sheet of crystalline material can then be separated from the substrate using a variety of techniques depending on the growth mask which is employed. For example, if a low adhesion growth mask is used, the sheet can be cleaved using a mechanical shock front to cleave the sheet at the supporting ribs which have grown up through exposed areas of the crystal growth mask. Alternatively, various additional materials can be initially crystallized in step 2 at exposed areas of substrate followed by growth of the crystalline sheet material after which the initially crystallized materials can be preferentially etched, melted, sublimed, cleaved, or otherwise removed or broken to separate the sheet of crystalline material from the crystallization substrate.

The crystallization substrate can then optionally be reused to grow additional sheets of crystalline material. Usually, some cleaning and other minor preparation of the substrate is necessary, although this may not be required in all cases. Such substrates can be used multiple times to grow many sheets of thin crystalline material thereby significantly reducing the cost for such thin sheets of crystalline material.

FIG. 2 presents a series of views which schematically illustrate the production of a continuous thin sheet of crystalline material on a crystallization substrate according to the process of FIG. 1.

In FIG. 2A, relatively thick reuseable crystallization substrate 10 is shown. This substrate can be any material capable of supporting crystal growth thereon. As a typical example of a substrate suitable for growing single crystal gallium arsenide thereon, reuseable substrate 10 might be a slab of gallium arsenide in the range of 5–50 mils thick and might be doped or undoped. If the crystalline film produced is to be separated by cleavage, it is preferred, although not essential, that substrate 10 have an orientation so that the surface of substrate 10 lies in a plane which is a preferential cleavage plane for the substrate material.

Figure 2B:
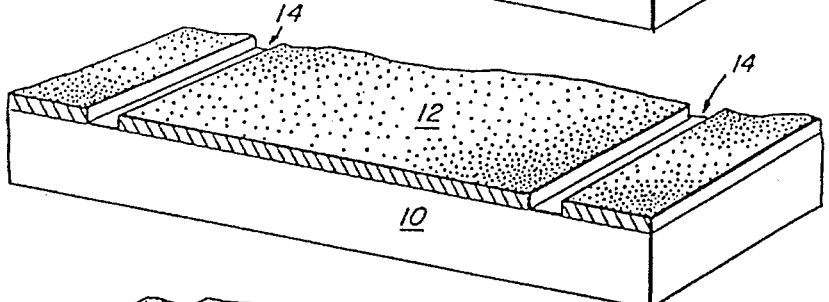

Crystal growth mask 12 is then applied to substrate 10 and mask 12 has a pattern of openings through which substrate 10 is exposed. One typical pattern found to be suitable is a pattern of slits 14 as shown in FIG. 2B. The ratio of width to spacing for slits 14 can be widely varied depending upon the materials, growth conditions, required layer thickness, separation techniques employed, etc., and the optimum ratio, which depends on the particular application, can be determined by methods described in more detail below. In general, the width of slits 14 is preferably less than the thickness of the film to be grown. Of course, growth masks having patterns of exposed areas other than slits can also be employed.

One suitable technique for forming crystal growth mask 12 is by employing carbonized photoresist because carbon has very low adhesion to gallium arsenide and is also inert to the reactants normally found in an epitaxial growth system. Hence, carbon is an outstanding material to use for the growth mask 12 in many applications.

Photoresist, which typically contains carbon, hydrogen, sulphur and/or oxygen, is initially deposited over a crystallization substrate and is then partially oxidized and volatilized by a high temperature bake to remove the hydrogen, sulphur and/or oxygen atoms. This leaves behind a mask of carbon. Such a "carbonization" process provides a way to apply a film of carbon to the surface of another material by first coating the material in a conventional manner with a photoresist, such as Shipley 1350J. The photoresist can then be patterned optically using conventional techniques or can be left unpatterned. During carbonization, the thickness of the film is reduced as the atoms other than carbon are volatilized or burned up. Heating in air at 400° C. for 1 minute is a typical high temperature bake necessary to carbonize Shipley 1350J photoresist.

Although there are other techniques for applying carbon layers to surfaces of other materials, such as vacuum evaporation, sputtering, pyrolytic deposition, etc., these suffer certain disadvantages when used for deposition of carbon. For example, films produced by such techniques are typically high stress, low-adhesion films and further require a number of steps to pattern. The carbonized photoresist offers several improvements over such methods. For example, it typically produces a "mask" which has better adhesion, lower stress, and can be easily patterned directly with fewer processing steps compared to films produced by prior methods.

Of course, materials other than photoresist can be employed in a carbonization process. The only requirement would appear to be that the material be composed of carbon and at least one other type of atom so that it could be "carbonized" by volatilizing the atoms other than carbon thereby leaving behind a mask of carbon.

Figure 2C:
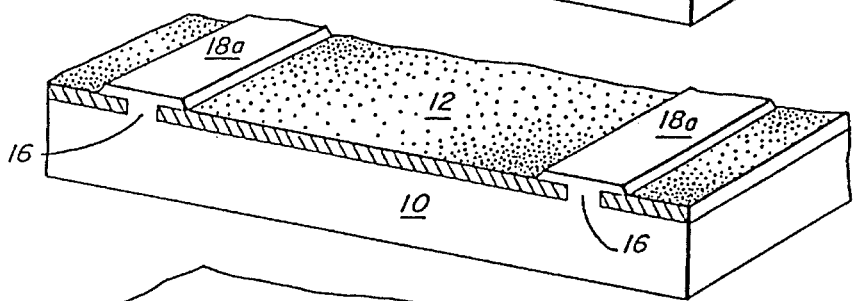

Once the mask is in place on a substrate, crystalline material can be deposited by placing the masked substrate in a crystallization reactor system, or by other known growth techniques. An example of a suitable crystallization reactor system for epitaxial growth of gallium arsenide to a single crystal gallium arsenide substrate is an $AsCl_3$—Ga—$H_2$ vapor-phase epitaxy system. As illustrated in FIG. 2C, crystal growth initially occurs at those areas of the substrate exposed at the bottom of slits 14 in growth mask 12. This forms ribs 16 within slits 14, which often serve as the point at which a completed sheet of crystalline material can be separated from its substrate. The height of ribs 16, which is equal to the mask thickness, has been exaggerated for illustrative purposes. Growth continues up through slits 14 and under proper growth conditions thereafter laterally over the surface of mask 12 to form laterally overgrown sheets 18a.

Figure 2D:
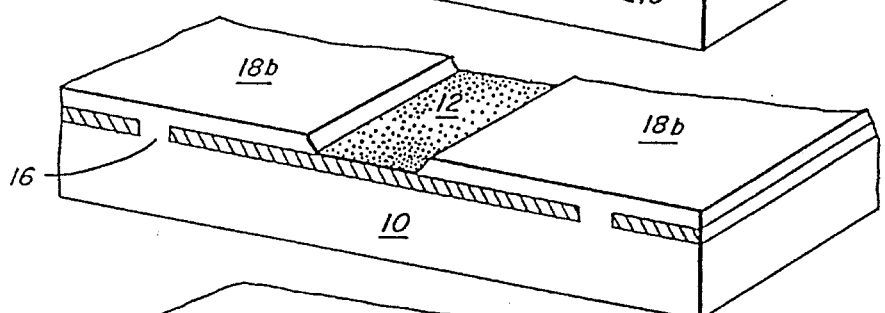

In FIG. 2D, continued growth of crystalline material is illustrated resulting in further lateral overgrowth to form sheets 18b, which are thicker and larger in area than sheets 18a.

Figure 2E:
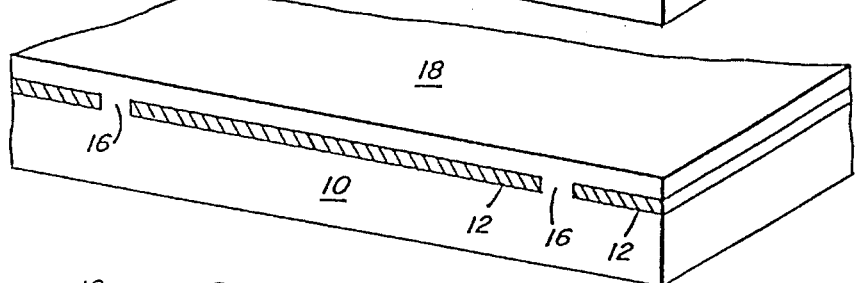

Deposition and growth can be continued, if desired, until sheets 18b join to form a continuous sheet 18 of crystalline material as illustrated in FIG. 2E. In a typical lateral overgrowth of a gallium arsenide film employing a mask with slits having a width of 2.5 µm on 50 µm centers, the film thickness might be about 1 µm at the point where a continuous film or sheet is formed. Growth can be continued, of course, to further thicken the film.

Figure 2F:
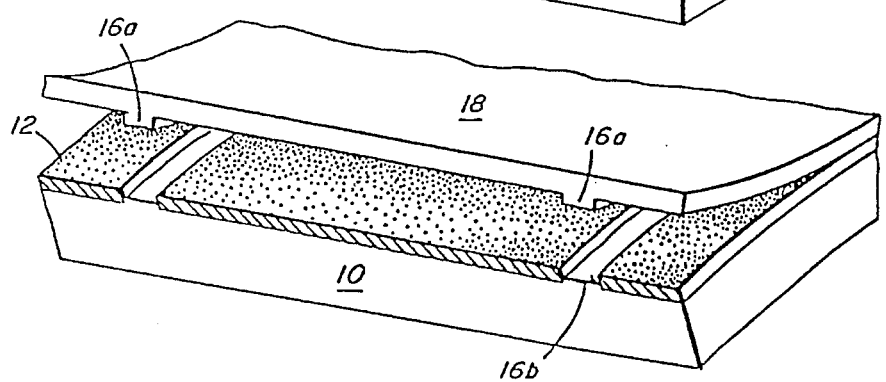

After the laterally overgrown film has been completed, the next step is separation of this film from its crystallization substrate. The specific separation technique used is often closely tied to the crystal growth mask employed as well as other growth parameters. FIG. 2F illustrates one possible technique in which separation is obtained by cleaving laterally overgrown film 18 from reuseable substrate 10 along ribs 16. The flexing of substrate 10 and film 12 have been exaggerated for purposes of illustration. Cleavage techniques for separation are described in more detail below.

Figure 3A:
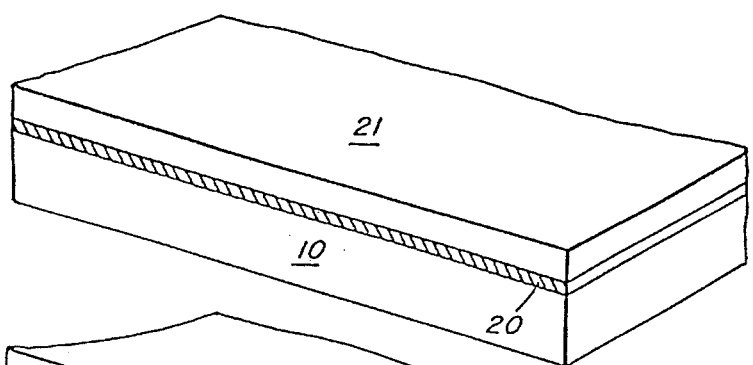
FIGS. 3A–3B present a series of schematic views illustrating a prior art technique for breaking a film from a reuseable substrate.
Figure 3B:
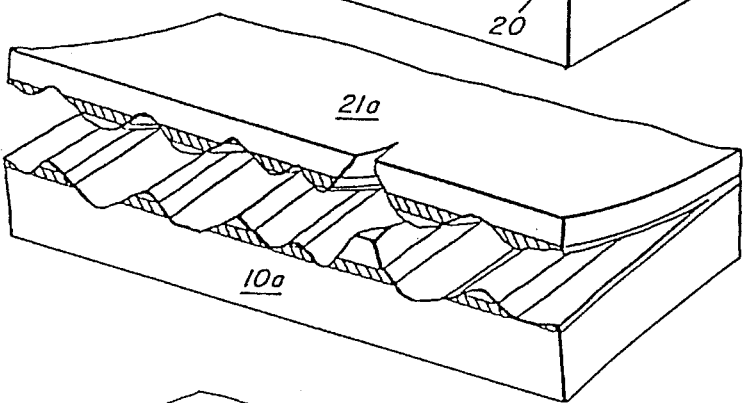

Nevertheless, prior to further discussion of the cleavage technique of this invention, a short discussion of a prior art separation technique is given. In the cracking techniques previously proposed for use with peeled film techniques, separation was supposed to occur in the intermediate layer which is a different material from the film. However, since this layer was part of an integral crystal structure which included a substrate, intermediate layer, and film to be peeled, there was not a well defined plane along which the crystal could break. As can be seen in FIGS. 3A, the line of breakage was supposed to follow intermediate layer 20, but usually wandered, as shown in FIG. 3B, thereby creating film 21a having a nonuniform thickness. In order to prevent such wandering of the break, the bonding between some of the atoms needs to be significantly weakened where separation is desired.

Figure 4A:
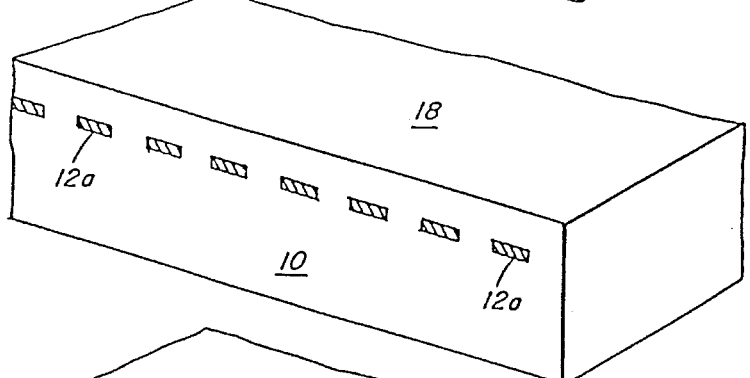
FIGS. 4A–4C present a series of schematic views illustrating a technique of this invention, in simplified form, for cleaving a laterally overgrown film from its crystallization substrate.
Figure 4B:
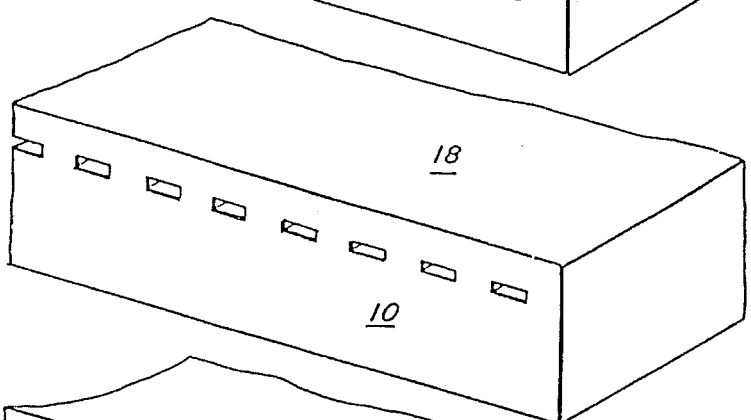

With the growth mask described herein, a weak layer in the crystal can be created. A structure with an embedded growth mask 12a is illustrated in FIG. 4A. In many cases, mask 12a can be formed from a material having low adhesion to the crystal, in which case the crystal can be imagined as having voids wherever mask material occurs, as illustrated in FIG. 4B. These tunnel-shaped voids can be thought of as an artificially formed cleavage plane since the bonding forces between some of the atoms in this plane have been weakened.

Figure 4C:
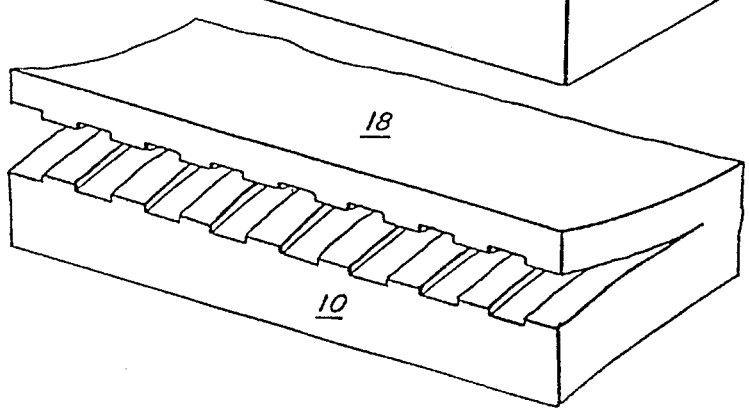

When a separating force is applied, as in FIG. 4C, the crystalline material will tend to break at its weakest point, which is the plane of the mask 12a. The plane of the break wanders generally within the range of the rib thickness, as shown in FIGS. 5A and 5B which are exploded partial cross-sectional views of the plane of breakage.

With low adhesion in the areas of the growth mask, the forces required to separate the overgrown sheet are applied essentially to the ribs which grow up through exposed areas of the substrate. The larger the ratio of the space a between ribs to the rib width b, the more the applied separation force becomes concentrated at the ribs, which is an advantage in many cases. However, all that is required is a weakening of the crystalline material in one plane to guide cleavage.

Figure 5A:
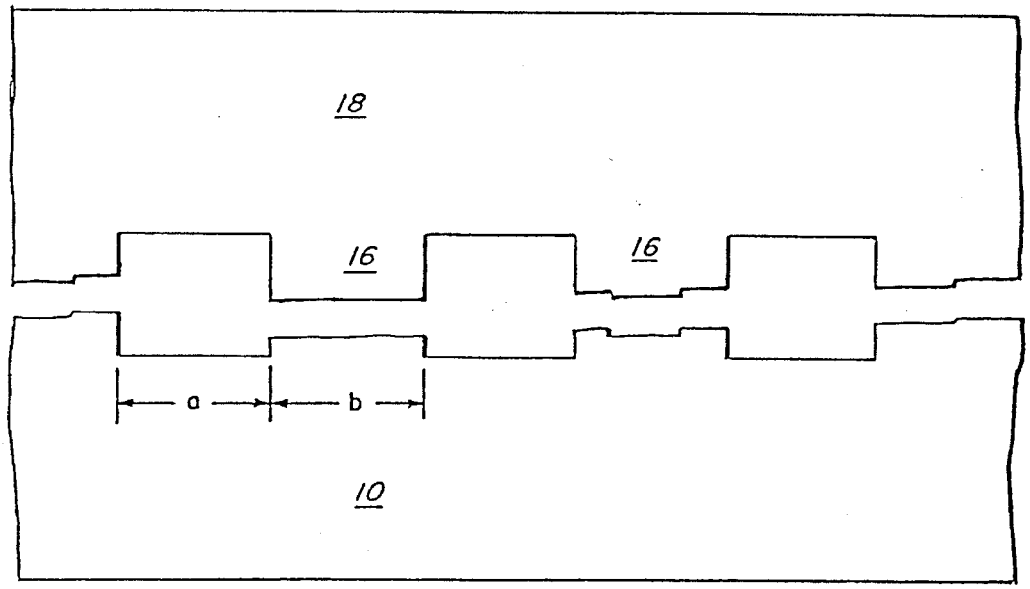
FIGS. 5A–5B are exploded partial cross-sectional views of the cleavage area of the separated film and substrate of FIG. 4C.

In FIG. 5A, cleavage is illustrated along a natural cleavage plane through the ribs as well as along the artificially created cleavage plane at mask areas. As noted above, the natural cleavage plane is one where the average bonding Strength between atoms is weaker than at other planes. Taking advantage of a natural cleavage plane lessens the separation forces required and tends to confine cleavage to a narrow band, as shown.

Figure 5B:
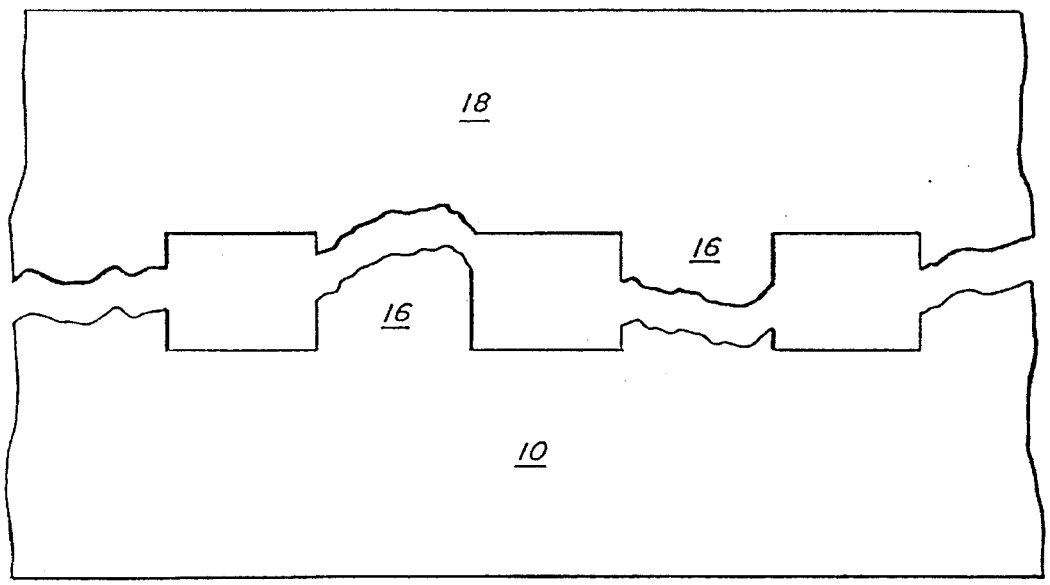

In FIG. 5B, cleavage is illustrated where the artificially created cleavage plane does not coincide with a natural cleavage plane. The result is that cleavage still follows the artificially created cleavage plane, but does not stay confined in such a narrow band as in FIG. 5A.

There are a number of ways in which a mask can be used to create low adhesion between the substrate and laterally overgrown film. In some cases, a material having the property of inherently low adhesion to the substrate and overgrown film materials can be employed as the growth mask. For example, a carbon film is an example of a material which has low adhesion to gallium arsenide. Since carbon also has good chemical inertness, as well as the capability to inhibit nucleation during crystal growth, it is suitable material for the growth mask when the substrate and laterally overgrown film material are gallium arsenide.

A specific technique for cleaving a sheet of laterally overgrown material, such as that produced by the process illustrated in FIGS. 1 and 2, is illustrated in FIG. 6.

Figure 6A:
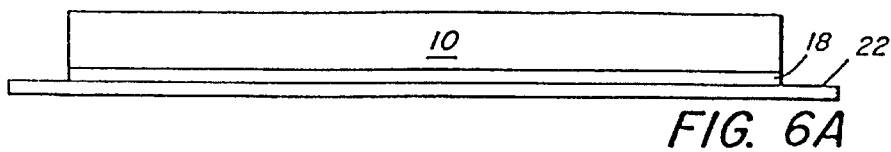
FIGS. 6A–6D present a series of schematic views illustrating in more detail a specific separation of a sheet of crystalline material from its crystallization substrate.

In FIG. 6A, reuseable substrate 10 has laterally overgrown crystalline sheet 18 thereon, and is positioned in an inverted position to that shown in FIG. 2E. Crystalline film 18 is initially bonded to a new substrate 22, such as a sheet of glass, by a bonding agent, such as epoxy. Sheets of ceramics, metals or other materials can be used for the new substrate, of course, and other bonding agents can be used as well.

Figure 6B:
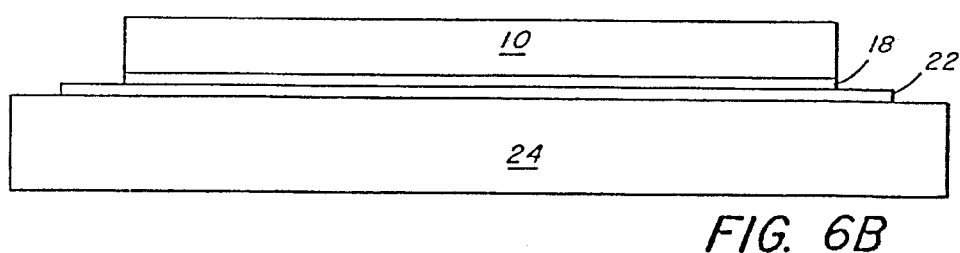

In the next step, a bonding agent, such as wax, is used to bond the new substrate 22 to a thicker supporting plate 24, as shown in FIG. 6B. Supporting plate 24 is both thicker and more rigid than new substrate 22, but can also be made of glass, as well as metal, etc. It is used to prevent the new substrate from flexing excessively during separation.

Figure 6C:
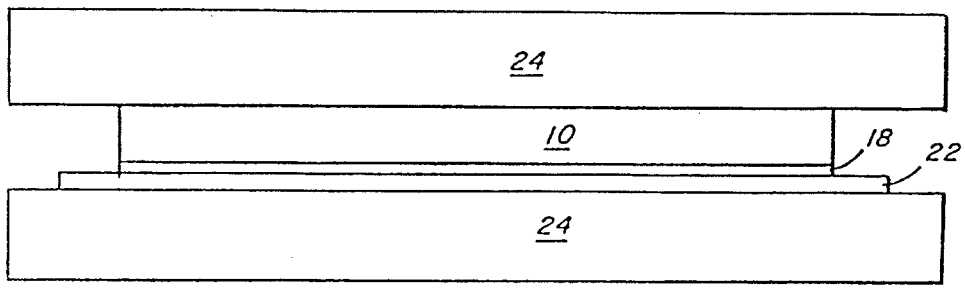

In FIG. 6C, another supporting plate 24 has been bonded to reuseable substrate 10 and serves a similar purpose as the first supporting plate 24.

Figure 6D:
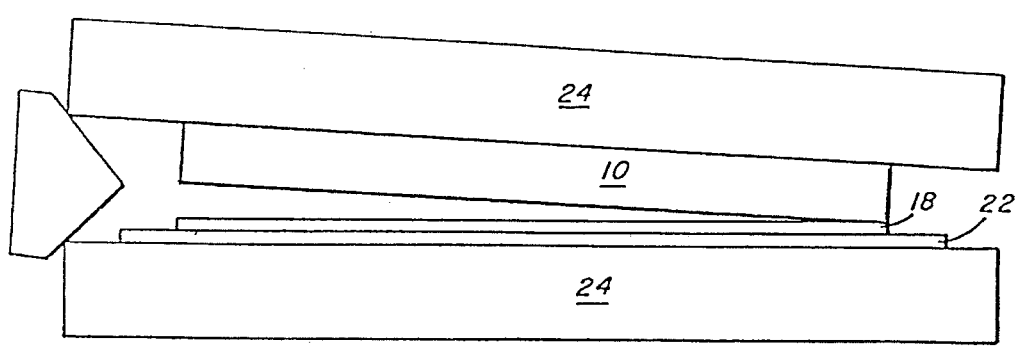

The cleaving procedure is illustrated in FIG. 6D. Therein, it can be seen that splitting wedge 26, which might be the tip of a screwdriver, for example, is inserted between supporting plates 24 and then gently driven inwardly. This creates a shock wave sufficient to make a clean separation between reuseable substrate 10 and laterally overgrown crystalline sheet 18. Separation occurs along the cleavage plane of the crystalline material.

In some separations, the surface of the reuseable substrate remains partially covered with growth mask. In such cases, the substrate can be prepared for reuse by removing it from its supporting plate, cleaning off the residual wax and by removing the remaining growth mask. At this point, the substrate can be optionally reused to produce another sheet of crystalline material by forming another growth mask thereon, On the other hand, where the growth mask has good adhesion to the crystallization substrate and relatively poorer adhesion to the crystalline film, the separation can result in the substrate having an almost complete growth mask thereon, in which case it can then be directly reused.

Figure 7:
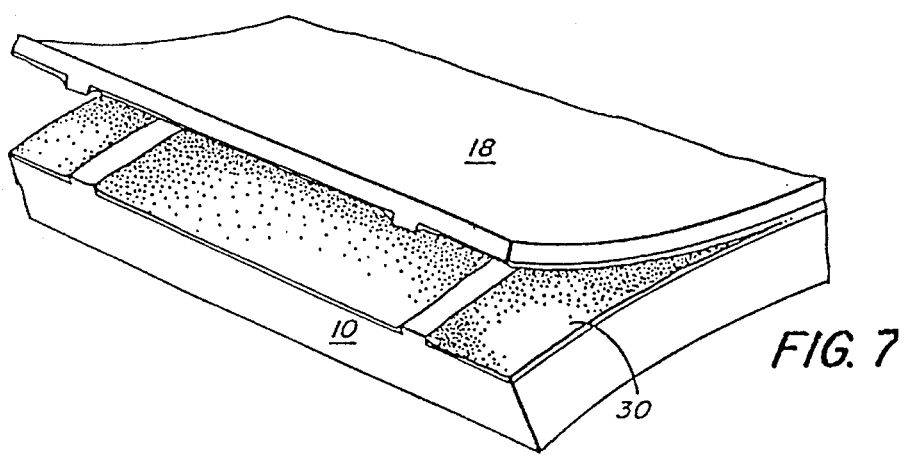
FIGS. 7–9 each schematically illustrate a partially separated crystalline sheet grown over a variety of crystallization growth mask.

FIG. 7 illustrates another embodiment of crystal growth mask for providing low adhesion between the substrate and the laterally overgrown sheet. As shown, a crystal growth mask has been formed in FIG. 7 from a fine grained powder, such as silica powder, which has been formed into a powdery film 30. Powdery film 30 would, for example, provide a suitable growth mask for crystalline silicon growth. The individual silica grains, with special preparation, can adhere to each other in a manner sufficient to keep them in place during lateral film overgrowth. However, the tensile strength of powdery film 30 is low compared to the strength of crystalline film 18, which facilitates separation.

When a separation force is applied, separation occurs between the individual powder grains. Such grains can be removed from laterally overgrown film 18 and from the surface of reuseable substrate 10, typically by etching.

Figure 8:
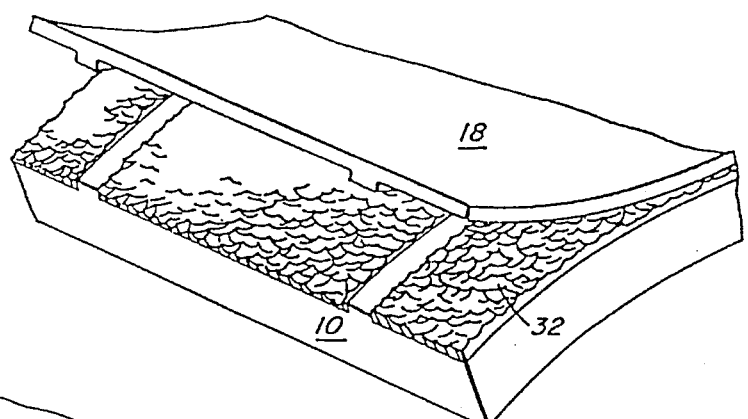

FIG. 8 illustrates another type of growth mask having low adhesion to crystallization substrate 10 and laterally overgrown sheet 18. In this case, growth mask 32 is formed from a material which promotes the creation of voids under film 18. The voids could be created by having a mask with a rough or porous surface, which might be formed from fritted glass. The cleaving forces required to separate laterally overgrown sheet 18 from the reuseable substrate 10 and the growth mask 32 are reduced because of the small contact area therebetween.

Figure 9:
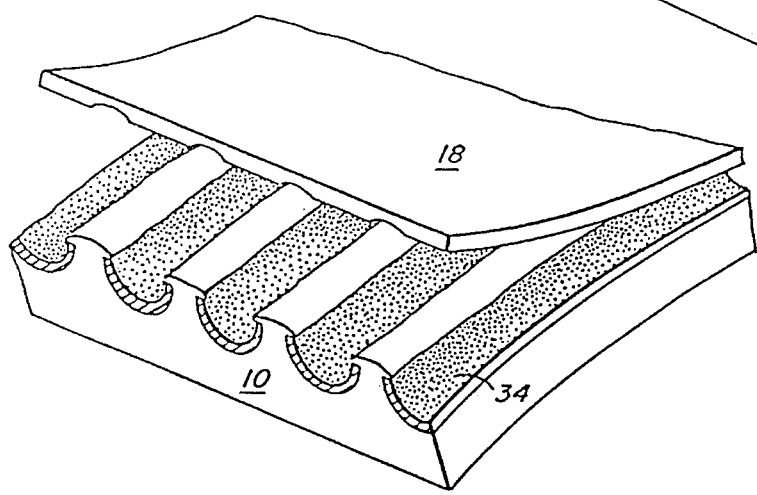

FIG. 9 illustrates yet another embodiment of a growth mask 34 with voids to provide minimum contact between reuseable substrate 10 and overgrown film 18. In this case, the voids are created by scalloping the surface of reuseable substrate 10 and then employing a mask 34, such as one formed from silicon dioxide, to cover all but the top surface of the peaks. Since the area of contact between laterally overgrown film 18 and substrate 10 is small, mask 34 need not itself have the property of low adhesion. Lateral growth occurs from exposed areas of the peaks forming the structure illustrated in FIG. 9. When separation forces are applied, they are concentrated at the peaks where there is contact between substrate 10 and overgrown film 18.

Figure 10A:
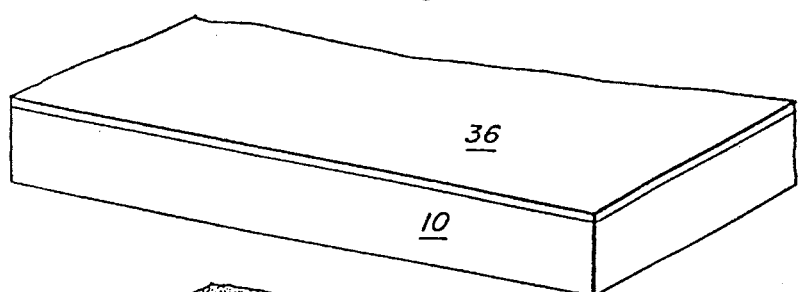
FIGS. 10A–10C are a series of schematic views illustrating the use of an adhesion-promoting layer for the crystallization growth mask.

FIG. 10 illustrates schematically another series of steps in a different embodiment of this invention. In FIG. 10A, a reuseable substrate 10, such as single crystal gallium arsenide, is first coated with an adhesion-promoting layer 36, such as amorphous or crystalline silicon. This can be a very thin layer, such as only a few hundred Å thick.

Figure 10B:
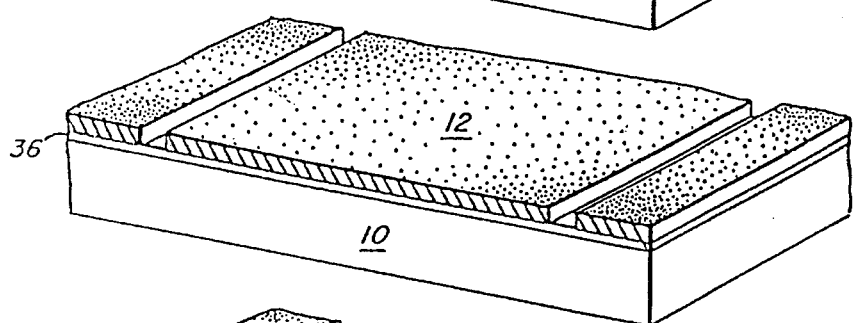

Thereafter, a growth mask 12, such as one made of carbonized photoresist, is applied as illustrated in FIG. 10B in a fashion similar to that previously described.

Figure 10C:
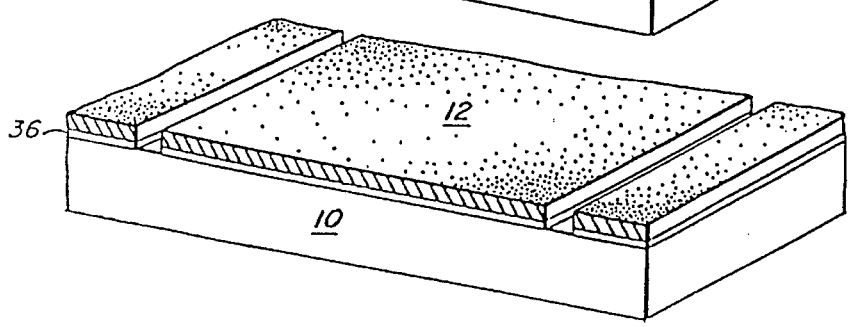

FIG. 10C illustrates the next step, which is the etching of the adhesion-promoting layer 36, which might be done by a $CF_4$ plasma if layer 36 is formed from silicon. A silicon adhesion-promoting layer 36 has good adhesion to gallium arsenide and has been found to form silicon carbide at the high temperatures employed during epitaxial growth of a crystalline gallium arsenide sheets. The silicon carbide forms a bonding layer between the substrate and remaining carbon. Subsequent processing can be carried out as previously described, except that the adhesion-promoting layer 36 tends to keep growth mask 12 in place during separation so that subsequent cleanup and reapplication of the mask are not required prior to reusing substrate 10.

Figure 11A:
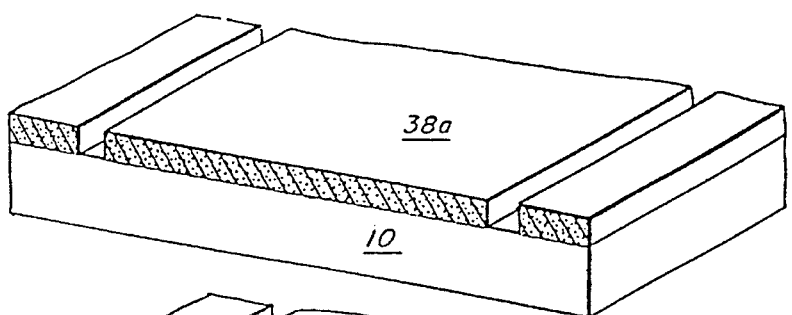
FIGS. 11A–11B are a series of views illustrating schematically another embodiment of a suitable crystallization growth mask.
Figure 11B:
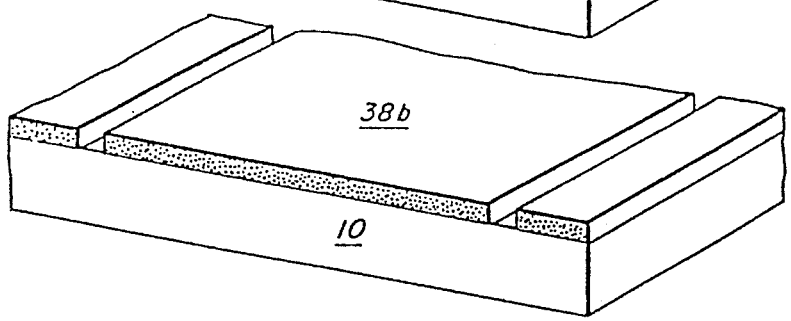

In FIG. 11, an alternative embodiment of a suitable growth mask is formed on the substrate as follows. Very finely divided fused silica is added to a photoresist which is then applied in the desired pattern by photolithographic procedures to produce a mask 38a as shown in FIG. 11A. A high temperature bake is then employed to burn away the photoresist. A typical temperature for this bake is about 600° C. During the high temperature bake, the photoresist is completely burned away, including the carbon. This leaves behind a growth mask 38b formed from fused silica powder as shown in FIG. 11B. Although the top layer of particles may have good adhesion to the overgrown films, the individual particles within the fused silica powder do not have strong adhesion to each other. This makes cleaving along the ribs easy because of the low structural integrity of growth mask 38b.

Figure 12:
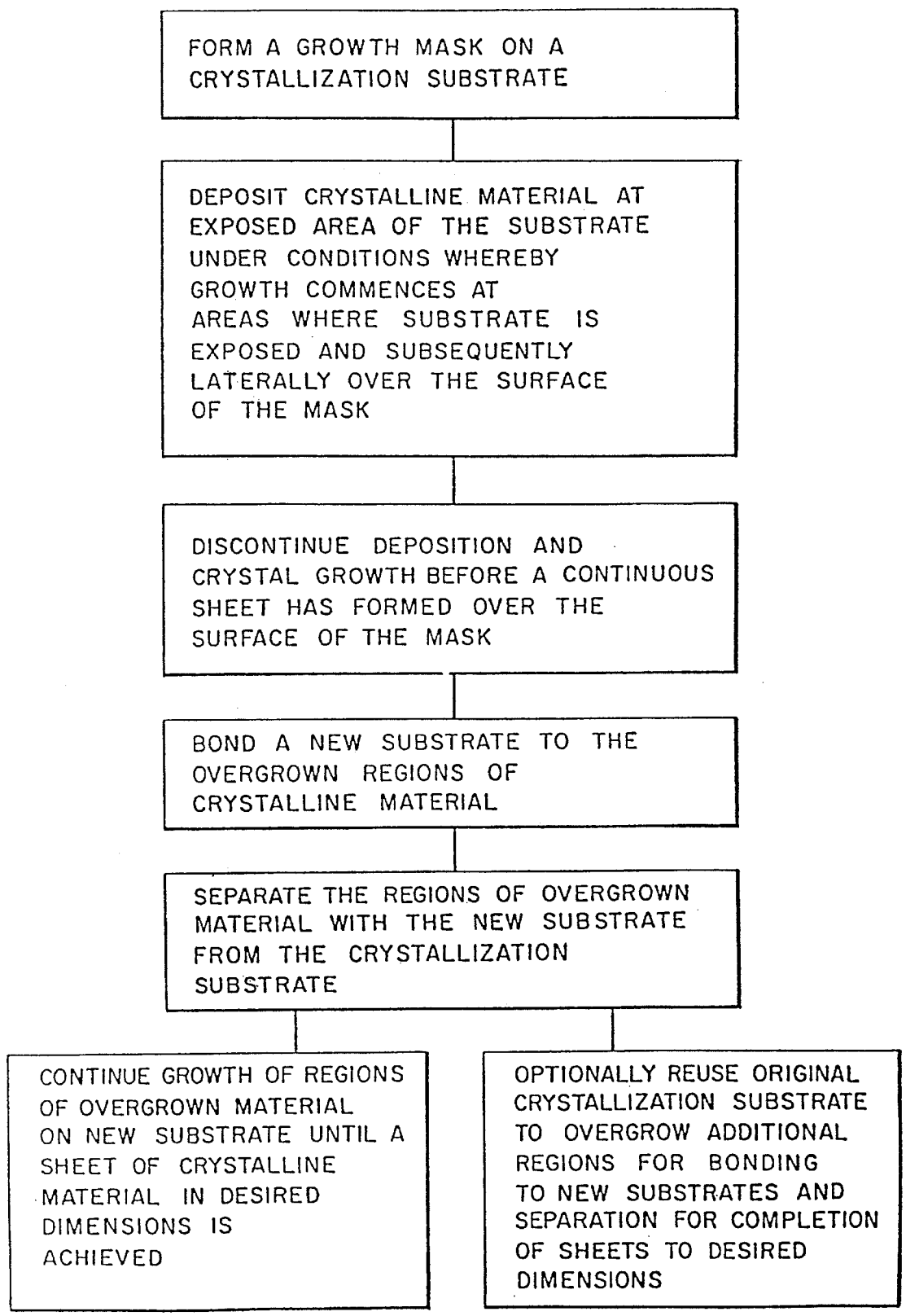
FIG. 12 is a process flow diagram illustrating an alternative embodiment of a process according to this invention.

FIGS. 12 and 13 illustrate an alternative embodiment of the process for growing crystalline sheets of material on crystallization substrates according to this invention. As shown, the initial steps of the process are similar to those illustrated in FIGS. 2A–C. Thus, the resulting product from FIG. 2C, as shown in FIG. 13A, is reuseable substrate 10 having crystal growth mask 12 thereon with regions 18a of some lateral overgrowth of crystalline material. At this point, however, deposition of material is discontinued and no further crystal growth occurs on the original crystallization substrate 10.

Figure 13A:
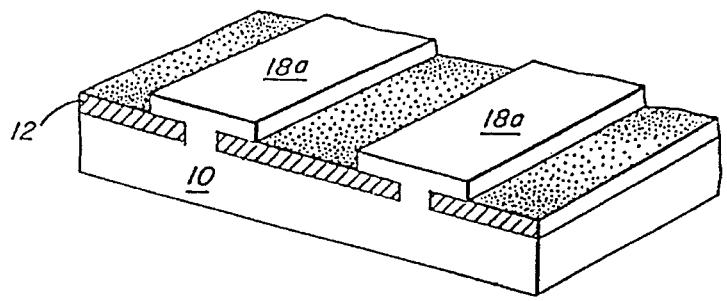
FIGS. 13A–13G present a series of schematic views illustrating the process of FIG. 12.
Figure 13B:
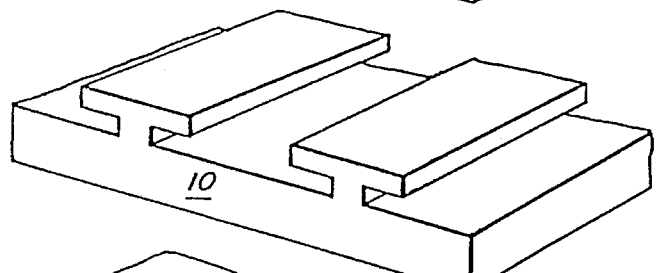
Figure 13C:
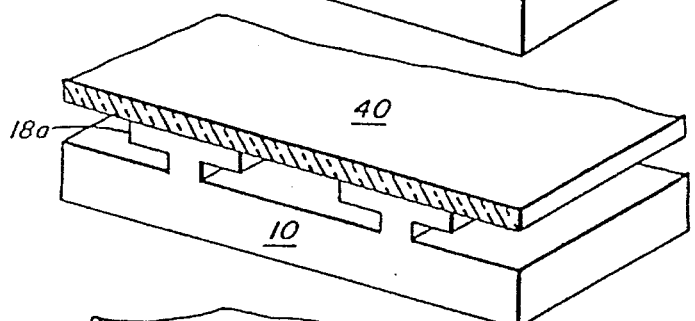

Growth mask 12 can be preferentially etched away, as illustrated in FIG. 13B, and secondary substrate 40 is attached to regions 18a of crystalline material as illustrated in FIG. 13C. Secondary substrate 40 can be chosen from a very wide variety of materials, and need not be a material which will support crystal growth. Additionally, substrate 40 might have one or more coatings thereon, such as a conductive metal coating capable of forming an ohmic contact with crystalline sheets 18a.

Figure 13D:
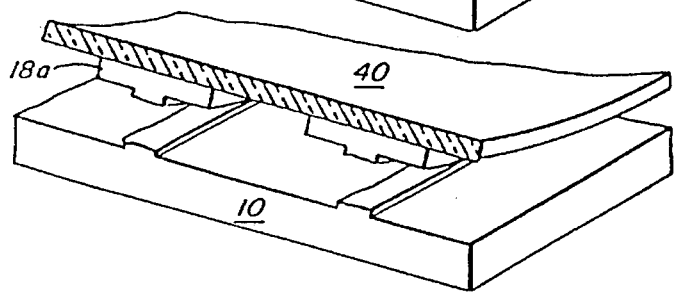
Figure 13E:
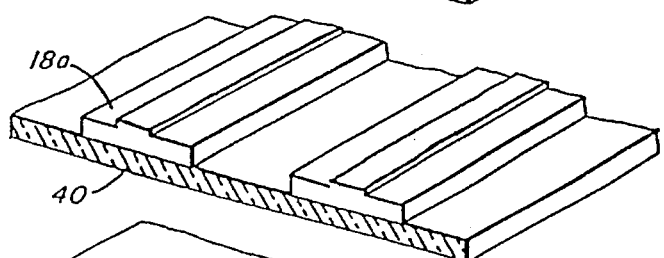

The laterally overgrown regions 18a are then cleaved from reuseable substrate 10 as illustrated in FIG. 13D. The result is that secondary substrate 40 now has crystalline regions 18a thereon as shown in FIG. 13E. These can be used for further growth of regions 18a, or can be directly used in certain device applications.

Figure 13F:
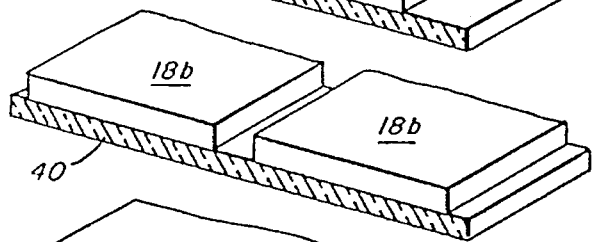
Figure 13G:
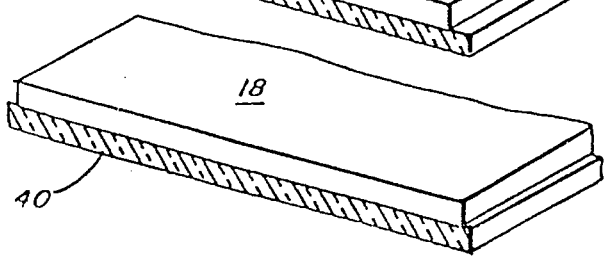

Secondary substrate 40 with sheets 18a is then placed into an epitaxial growth reactor wherein growth of crystalline sheets 18a is continued, as illustrated in FIG. 13F, to form sheets 18b and, if desired, continued to the point where a continuous crystalline film 18 is formed on the secondary substrate 40, as illustrated in FIG. 13G. As with previous embodiments, deposition and growth can be continued until a desired thickness for continuous film 18 is achieved. When crystalline sheet 18 reaches the desired dimensions, it can be used in device fabrication.

Figure 14:
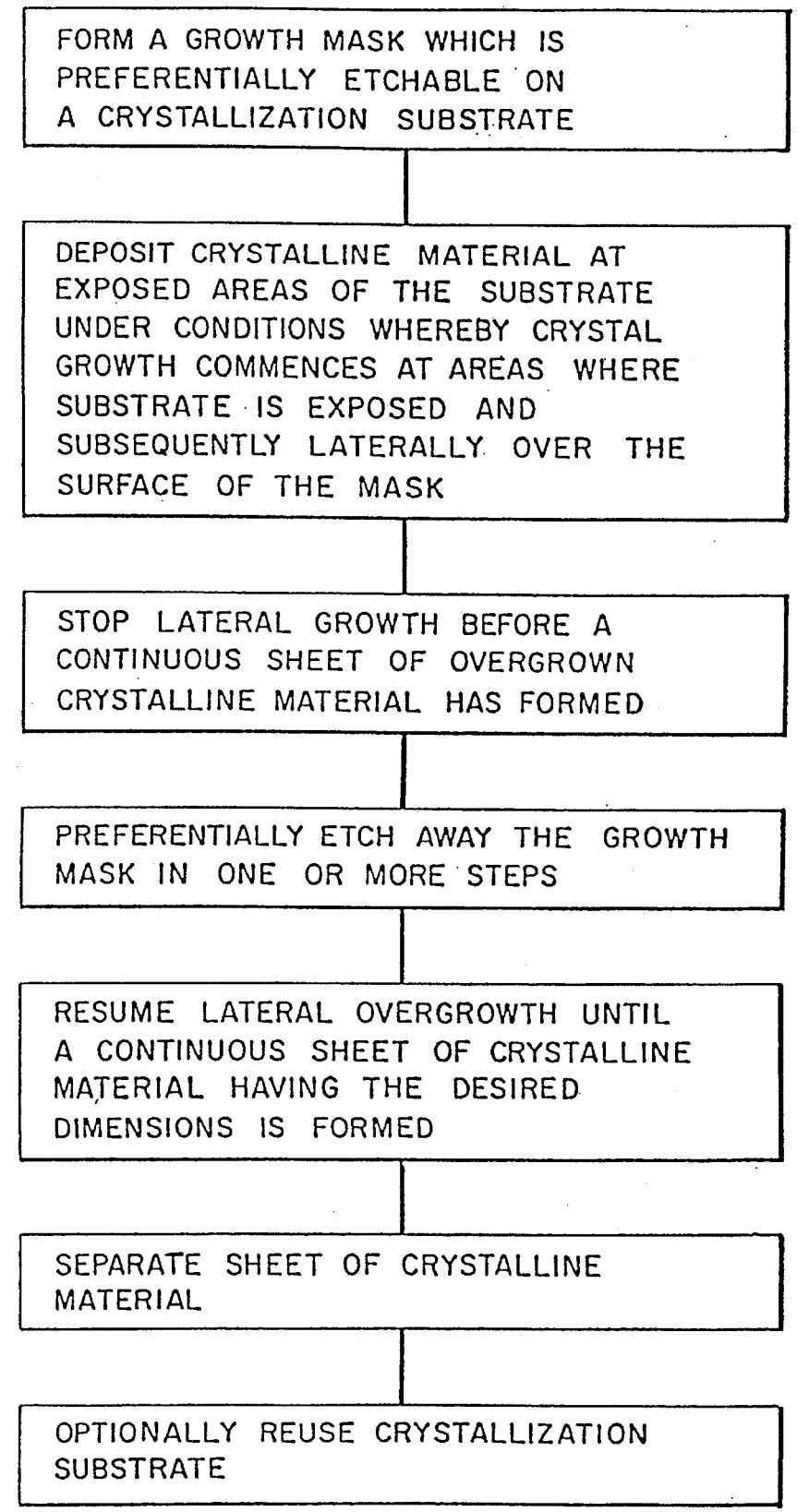
FIG. 14 is a process flow diagram illustrating processes according to this invention employing selective etching of the growth mask for separation of laterally overgrown sheets from crystallization substrates.

In addition to the cleavage technique previously described for separation, other separation techniques can be employed. One of these additional separation techniques is preferential etching, which is illustrated in general in FIG. 14. In such techniques, the properties required of the crystal growth mask are somewhat different from those properties required if a cleaving technique is to be used for separation. In general, the material used for the mask, and/or a heteroepitaxy layer employed with the mask, is required to be one which preferentially etches compared to the substrate and overgrown film.

Specific preferential etching techniques will now be described in detail in FIGS. 15–18.

FIG. 15 illustrates one technique for separating a laterally overgrown crystalline sheet from a reuseable substrate by preferential etching. In FIG. 15A, crystallization substrate 10 is illustrated with a crystal growth mask 12 thereon.

Figure 15A:
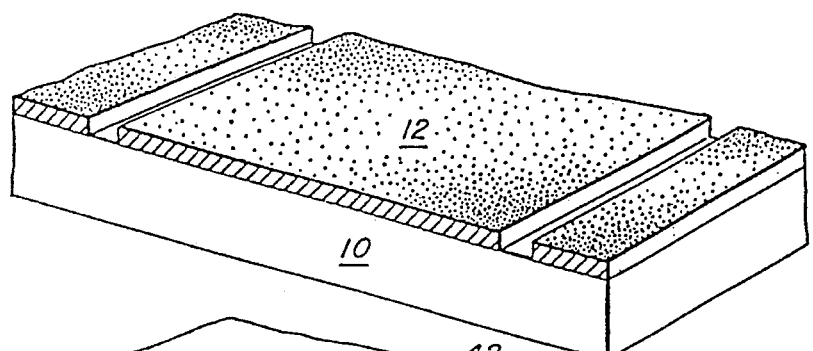
Figure 15B:
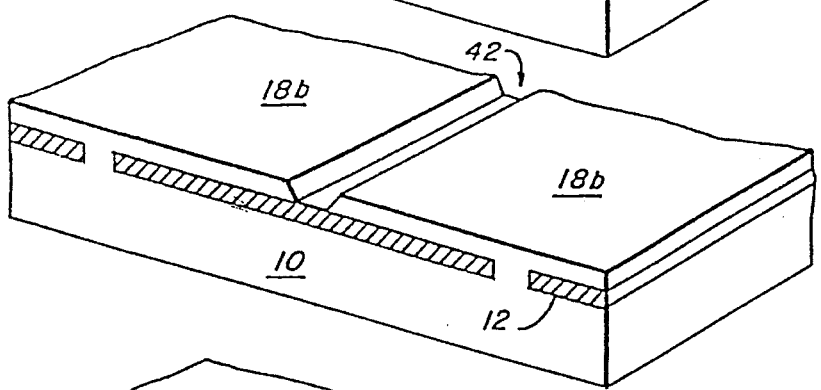
Figure 15C:
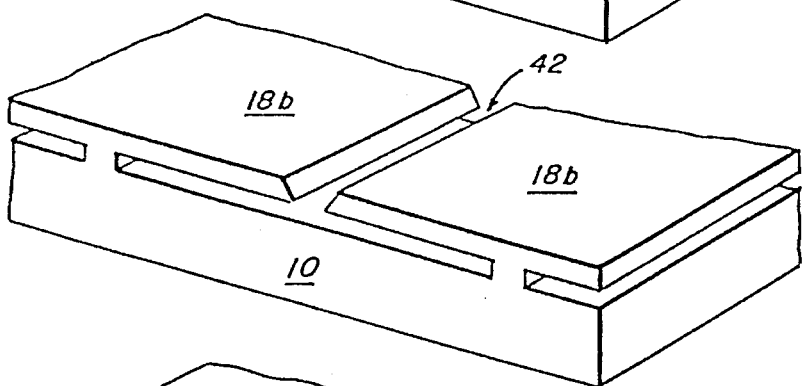
Figure 15D:
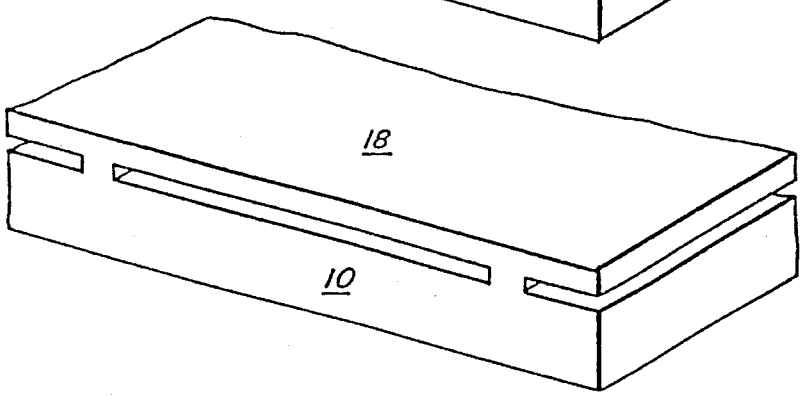
Figure 15E:
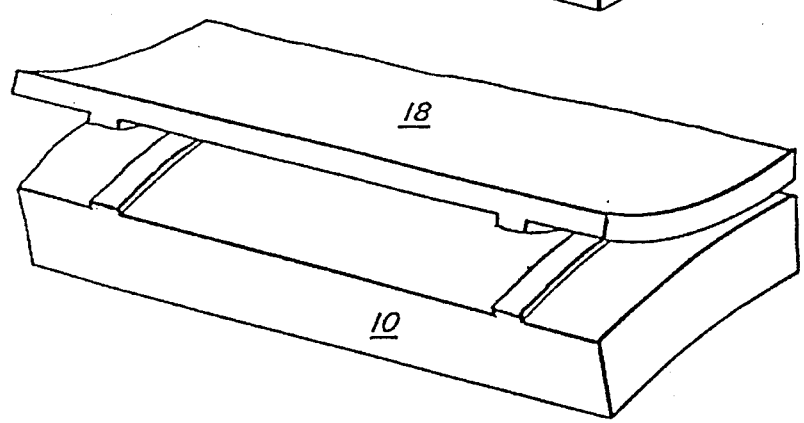

In FIG. 15B, it can be seen that lateral overgrowth is allowed to continue until crystalline sheets 18b approach each other. At this point, substrate 10 is removed from the reactor and an etchant for mask 12 is introduced through trough 42 formed between crystalline sheets 18b. This etches away, preferentially, growth mask 12 leaving elongated voids as seen in FIG. 15C. If a continuous sheet is desired, substrate 10 can then be placed back into the epitaxial reactor and deposition and crystal growth resumed to produce continuous laterally overgrown sheet 18 of any desired thickness on original reuseable substrate 10, as illustrated in FIG. 15D. The elongated voids make separation relatively easy, as shown in FIG. 15E.

Figure 16A:
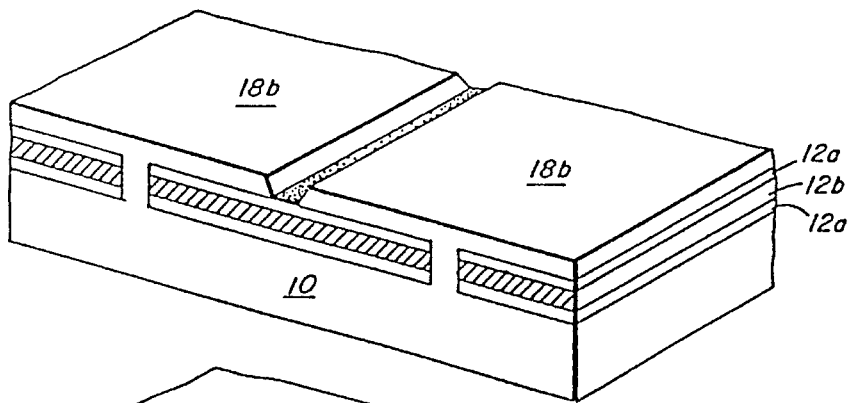
FIGS. 15A–15E, 16A–16C, 17A–17C and 18A–18B present a series of views schematically illustrating a variety of techniques for separating laterally overgrown crystalline films from crystallization substrates by preferential etching.

In FIG. 16A, crystallization substrate 10 is once again employed. In this embodiment, the crystal growth mask 12 consists of two layers of material 12a, which is resistant to a first etchant, and a further layer 12b of material preferentially etchable by first etchant sandwiched between layers 12a. As shown in FIG. 16A, lateral overgrowth is continued until crystalline sheets 18b almost touch, and is then discontinued.

Figure 16B:
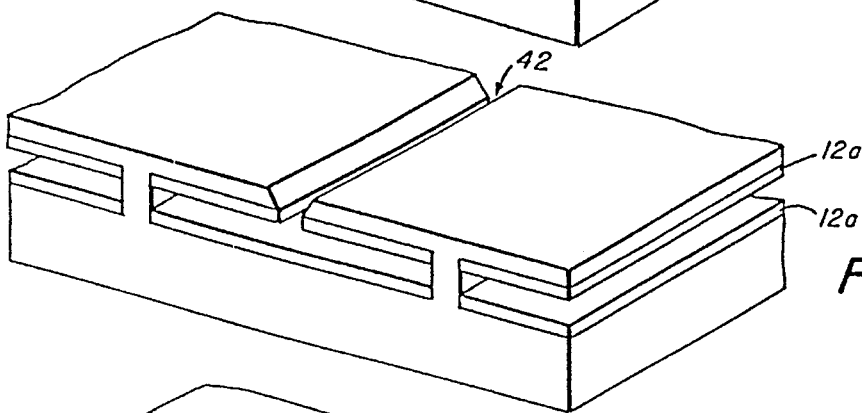

As illustrated in FIG. 16B, the area of etch-resistant layer 12a is removed from the bottom of trough 42 and first etchant is then introduced through trough 42 and into the sandwich structure thereby preferentially etching away layer 12b leaving an elongated void in its place.

Figure 16C:
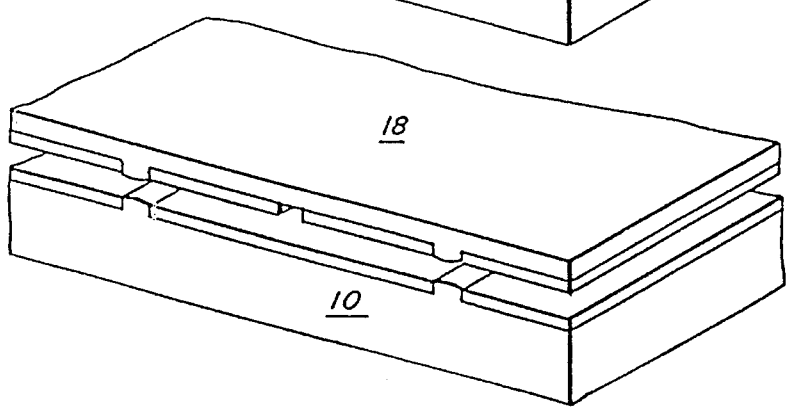

As illustrated in FIG. 16C, substrate 10 is then placed back in an epitaxial reactor and overgrowth is continued until continuous sheet 18 in a desired thickness is completed. A second etchant, capable of etching the crystalline material at ribs 16, is then introduced into the elongated voids to separate crystalline sheet 18 from reuseable substrate 10 and crystal substrate 10 can then be employed to form another masked substrate as shown in FIG. 16A.

Figure 17A:
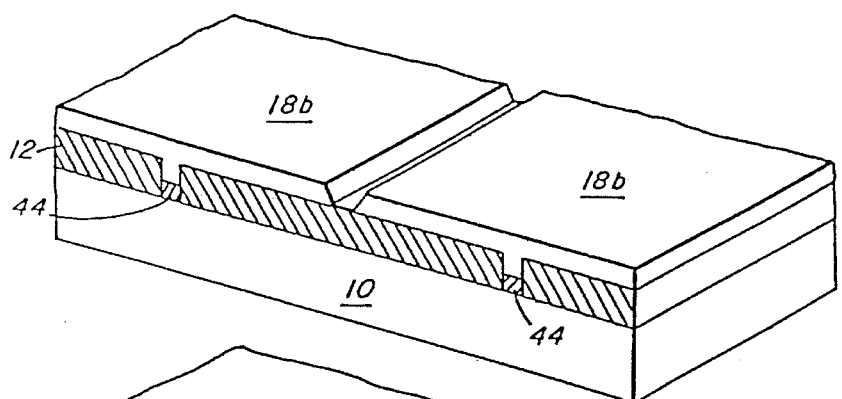
Figure 17B:
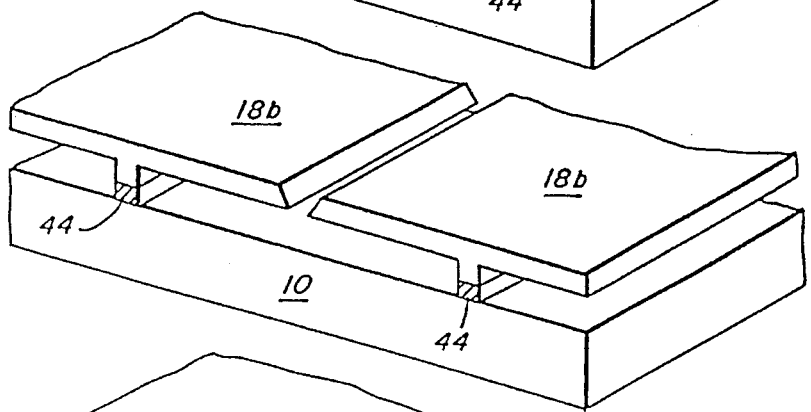
Figure 17C:
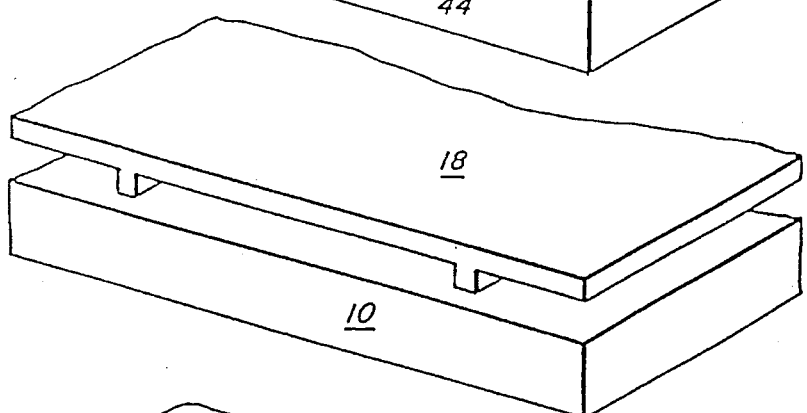

In FIG. 17, heteroepitaxy is employed to provide a preferentially etchable area. In FIG. 17A, reuseable substrate 10 is shown with crystal growth mask 12 thereon. After the growth mask 12 has been formed, deposition of material 44 different from the substrate material 10, is deposited at the bottom portion of slits 14 in mask 12. If substrate 10 is gallium arsenide, the heteroepitaxy material 44 might be, for example, gallium aluminum arsenide, which can be deposited by heteroepitaxy techniques. Subsequently, epitaxial deposition of crystalline material corresponding to substrate 10 is carried out to form sheets 18b. A first etchant is employed to remove mask 12, FIG. 17B, and growth is continued to form continuous sheet 18. Subsequently, a second etchant is introduced to preferentially etch away heteroepitaxy material 44 thereby separating film 18 from substrate 10, as shown in FIG. 17C. Even though heteroepitaxy material 44 is shown deposited at the bottom of the ribs; it could also be formed at other sections of the ribs, such as at the top, even with a small amount of overgrowth.

Figure 18A:
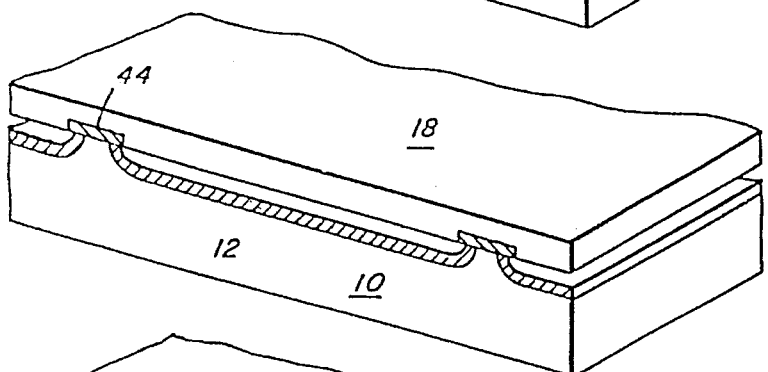

FIG. 18 illustrates another technique for preferentially etching a laterally-overgrown film to separate it from its reuseable substrate. As illustrated in FIG. 18A, substrate 10 has a scalloped upper surface. The scalloped upper surface of the substrate is masked at all areas except at the very tops of the peaks. At this location, deposition and growth of a material 44 different from the substrate is accomplished by heteroepitaxy techniques as previously described. Deposition and growth of substrate material are then continued to form laterally overgrown film 18.

Figure 18B:
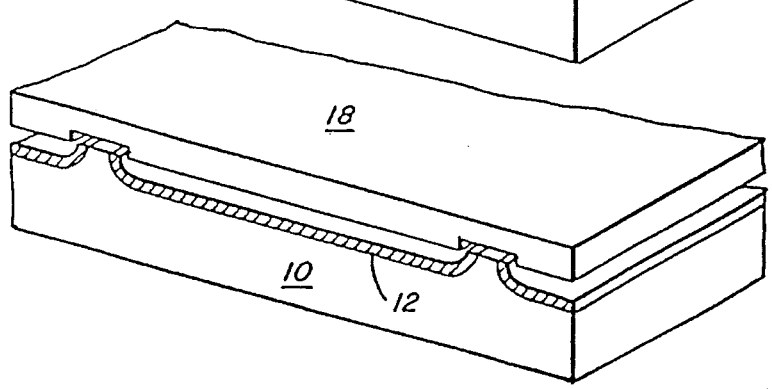

As illustrated in FIG. 18B, separation can be achieved by introducing a preferential etchant for heteroepitaxial layer 44 into the voids formed between reuseable substrate 10 and laterally overgrown film 18. Since the amount of heteroepitaxial material 44 which must be etched is small for the three methods just described, and because voids are available for circulating the etchant, these techniques should be particularly efficient and practical.

Figure 19:
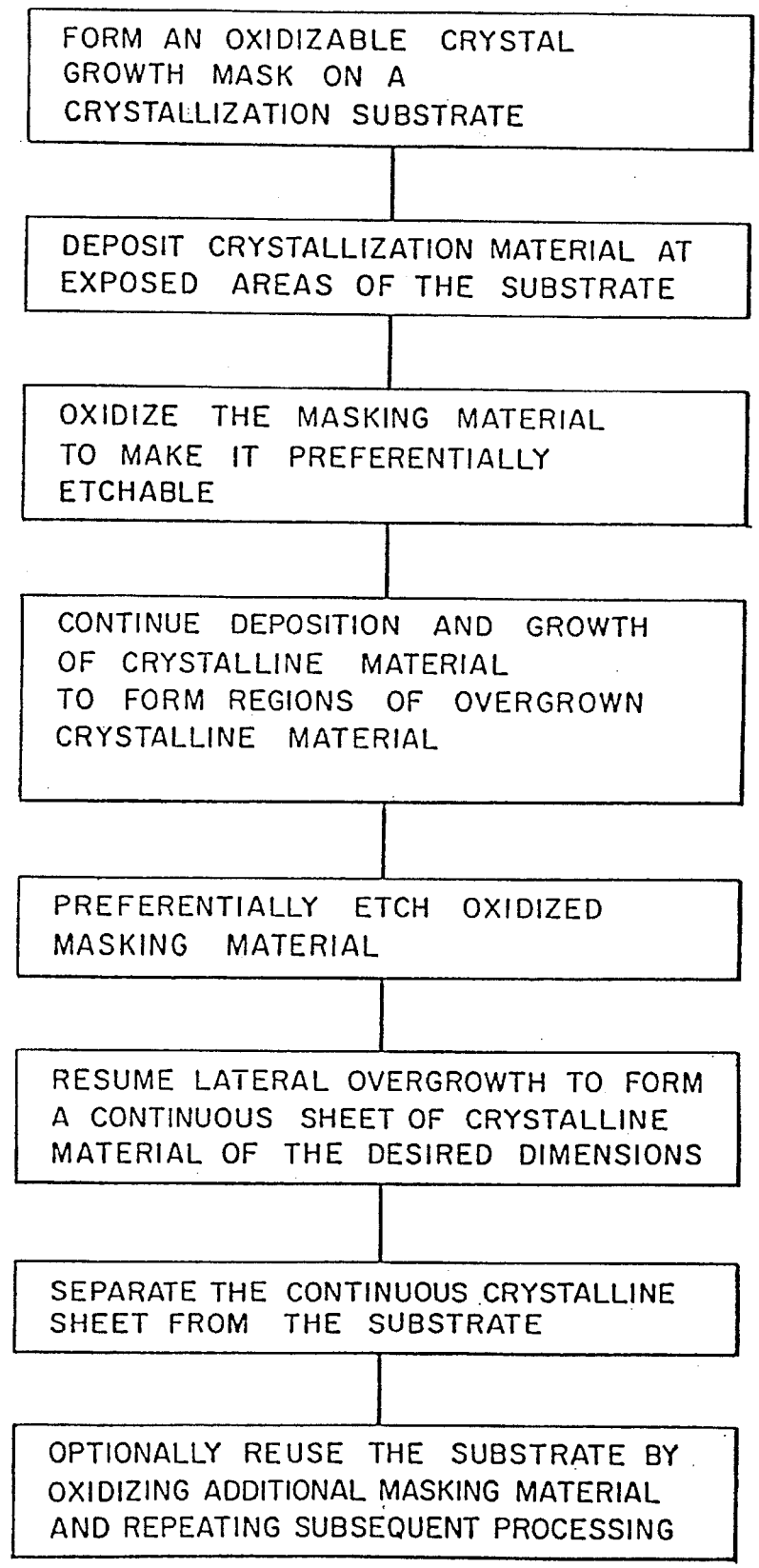
FIG. 19 is a process of flow diagram illustrating another alternative embodiment of a process according to this invention.

FIGS. 19 and 20 illustrate yet another alternative embodiment of this invention for producing laterally overgrown crystalline films.

Figure 20A:
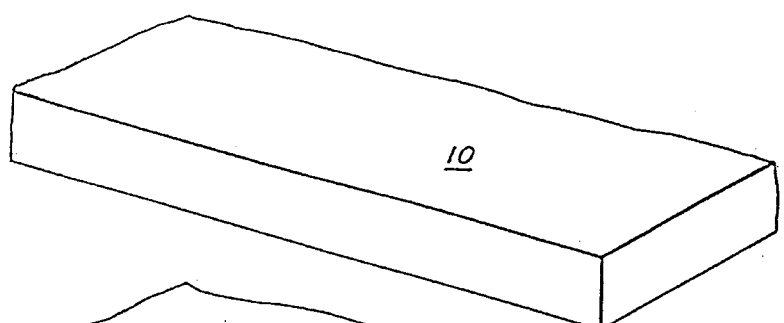
FIGS. 20A–20J presents a series of schematic views illustrating the process of FIGS. 17a–17C.

In FIG. 20A, substrate 10, which once again might be single crystal gallium arsenide, is illustrated.

Figure 20B:
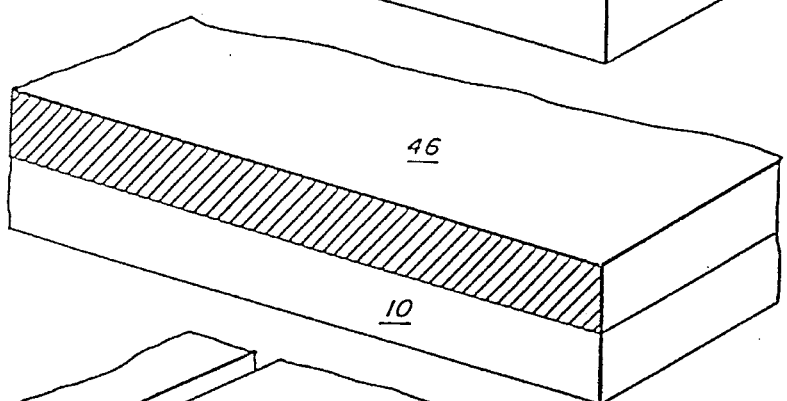

In the first step of this process, a layer 46 of oxidizable masking material is applied, as illustrated in FIG. 20B. Layer 46 could also be other materials which can be transformed into preferentially etchable materials, by nitration, or other techniques. An example of an oxidizable material is silicon, which can be oxidized to silicon dioxide, a preferentially etchable material.

Figure 20C:
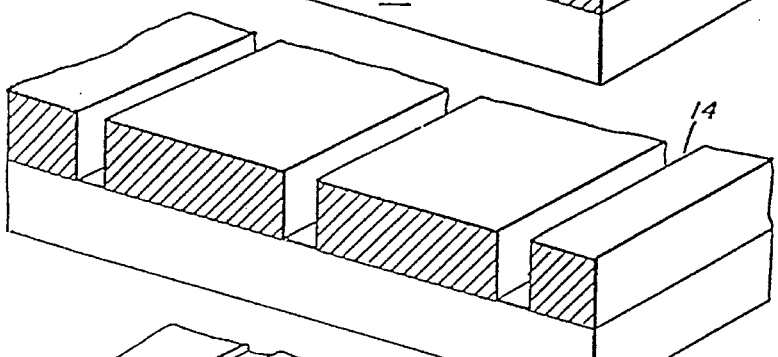

In FIG. 20C, the application of a pattern of slits 14 to the oxidizable mask 46 is illustrated. This can be done by photolithographic techniques.

Figure 20D:
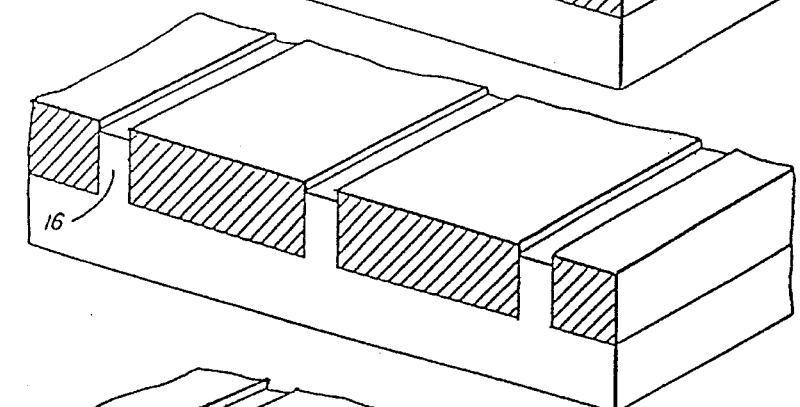
Figure 20E:
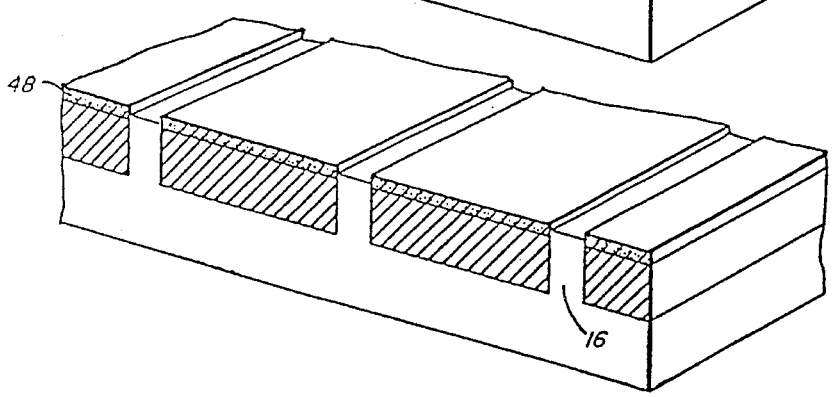

Deposition and growth of crystalline material then commences, FIG. 20D, to form ribs 16, after which mask 46 is oxidized to a certain thickness 48, FIG. 20E. In a typical case where mask 46 is silicon, mask 46 might be oxidized to a depth of about 500 Å by steam at 700° C.

Figure 20F:
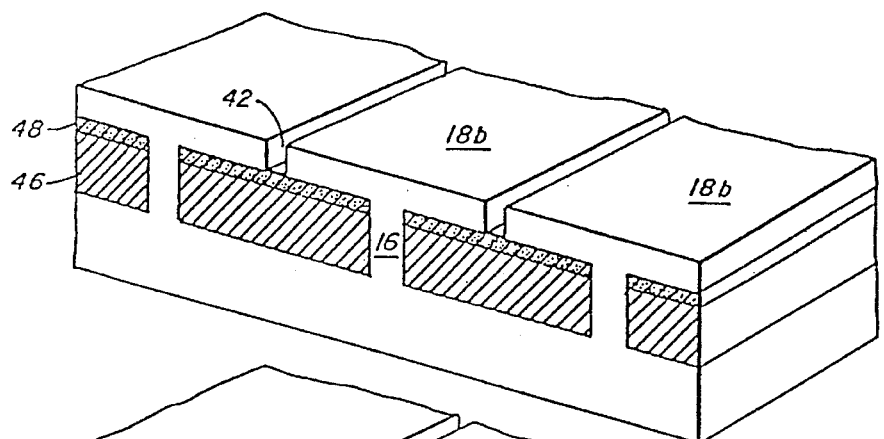

In FIG. 20F, lateral overgrowth of crystalline material is illustrated as in prior cases. The material grows up through slits 16 of mask 46 and oxidized layer 48 and laterally out over the surface of oxidized layer 48 to form sheets 18b.

Figure 20G:
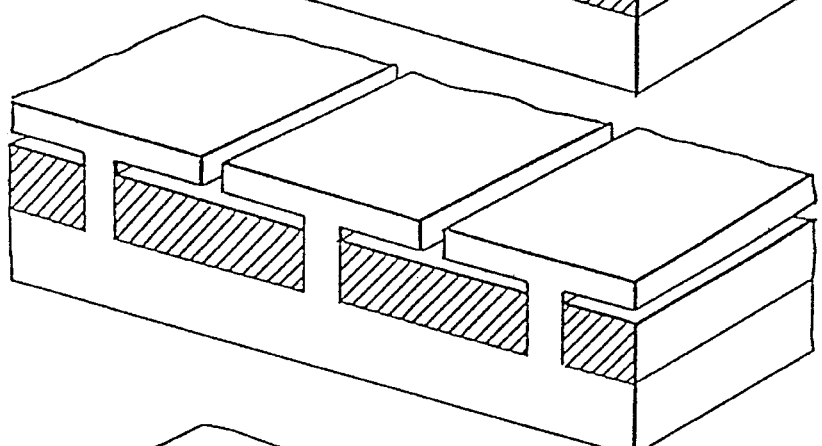
Figure 20H:
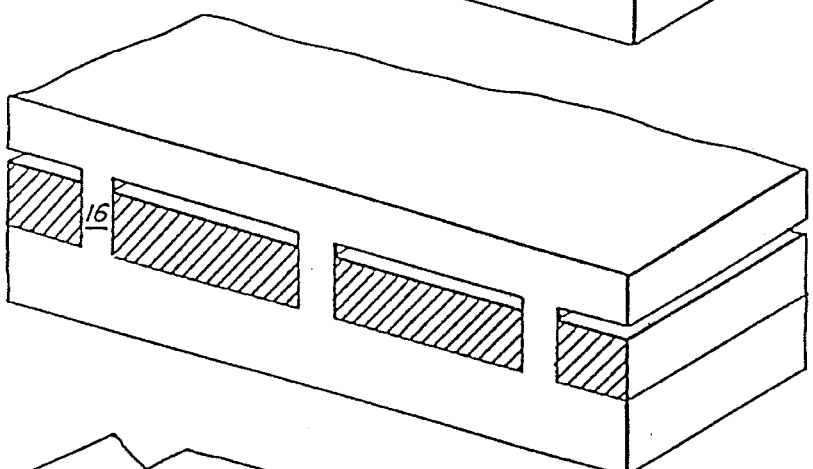

A preferential etchant for oxidized layer 48 is introduced through troughs 42, and after the oxidized layer 48 has been etched away, FIG. 20G, the overgrown substrate is placed back in an epitaxial reactor and growth is continued to produce continuous sheet 18 of crystalline material in a desired thickness, as shown in FIG. 20H.

Figure 20I:
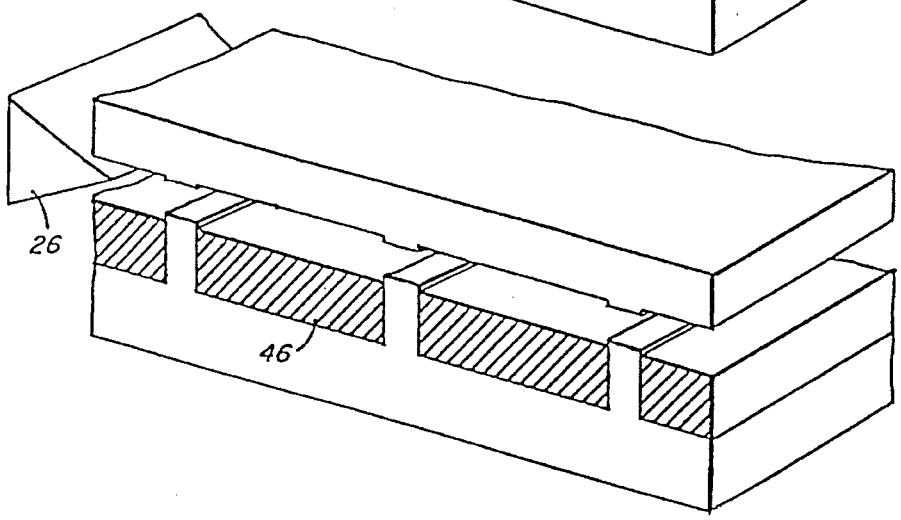

Separation is illustrated in FIG. 20I employing wedges 26 to provide a mechanical shock front capable of cleaving the substrate from the overgrown film at ribs 16.

Figure 20J:
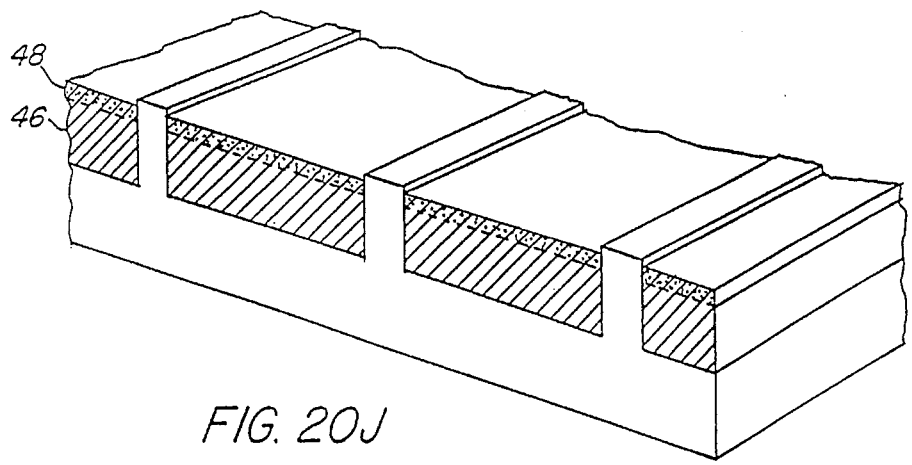

In FIG. 20J, a subsequent oxidation of another portion of mask 46 is shown. Steps 20F–J can then be repeated to form another separated sheet 18 of laterally overgrown crystalline material on substrate 10.

FIG. 21 illustrates another optional technique for forming a reuseable substrate for use in this invention. In FIG. 21, substrate 51 is a crystalline semiconductor material, such as single crystal silicon. Low adhesion masks for silicon, and other similar materials, are sometimes more difficult to achieve than similar masks with gallium arsenide. For example, silicon reacts with carbon at growth temperatures above 800° C., making a carbon mask undesirable under such higher temperature conditions.

Materials such as $Si_3N_4$ and $SiO_2$, however, are relatively inert to silicon even at high temperatures. However, conventional pyrolytic or thermal deposition typically have very good adhesion to silicon and many other types of substrates. FIG. 21 represents schematically a new process for producing excellent low-adhesion growth masks on substrates such as silicon substrate 51.

Figure 21A:
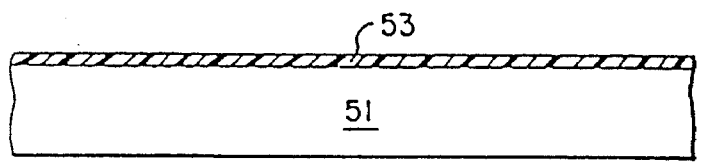
FIGS. 21A–21G and 22A–22D present a series of schematic views illustrating techniques for forming low-adhesion, easily cleavable growth masks for use with this invention.
Figure 21B:
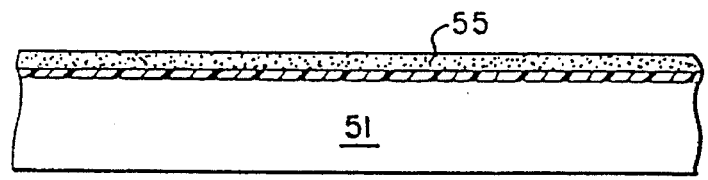

FIG. 21A illustrates the application of a relatively thin (e.g., 1000 Å) silicon dioxide coating 53 to silicon substrate 51. Silicon dioxide coating 53 can be applied either pyrolytically or thermally. Its thickness could range from a few angstroms to thousands of angstroms.

A layer of photoresist is then applied over silicon dioxide coating 53 and is then carbonized by heating in air at elevated temperatures to form carbonized photoresist layer 55. This layer might have been applied in a thickness of about 7000 Å and carbonized at 400° for 1 minute to reduce it to about 3000 Å.

Figure 21C:
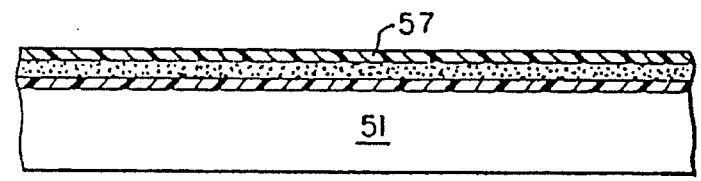

As illustrated in FIG. 21C, another layer of silicon dioxide is then applied over carbonized photoresist layer 55. The second silicon dioxide layer 57 might have a thickness similar to initial silicon dioxide layer 53 (e.g., 1000 Å).

Figure 21D:
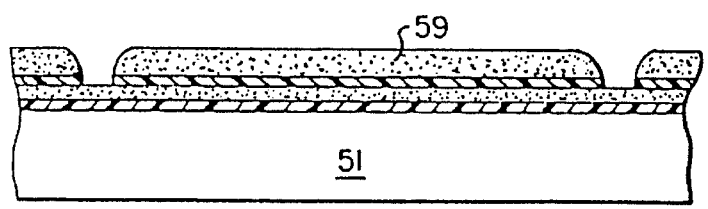
Figure 21E:
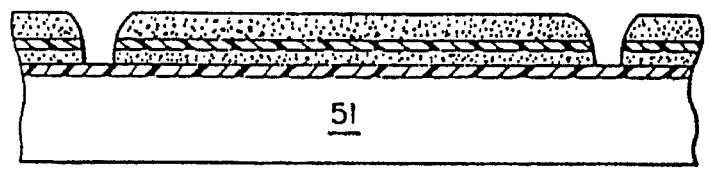

FIG. 21D illustrates the application of photoresist layer 59, which is patterned as desired employing conventional photolithographic techniques. For example, the slit openings described herein for lateral overgrowth might be applied, as illustrated.

Figure 21F:
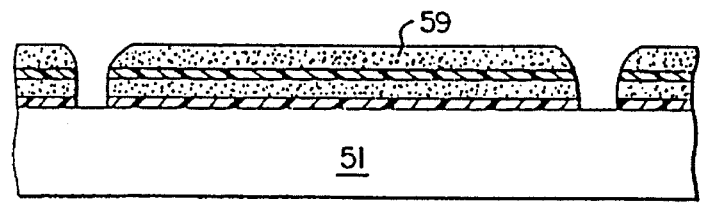
Figure 21G:
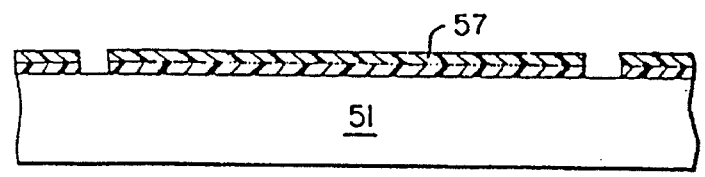
Figure 22A:
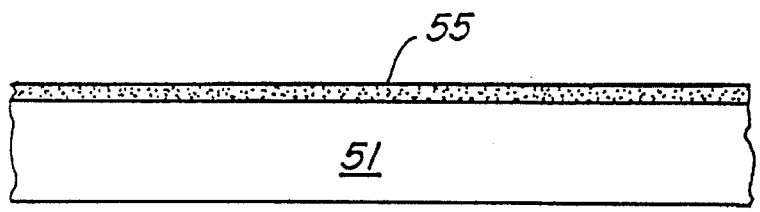
Figure 22B:
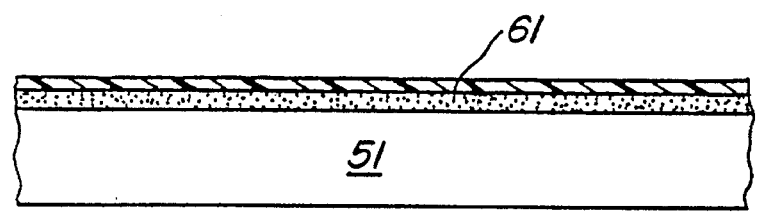
Figure 22C:
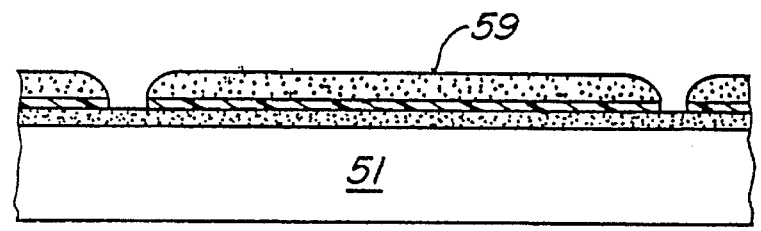
Figure 22D:
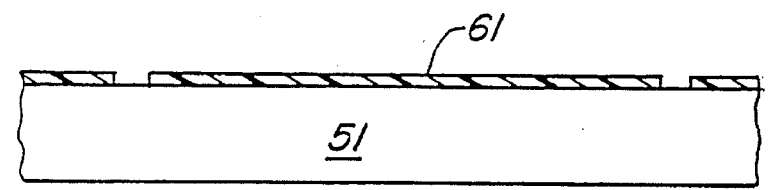

After application and patterning of the photoresist layer 59, the three coatings are etched as follows. Silicon dioxide layer 57 is first etched with buffered hydrofluoric acid (FIG. 21D), carbonized photoresist layer 55 is etched with a helium-oxygen plasma (FIG. 21E), and silicon dioxide layer 53 is similarly etched with a buffered hydrofluoric acid solution (FIG. 21F).

Patterned photoresist mask 59 is removed by conventional techniques and the sample is placed in an oxygen atmosphere and baked at high temperatures. (e.g., 700° for 45 minutes.) During this high temperature bake in an oxygen atmosphere, the carbonized photoresist layer 55 is selectively removed (volatilized) from between patterned silicon dioxide layers 53 and 57. This results in the top silicon dioxide layer 57 laying neatly down on top of lower silicon dioxide layer 53 in an aligned and loosely bonded relationship. The wafer is new complete with a low-adhesion growth mask and lateral overgrowth can begin. Since the upper and lower silicon dioxide layers, 57 and 53, respectively, are loosely bonded, a plane of weakness for cleaving the laterally overgrowth film from the substrate is provided.

FIG. 22 illustrates an alternate process for forming a low-adhesion growth mask on a crystalline substrate formed from a material such as silicon. The first step in this alternative method is the formation of a carbonized photoresist layer 55 (e.g., 3000 Å) directly on the silicon substrate 51. A layer of silicon nitride 61 is then pyrolytically deposited over carbonized photoresist 55. Silicon nitride layer 61 might typically have a thickness from 500 to 1000 Å. Photoresist 59 is then applied over silicon nitride layer 61 and patterned by conventional photolithographic techniques to form the desired slit openings (FIG. 22C). The silicon nitride layer 61 can be etched using a $CF_4$ plasma. The patterned wafer is then baked at high temperatures in an oxygen atmosphere and the nitride layer 61 lays smoothly down and becomes loosely bonded to silicon substrate 51 (FIG. 22D). A suitable bake might be at 700° C. for 45 minutes in oxygen. The loosely bonded silicon nitride layer 61 provides a low-adhesion growth mask having a plane of weakness for cleavage after a laterally overgrown film is formed from substrate 51.

The essence of the methods for forming low-adhesion growth masks illustrated in FIGS. 21 and 22 is the formation of a three-layer sandwich where the middle layer can be preferentially etched, baked away, otherwise preferentially removed. The layers should be formed with sufficiently low stress and should be sufficiently thin to allow the two materials which are not etched to become uniformly loosely bonded. The thickness and material properties of the three layers are only limited to the extent that loose bonding is required and that these be relatively inert to each other and to the crystal growth environment. A wide variety of combinations of materials and thicknesses can be employed.

Figure 23:
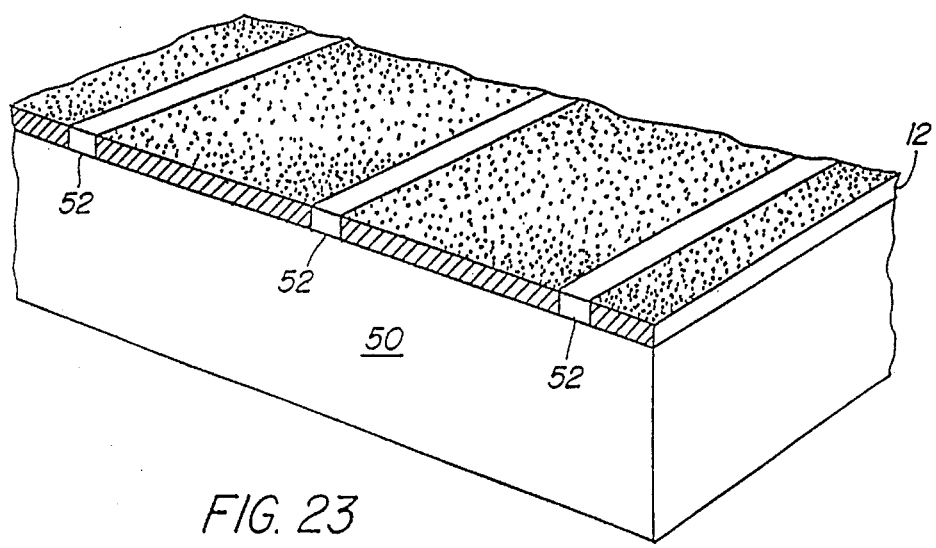
FIG. 23 is a schematic sectional view of a reusable subset which is not entirely formed from single crystal material but which is suitable for growing sheets which are substantially single crystal.

An alternative embodiment is illustrated in FIG. 23 which is a schematic view of a substrate which is suitable for formation of substantially single crystal laterally overgrown films even though the substrate itself is not single crystal material. In fact, the substrate can be amorphous, polycrystalline, metal, or some combination. As shown, mask 12 is placed over substrate 50. Mask 12 might be any of the materials previously described and it could even be composed of the same material as the substrate. At the open areas left by mask 12, seed material 52, which must be single crystal and oriented, is formed. This might be done, for example, by cutting strips from a sheet of single crystal material and laying such strips over substrate 50. Further growth of single crystal material will cause seed material 52 to grow upwardly and laterally outwardly over mask 12 to form a laterally overgrown sheet of crystalline material. The film could then be peeled away by techniques described before.

Figure 24:
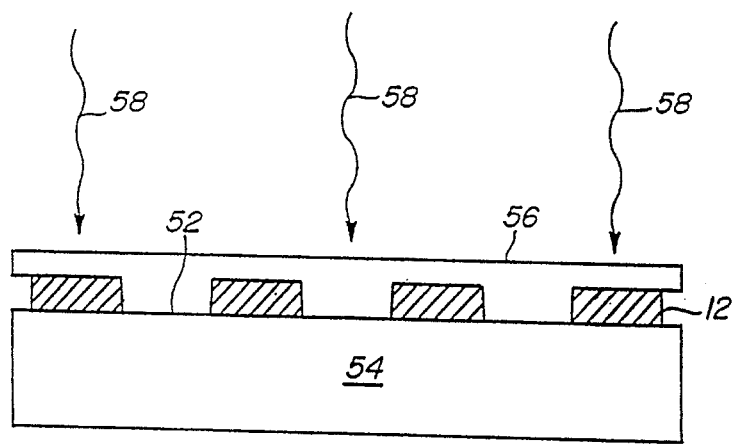
FIG. 24 is a schematic view illustrating the use of a laser to crystallize an amorphous film semiconductor material.

FIG. 24 is a schematic view of a process employing crystallization substrate 54 having crystal growth mask 12 thereon. Substrate 54 might be polycrystalline or amorphous, as long as the areas 52 exposed through mask 12 are single crystal, and as illustrated, further polycrystalline or amorphous material is deposited over the openings and mask to form sheet 56. Subsequent to deposition, an energy beam, such as from pulsed laser 58, is used to heat film 56 and to crystallize it. Single crystal growth is initiated at areas exposed through the mask by the energy beam and lateral overgrowth occurs. Crystallization of film 56 might also be achieved by heating with a graphite strip heater, other means for heating, or by other crystallization techniques.

Figure 25:
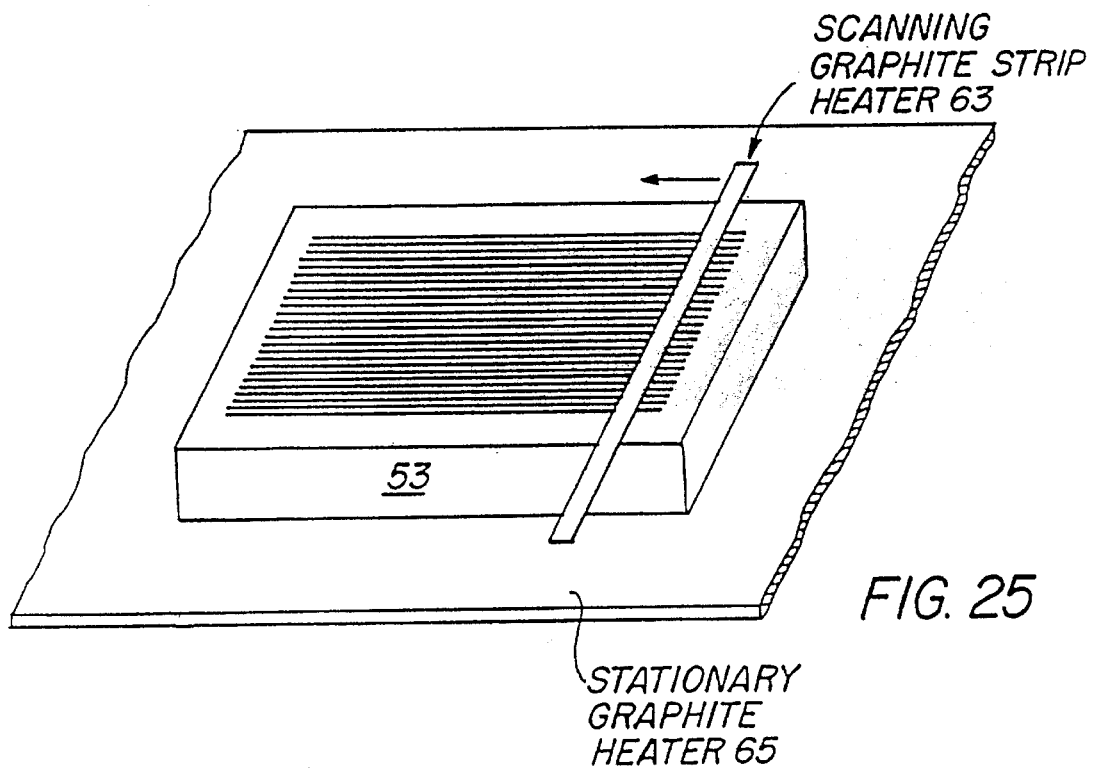
FIG. 25 is a schematic view illustrating one embodiment of a graphite heating system suitable for use with this invention.
Figure 25A:
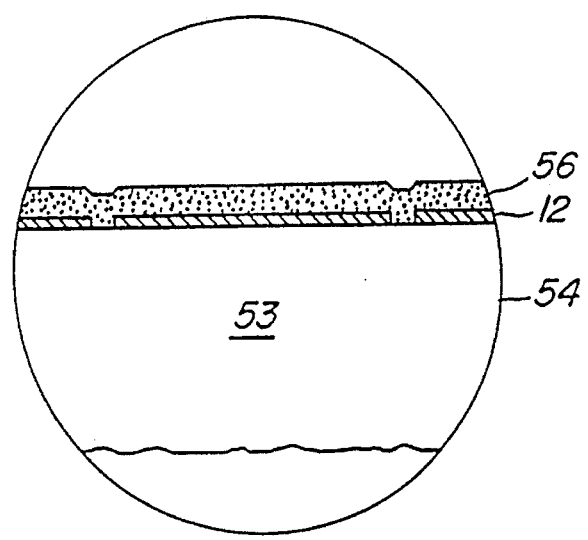
FIG. 25A is an expanded view of a portion of FIG. 25.
Figure 26A:
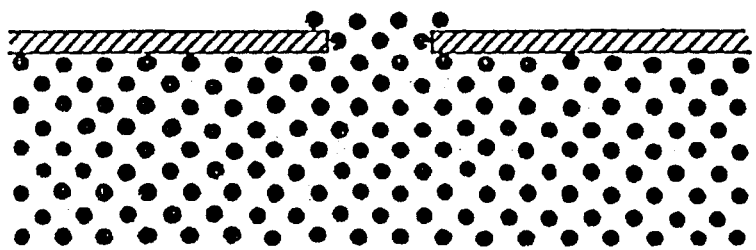
FIGS. 26A–26D present series of schematic views illustrating the way in which laterally overgrown films form.
Figure 26B:
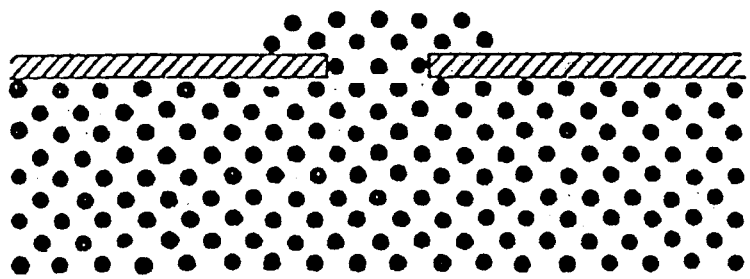
Figure 26C:
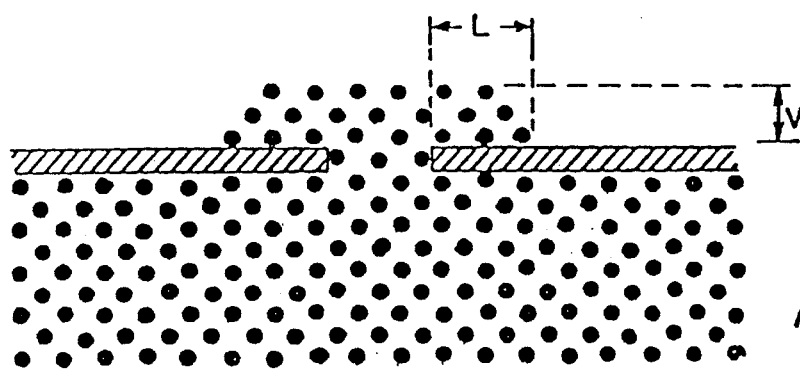
Figure 26D:
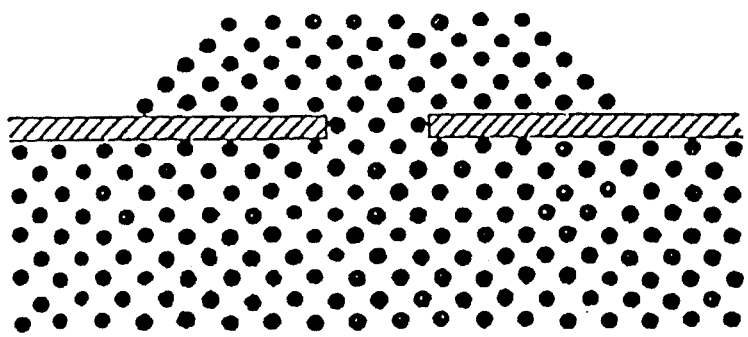

FIG. 25 illustrates schematically the use of a graphite strip heater useful for crystallizing a sheet of material. Slab 53, comprising a substrate of crystalline Si 54 having a growth mask 12 of $SiO_2$ thereon which is overcoated with amorphous silicon 56 (as shown in cross-section in the enlarged insert; FIG. 25A) is placed upon a lower graphite heater 65 which heats slab 53 to a temperature close to its melting point. Upper graphite strip heater 63 is then scanned across the top of slab 53 to heat the amorphous silicon 56 above its melting point.

In FIG. 25, upper graphite strip heater 63 is illustrated as being scanned parallel to the long axis of the stripe openings. It could, of course, be scanned in other directions. For example, it has been found that excellent results can be obtained when the scanned direction is perpendicular to the long axis of the stripe openings. With such perpendicular scanning, it is possible to propagate a lateral epitaxial film from a single stripe opening.

In addition to employing a scanning graphite heater, other heating sources, such as a laser or electron beam, could also be employed. It is preferred to employ a beam having a large aspect ratio, consistent with the geometry of the stripe openings.

It is possible to use a stationary heating technique, such as pulsed heating from a laser or other source. It is also possible to heat slab 56 with a stationary graphite heater having a controlled temperature gradient in the plane of the sample, simulating a scanning effect.

In techniques described above, it is necessary to have lateral overgrowth of material. For purposes of this invention, lateral overgrowth means that at least 10% of the area of the crystalline sheet produced has grown laterally out over the surface of a crystallization substrate. In many cases, of course, the lateral growth rate will be sufficient to allow lateral growth of much greater than 10% of the total area of the crystalline sheet produced.

Preferential lateral growth can be obtained by selection of appropriate growth conditions, crystallographic orientation of the substrate, and orientation of the slits or other openings in the crystal growth mask. The crystal growth conditions which can be adjusted to provide preferential lateral growth include temperature, flow rates, concentrations, growth time, etc.

In most cases, it is preferable that the ratio of lateral-to-vertical growth be at feast about one. Ratios of about 25 have actually been achieved in practice, and it is believed that even higher ratios are possible under proper growth conditions and with appropriate substrate and epitaxial growth mask opening orientations.

Lateral overgrowth of a single crystal film from an opening is illustrated in FIG. 26. The dots represent atoms in a single crystal. Thus, the Figure represents the cross-section of a hypothetical crystal. The atoms in the substrate are completely ordered, as is expected in a single crystal. As the crystal grows, atoms are added in the same ordering, first to fill the opening in mask 12, then laterally out over the surface of mask 12. It should be noticed that the atomic ordering is dependent on the atomic arrangements in the exposed areas, and the areas under the growth mask have little or no effect. The atoms can be supplied in many ways, as for example, from deposition or from crystallization of an amorphous layer. It is the property of crystals under a given set of growth conditions that the growth rate varies depending on the direction it is measured. FIGS. 26B, 26C and 26D illustrate the same crystal of gallium arsenide as FIG. 26A and grown as previously described after 5, 10, and 20 minutes, respectively. If the horizontal and verticle distance between atoms is 10 Å, then it can be seen from FIG. 26C that the lateral growth rate is 4 Å/min and the verticle growth rate is 2 Å/min. Normally, most crystal growth rates are much higher than these values and these are used only for the purpose of illustration. The lateral-to-verticle growth rate ratio is then $G_l/G_v=2$. A simple way then to measure the growth rate ratio is to grow the crystal through a mask for a short period then interrupt the growth and measure L and V as shown in FIG. 26C. The lateral-to-vertical growth rate ratio is then $G_l/G_v=L/V$ (L/V=2 in the illustration).

Figure 27A:
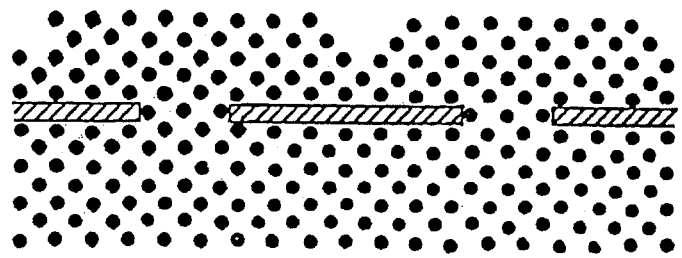
FIGS. 27A–27B present a series of schematic views illustrating the joining of discontinuous laterally overgrown films.
Figure 27B:
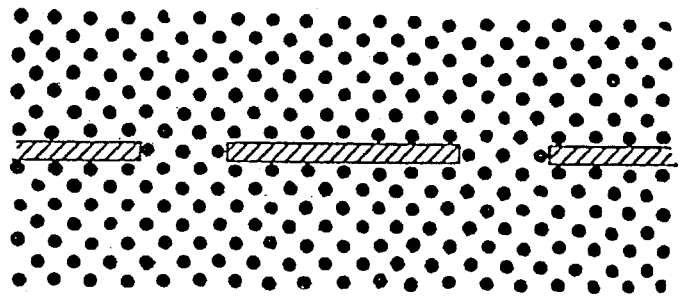

If growth is allowed to continue from two adjacent openings, the growth from the two openings can merge, as shown in FIG. 27A, for a perfect well ordered sheet. Further growth in FIG. 27B will, in many cases, tend to smooth out the top surface.

Of course, it is not necessary for overgrown regions to join in order to produce sheets. It is perfectly permissible, according to this invention, to produce a multiplicity of sheets on the surface of a crystallization substrate. In this case, each region of laterally overgrown crystalline material can form a sheet. For purposes of this invention, overgrown crystalline material is considered to be a sheet if the area of the largest cross-section thereof parallel to the crystallization substrate is equal to or greater than the area of the largest cross-section thereof normal to the substrate.

It is possible, in some cases, that flaws can be formed in the overgrowth where the crystals join under certain conditions as shown in FIGS. 28 and 29. In these Figures, the lateral-to-verticle growth rate ratio is illustrated as 5, and therefore the overgrowth extends further from the mask opening for the same thickness film, compared to that shown in FIG. 26. With such larger extensions, it is possible in some cases to build up stress in the overgrown layer which may cause effects as illustrated. Of course, in other cases, ratios of 5 and much higher do not cause such problems.

Figure 28A:
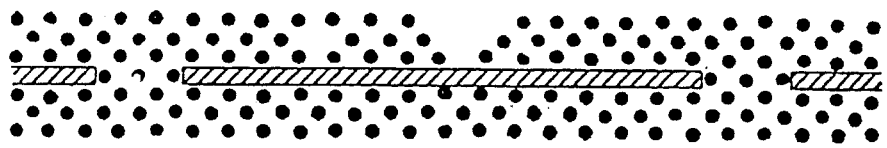
FIGS. 28A–28B and 29A–29B present a series of schematic views illustrating the formation of potential dislocations in laterally overgrown films.
Figure 28B:
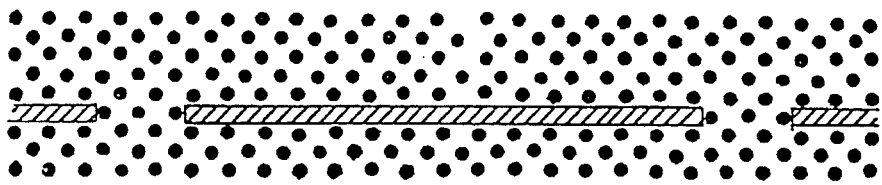

In FIG. 28A, the atoms of the overgrown layer are under compression and are not lining up exactly with the atoms below the mask. Consequently, as growth continues and the regions of lateral growth join in FIG. 28B, there will be extra space between atoms which can lead to a crystal dislocation.

Figure 29A:
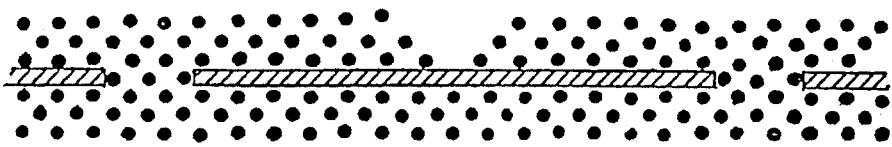
Figure 29B:
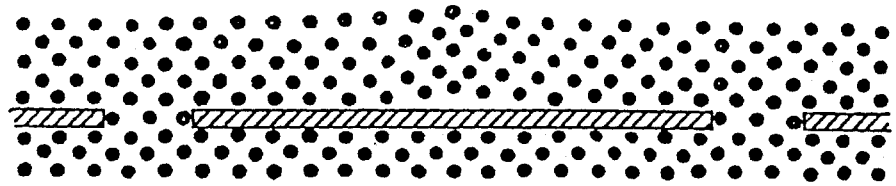

Similarly, the lateral growth in FIG. 29A causes the stress in the overgrown layer which causes the left side to curl up slightly. When the growth joins as shown in FIG. 29B, the match between crystals will not be good and dislocations will be created. This type of stress flaw might be reduced by having a smaller lateral-to-vertical growth ratio because the stress distortions of the crystal may be smaller. In some cases, dislocations and grain boundaries will not be detrimental to certain applications for sheets of crystalline material produced as described herein.

In most of the examples given, the lateral overgrowth has been shown to occur symmetrically from both sides of the slit. The symmetry has been included in the Figures for simplicity and is not a requirement nor is it usually the case nor is it necessarily preferred.

Selective epitaxy is epitaxial growth of a crystal from a crystalline substrate which has a masking material with openings of designed dimensions and geometries. The crystal growth initiating from these selective openings will have a crystalline structure similar to the substrate and will grow into a geometric shape based on the crystal orientation, mask opening geometry and orientation, and crystal growth conditions. Because all these conditions effect the final growth, one must carefully design the geometries, angles, growth conditions, and substrate orientation to optimize the final growth to meet the specific requirements.

Figure 30:
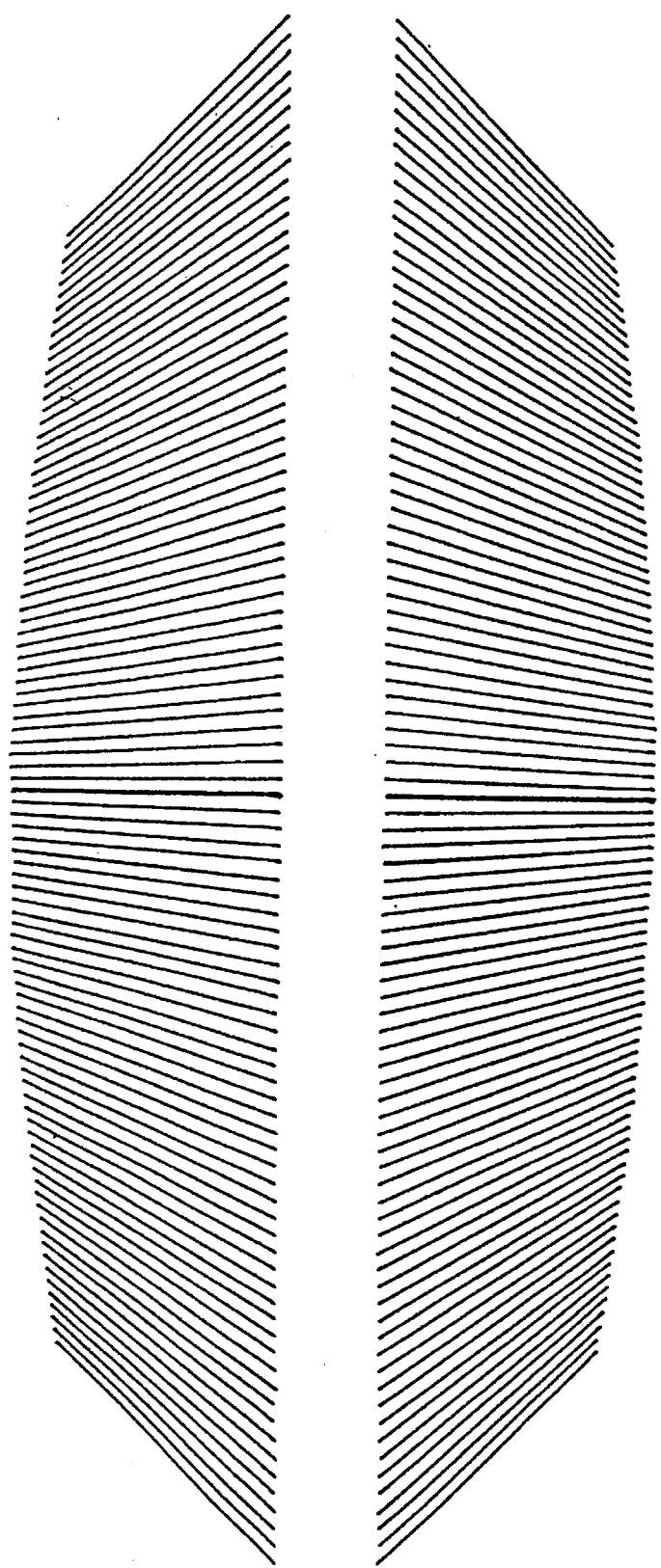
FIG. 30 is a schematic illustration of the FAN mask pattern employed to determine the effect of slit orientation on lateral overgrowth for a given set of growth conditions.

The lateral overgrowth process often incorporates the use of parallel openings where the length of the openings is much greater than the width, and a pattern was designed to produce openings in a masking material which not only has a high length to width ratio, but also varies the angle of each opening from 0° to 90° in 1° increments producing what is called a "FAN" pattern as shown in FIG. 30. From this FAN pattern, one can learn not only the effects of substrate orientation, but also the effects of angle of pattern orientation and the effects of varying growth conditions.

The use of the FAN pattern can be illustrated for gallium arsenide for which it was felt that a very high lateral growth to vertical growth ratio would produce excellent surface morphology along with a minimum of growth defects. The optimum conditions were found in the following manner.

Three major substrate orientations were used, the [100], [110], [111]B. As used herein, brackets indicate plane orientations indices, and parentheses indicate directions perpendicular to the plane orientations with the same indices. The actual substrates were misoriented a few degrees from the major orientation, which does effect the results.

However, in the interest of simplicity, the substrates are considered exactly oriented and later a brief discussion will show the effects of misorientation. Samples of the three orientations were covered with 1000 Å of silicon dioxide and patterned using standard photolithographic techniques to produce the FAN pattern openings in the $SiO_2$. The FAN pattern was exposed on two sections of the surface of the substrate, with the major axis of the pattern rotated 90° from one section to the other. This produced line openings where the surface angle varied from 0° to 180°. The three patterned substrates were epitaxially grown on at the same time. By investigating the growth at each angle of line opening on each type of substrate, the optimum conditions to produce layers of particular design could be chosen.

It was found that each opening produced a different epitaxial growth. For instance, on the [110] crystal surface, the ratio of lateral-to-vertical growth went from 1 to 25 as the angle of the line opening varied from 0° to 60° clockwise from a line in the (110) direction. Continuing clockwise to an angle of 90°, the lateral-to-vertical growth rate ratio decreased. On the other hand, a [100] oriented substrate produced excellent growth at 22½° from the (110) direction, while the [111] B substrate produced good growth at 15° clockwise from any of the three cleaved faces.

Because it is often preferred to have the natural cleavage plane lined up with the artificially created one, the [110] was chosen for GaAs and the line openings were oriented 60° from the (110) direction. This angle produces the maximum lateral-to-vertical growth ratio along with the smoothest surface.

It must be noted that these conditions apply only for the particular case of GaAs for a particular set of growth conditions. By using this same FAN pattern, one can determine the optimum conditions for other materials, such as silicon, and indium phosphide, and for GaAs under different growth conditions.

In the case of silicon, a 1:1 lateral-to-vertical growth rate ratio produced the best results under certain growth conditions. This 1:1 ratio was found 45° clockwise from the [110] flat on a [111] oriented silicon wafer using vapor phase epitaxy growth at 1000° C. with $SiCl_4$ and HCl. Because the [111] plane is an easy cleavage plane for silicon, tests for optimum conditions were performed on this orientation.

The lateral-to-vertical growth rate ratio is an important consideration in the design of the growth mask especially in relation to the desired thickness of the laterally overgrown sheet of crystalline material. It has been found, as noted above, that the lateral growth characteristics for gallium arsenide and silicon are a strong function of the orientation of slits relative to the crystal orientation. As discussed above, the effect of the orientation of the slits can be studied with the aid of a FAN shaped growth mask shown in FIG. 27. Each line in the mask of FIG. 27 is a 2 μm wide slit and successive slits are angled 2° from each other over the range −45° to +45°. The full range of slit angles of 180° may be obtained by making two prints of the mask on a substrate, one print rotated 90° from the other. After lateral growth over such a mask, sections can be made perpendicular to the wafer surface to examine the cross-sectional shape of the overgrowth. This type of study has been made for both gallium arsenide and silicon for a variety of growth conditions, and for masks on the [100], [110] and [111] surfaces. Some examples will be given for gallium arsenide wafers in a $AsCl_3$—Ga—$H_2$ system at a growth temperature of 750° C., a gallium tamperature of 820° C., and a hydrogen flow rate of 900 cc/min in a 54 mm ID tube.

Figure 31:
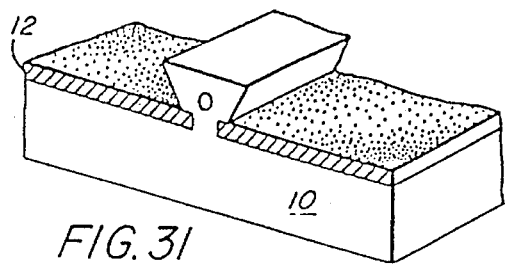
FIGS. 31–38 are schematic views illustrating lateral overgrowth of crystalline films at different slit orientations in the crystal growth mask.
Figure 32:
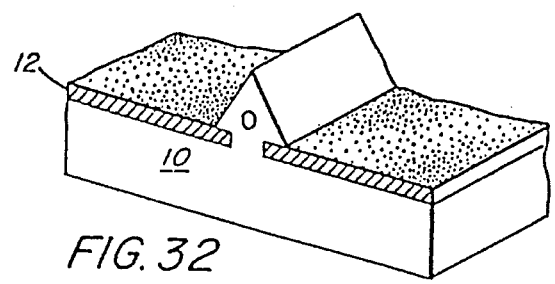
Figure 33:
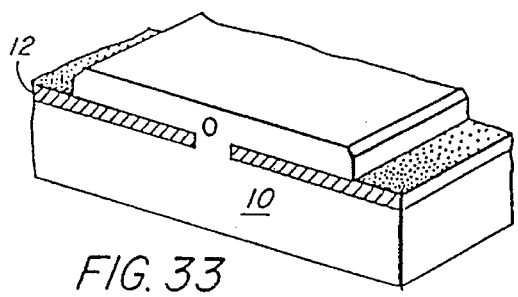
Figure 34:
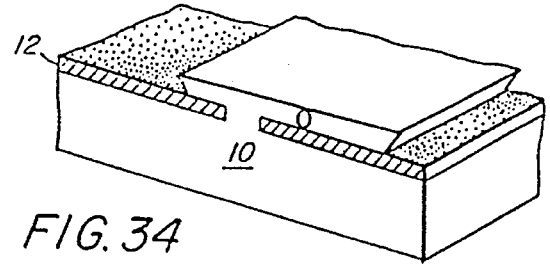
Figure 35:
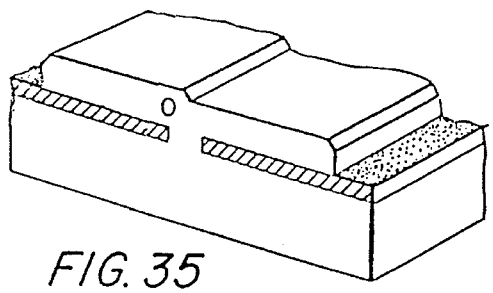
Figure 36:
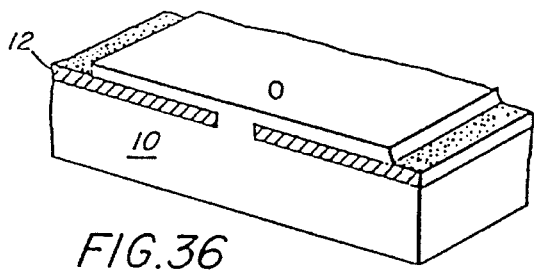

FIGS. 31–36 illustrate lateral overgrowth (o) through a 2 μm slit opening where the masked surface is the [100] plane. In FIG. 31, the line opening is along the (110) direction, and in FIG. 32, the line opening is along the (011) direction. For these cases, the lateral-to-vertical growth rate ratio is small, and for FIG. 31 there is even an overhang. FIGS. 33, 34 and 35 are at +22.5°, +67.5° and 112.5°, respectively, from the (110) direction. The slight tilt of the top surface in FIGS. 31 and 32 is caused because of the slight (2°) misorientation of the substrate. That is, the surface is not exactly [100] oriented. In FIG. 36, the wafer surface was oriented to the [100] plane and the slit is oriented 60° clockwise from the (110) direction. This orientation gives the largest lateral-to-verticle growth rate ratio under the previously given growth conditions for the [100] surface.

Figure 37:
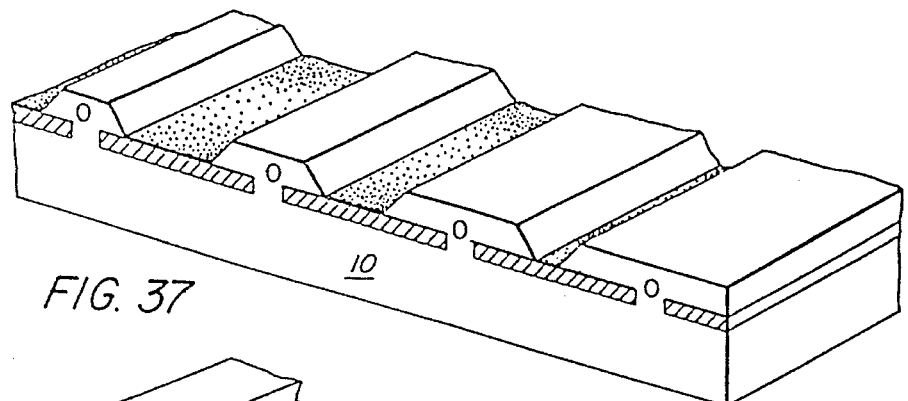

FIG. 37 gives an example of the type of results obtained from the FAN shaped mask pattern for gallium arsenide on the [100] surface. Each slit is oriented 1° from the other, starting with the [110] direction on the left. The second slit from the left is rotated 1° clockwise from the first, the third 2° from the first, and so forth. For this example, the lateral-to-vertical growth rate ratio is increasing as one moves away from the (110) direction.

Figure 38:
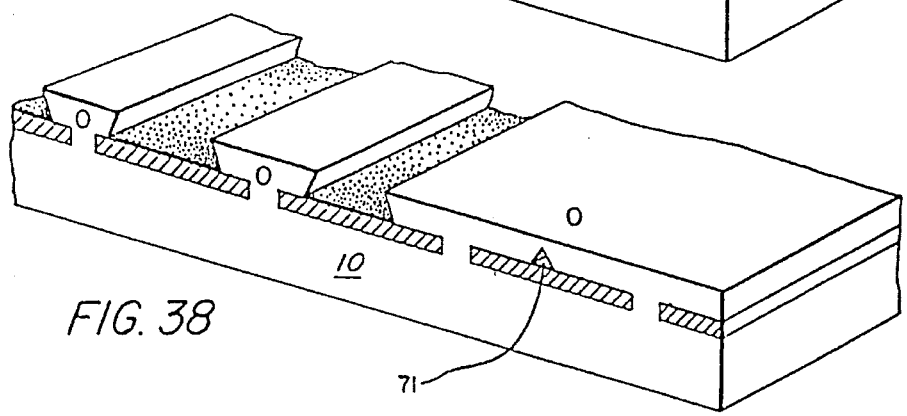
Figure 39A:
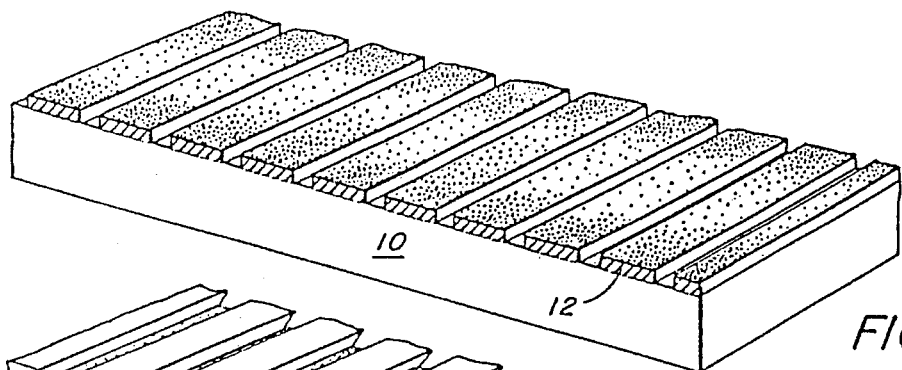
FIGS. 39A–39E present a series of schematic views illustrating the lateral overgrowth of films under conditions suitable for creating voids in the overgrown film.
Figure 39B:
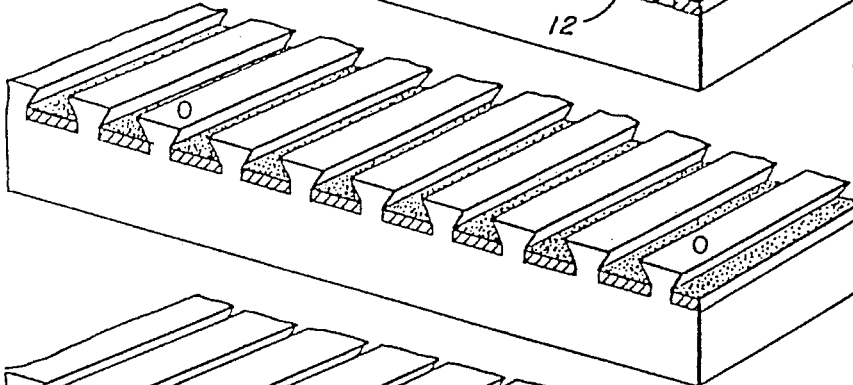
Figure 39C:
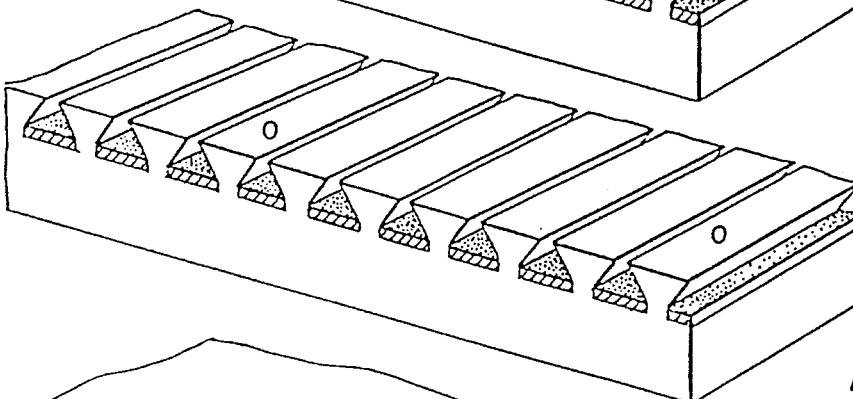
Figure 39D:
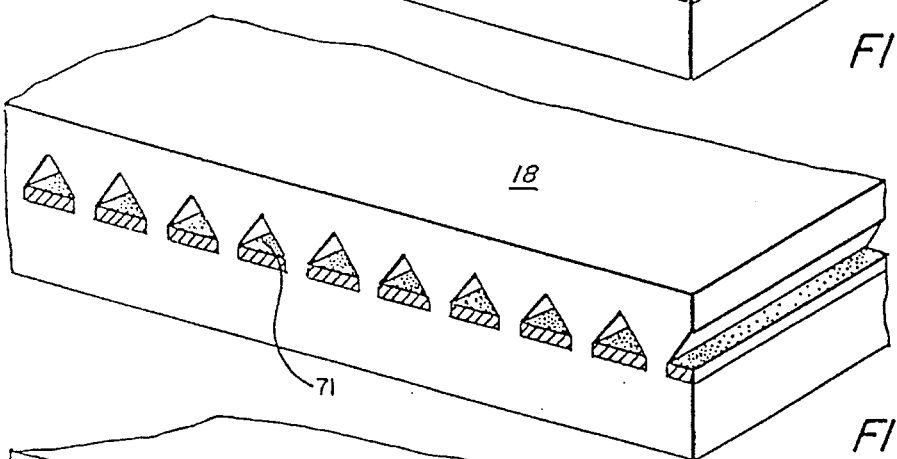
Figure 39E:
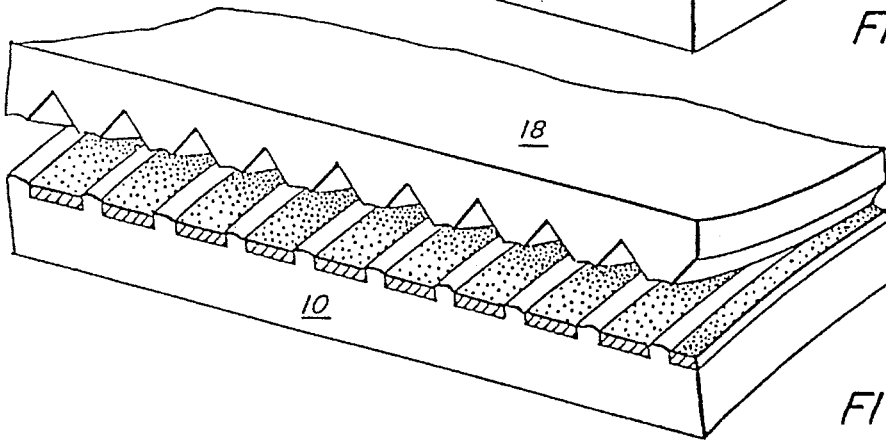

FIG. 38 illustrates growth through slits for the same time and conditions as those of FIG. 37 at a different substrate orientation. The slit on the left is the (110) direction, with succeeding slits each rotated 1° clockwise. It is interesting to note the void 71 enclosed on the right side which occurs during lateral overgrowth. This void would show up as a groove on the back of a peeled layer, which might be an advantage or a disadvantage depending on the application.

In FIG. 39, an embodiment is shown where the growth of voids 71 of FIG. 38 is used to an advantage. With growth mask 12 in place, FIG. 39A, growth is begun and continued, FIGS. 39B–39D. Voids 71 are formed which can serve as a weak point for separating the film by cleaving, FIG. 39E, or they can be used as openings to circulate an etchant.

Figure 40:
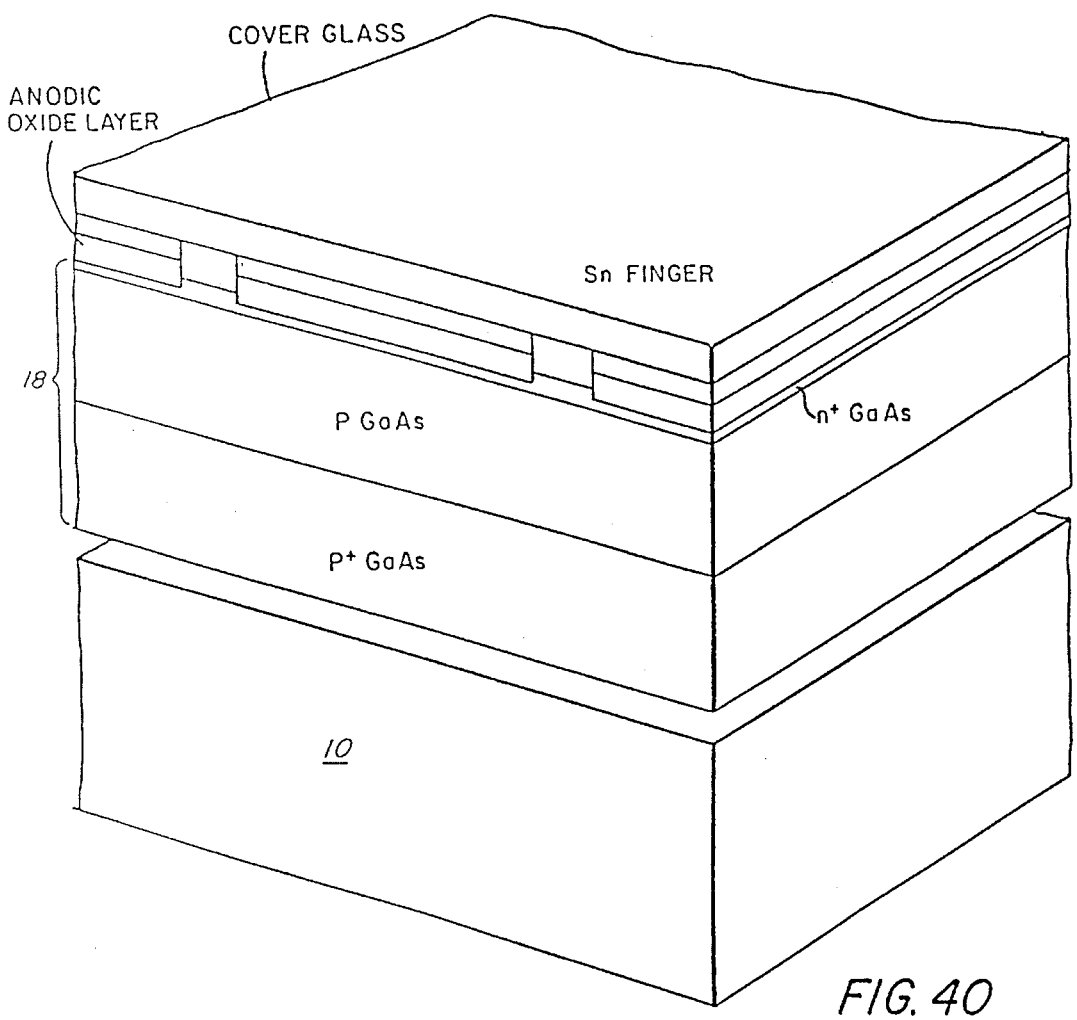
FIG. 40 is a cross-sectional view of a gallium arsenide solar cell based upon a laterally overgrown film of this invention.

FIG. 40 illustrates the fabrication of a gallium arsenide solar cell produced employing the techniques described herein.

A single crystal substrate 10 of gallium arsenide as shown separated from the solar cell formed with a sheet 18 of laterally overgrown gallium arsenide. Any of the previousdlly described techniques for lateral overgrowth of film would be suitable. The p+, p and n+ carrier concentrations are achieved simply by changing the dopants present in the epitaxial reactor. The anodic oxide layer, tin contact, transparent epoxy and cover glass elements are all added by known techniques, and particularly as described in Ser. No. 22,405, filed Mar. 21, 1979, which discloses in great detail the preparation of shallow homojunction solar cells.

Silicon solar cells could be formed by similar techniques. In silicon solar cells the thickness of the silicon should be at least 20 μm, unless a back surface reflector is employed whereby the thickness might be as thin as 10 μm. Such thin layers can be obtained as grown without the requirement for polishing.

Indium phosphide solar cells need active layers of only about 2–3 μm, as is the case with gallium arsenide. With a back surface reflector, 1 μm thick indium phosphide on various secondary substrates would be suitable.

FIG. 41 illustrates double transfer of a laterally overgrown sheet of crystalline material. The process begins with the production of laterally grown epitaxial film 18 ready to be removed from the primary substrate 10 in FIG. 41A, as described above. Film 18 is bonded to secondary substrate 60 and removed from primary substrate 10 as shown in FIG. 41B. Another secondary substrate 62 is bonded to the surface of film 18 by bonding layer 64 in FIG. 41C. Bonding layer 64 can be epoxy or any other appropriate bonding material, First secondary substrate 60 is now removed by preferential etching, melting, etc., of mask 12 as shown in FIG. 41D. The structure in FIG. 41D is now ready for fabrication into devices in much the same manner as would be an ordinary single crystal wafer. If the single crystal film in FIG. 41 were gallium arsenide, silicon, or indium phosphide, one could consider making solar cell or integrated circuits, for example.

Figure 42:
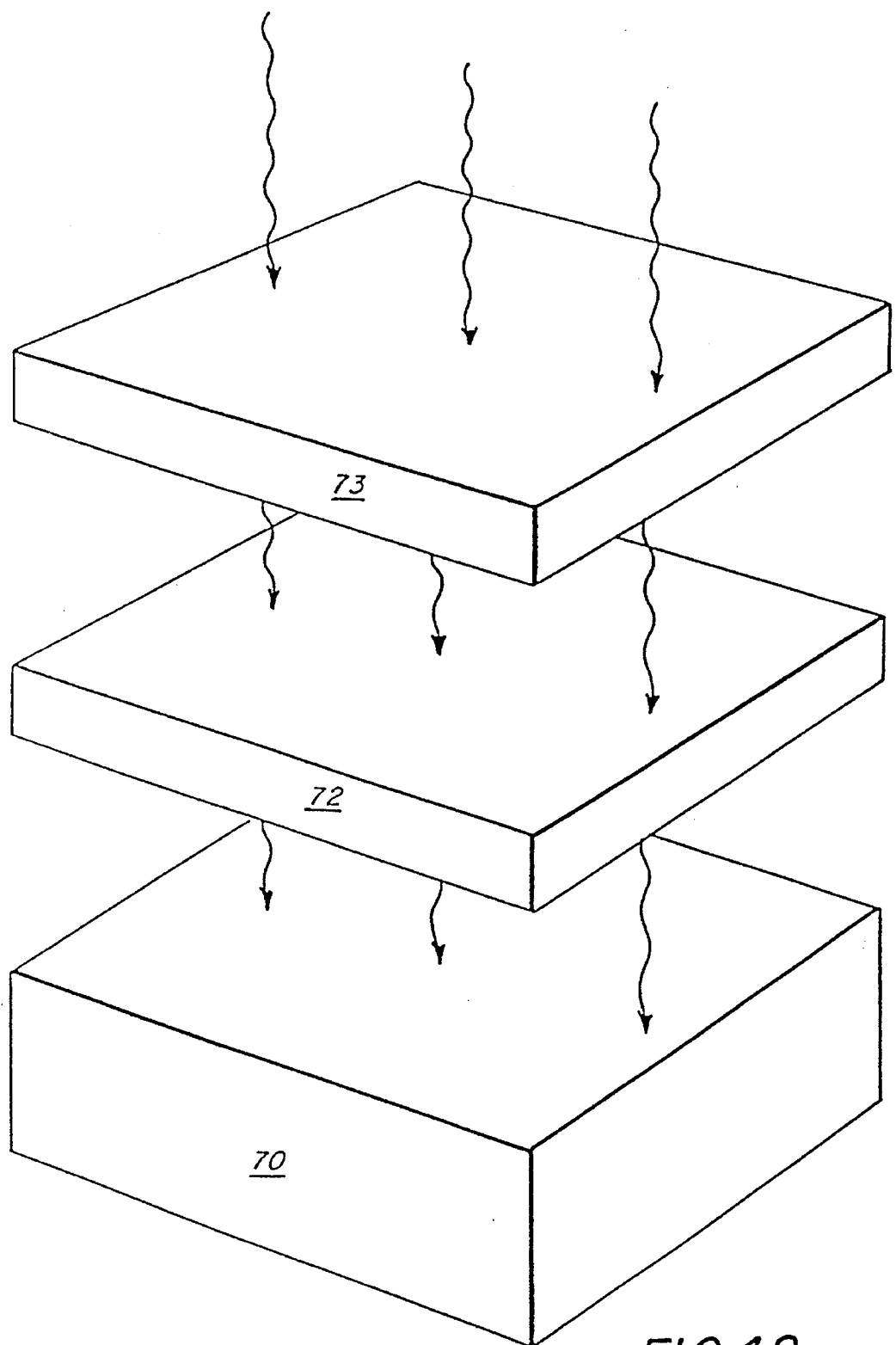
FIG. 42 is a schematic diagram illustrating a three-cell photovoltaic device wherein the cells are based upon laterally overgrown films of this invention.

FIG. 42 illustrates three solar cells fabricated in tandem. This is possible due to the methods described herein for producing very thin films of single crystal semiconductor material. As shown in FIG. 42, bottom cell 70 need not be thin but upper cells 72 and 73 are thin. The three cells can be bonded together with transparent insulating epoxy with proper optical matching. The advantage over a heteroepitaxy tandem cell is that the current and voltage of each cell are decoupled, that is, they can be wired independently. Alternatively, the three cells can be bound together with transparent-conducting epoxy or a layer such as Sn-doped $In_2O_3$. In this case, the cells are connected in series. The advantage of this over conventional tandem cell approach is that the three cells can be fabricated separately and subsequently bonded together. In the conventional tandem cell approach, the three cells must be grown monolithically, with all the inherent difficulties, such as lattice-matching, material interdiffusion, etc. Of course, any number of cells can be joined in tandem.

FIG. 43 illustrates lateral overgrowth without a mask. Substrate 80 can be single crystal, polycrystalline, amorphous, metal, insulating material, etc. The only property required of substrate 80 is that it allow lateral overgrowth, as previously described, and that it remain relatively inert during lateral overgrowth upon its surface. It might be an advantage in some cases to choose a material for substrate 80 which has low adhesion to the laterally overgrown film produced thereon. Of course, a material which does not have the desired properties might be provided with a film at its upper surface to provide such properties and such a coated substrate would also be suitable.

Figure 43A:
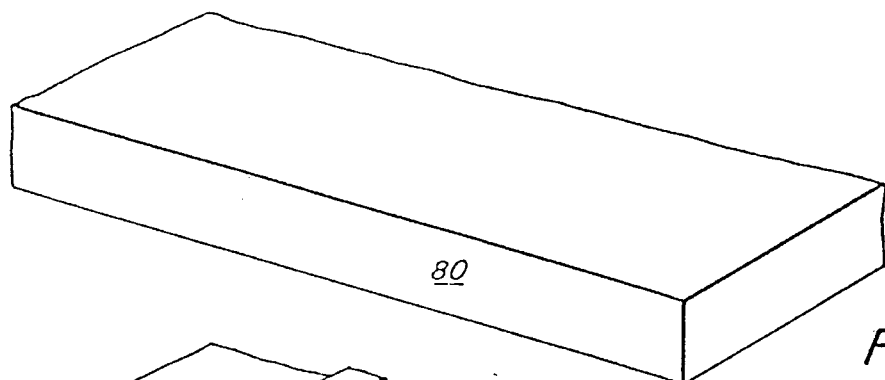
FIGS. 43A–43D presents a series of schematic views illustrating the lateral overgrowth of sheets of crystalline material on substrates having thin strips of crystalline material thereon.
Figure 43B:
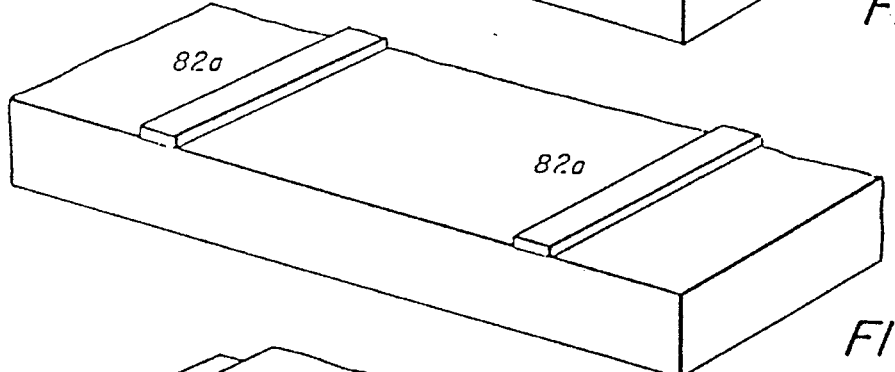

In FIG. 43B, strips 82a, preferably of single crystal material, have been placed or bonded upon the surface of substrate 80. These will serve as suitable sites for crystal nucleation and growth during the lateral overgrowth process.

Figure 43C:
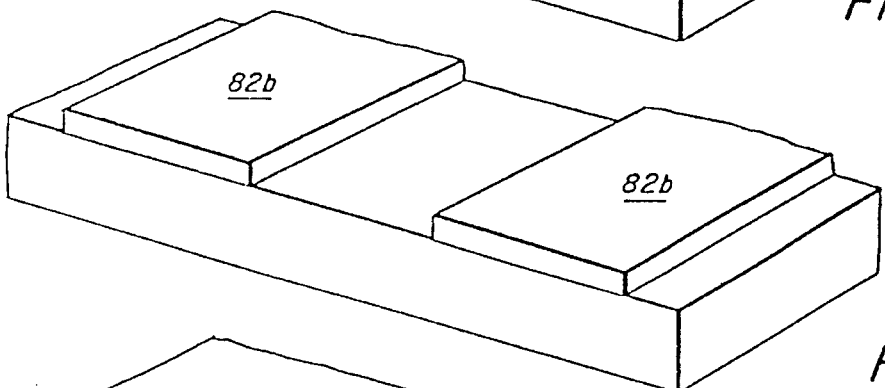

In FIG. 43C, lateral overgrowth has begun to widen strips 82a into sheets 82b. Lateral overgrowth can be continued as previously described in this application to produce a sheet of crystalline material of desired dimensions.

Figure 43D:
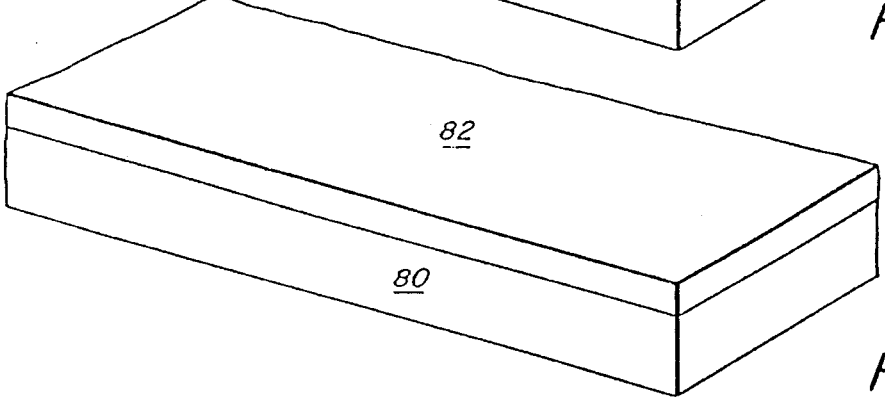

In FIG. 43D, for example, lateral overgrowth has occurred to the point where continuous film 82 has been formed on the surface of substrate 80. Continuous film 82 can now be separated by any of the techniques previously described herein. In particular, if the surface of substrate 80 has low adhesion to film 82, it might be possible to simply lift off film 82.

Figure 44A:
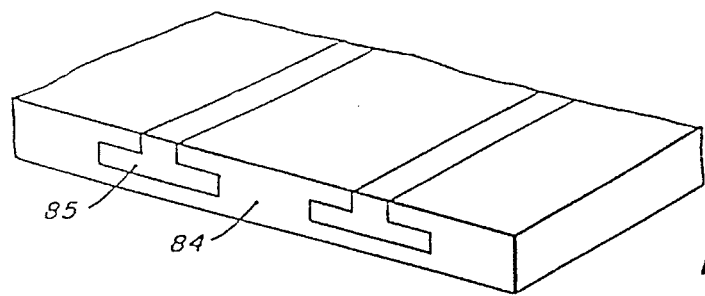
FIGS. 44A–44B presents a series of schematic views illustrating lateral overgrowth of sheets of crystalline material from stripe of crystalline material embedded in a substrate.
Figure 44B:
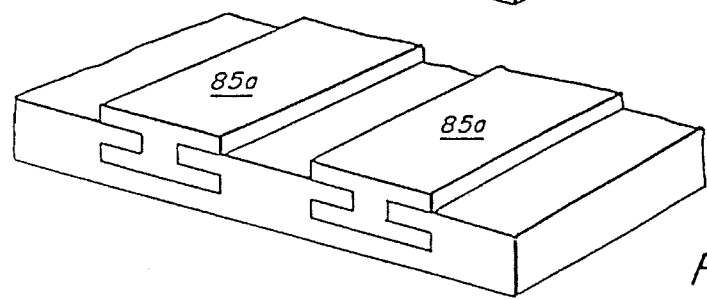
Figure 41A:
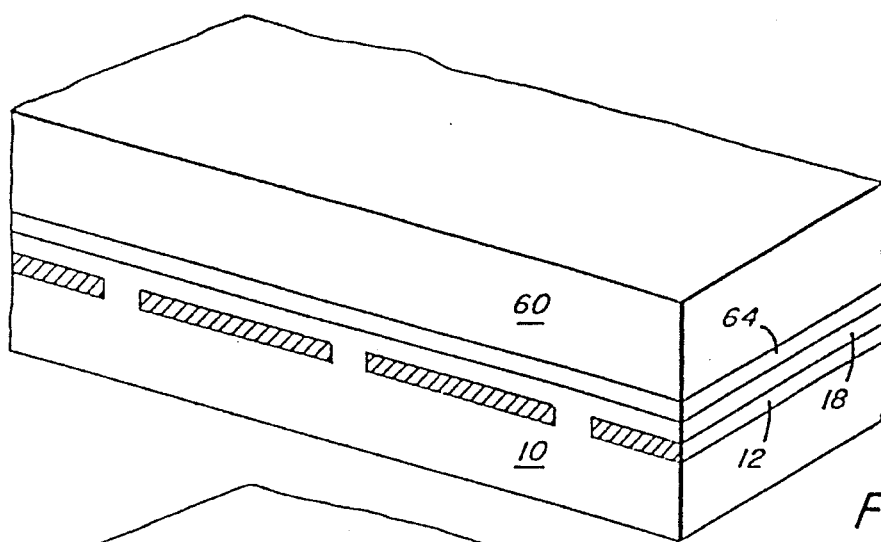
FIGS. 41A–41D present a series of schematic views illustrating double transfer of a laterally overgrown film.
Figure 41B:
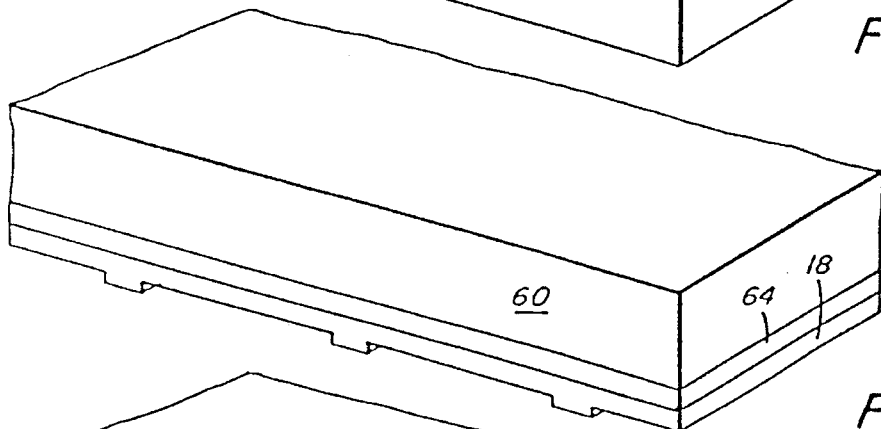
Figure 41C:
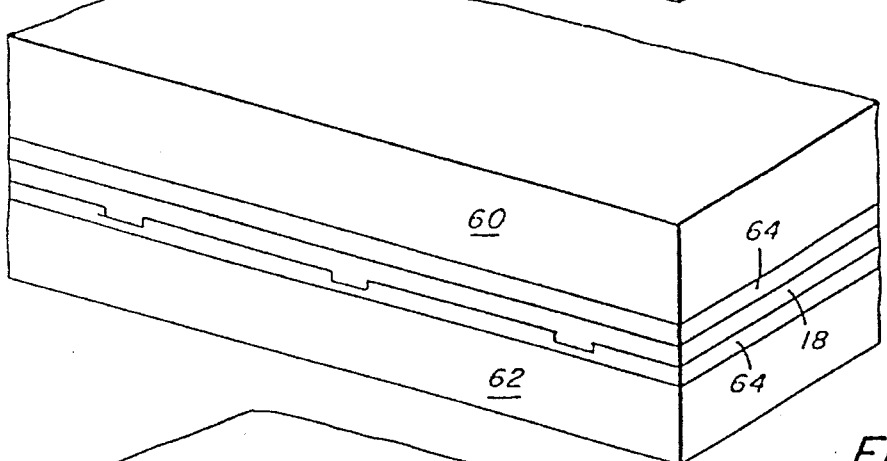
Figure 41D:
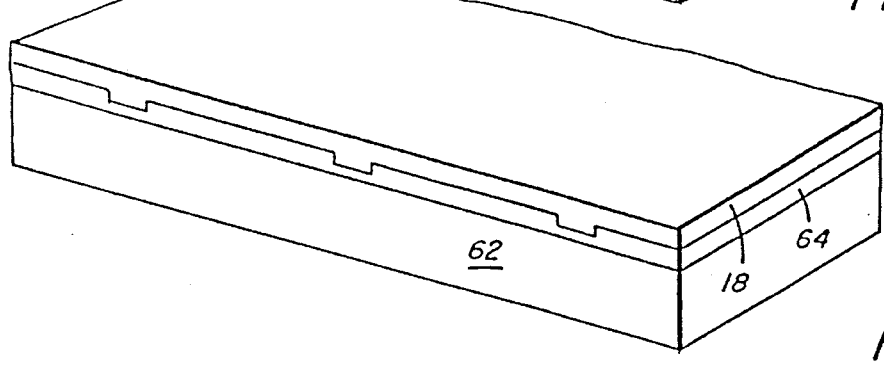

FIG. 44 presents a series of schematic views illustrating the embedding of strips of single crystal material into a substrate. In this case, substrate 84 need not be single crystal and can, in fact, be formed from any material upon which significant crystal nucleation will not occur during a lateral overgrowth technique. Embedded strips 85 of single crystal material might be produced, for example, by a technique as illustrated above with regard to FIGS. 12 and 13.

Substrate 84, with embedded single crystal strips 85, can then be placed in an epitaxial growth reactor and lateral overgrowth can be commenced to form overgrown areas 85a.

Of course, strips 82a and 85a, shown respectively in FIGS. 43 and 44, need not be in the shape of elongated strips and could be a series of segmented strips or could, for that matter, have other shapes.

FIG. 45 illustrates schematically a large-area solar cell panel which could be manufactured using the methods described herein. Reuseable master panel 90 might have a size, for example, of about 2'×4'. Presently, there has been great difficulty, if not impossibility, in fabricating semiconductor sheets in such a size. In this case, reuseable master panel 90 is formed from a plurality of insertable smaller units 91 which are cemented in a contacting and aligned relationship to a suitable substrate 92, which might be a ceramic plate. Inserts 91 could be formed in the size of about 6"×12" and might be formed from germanium substrates having a thin film of single crystal gallium arsenide on the top surface.

Figure 46:
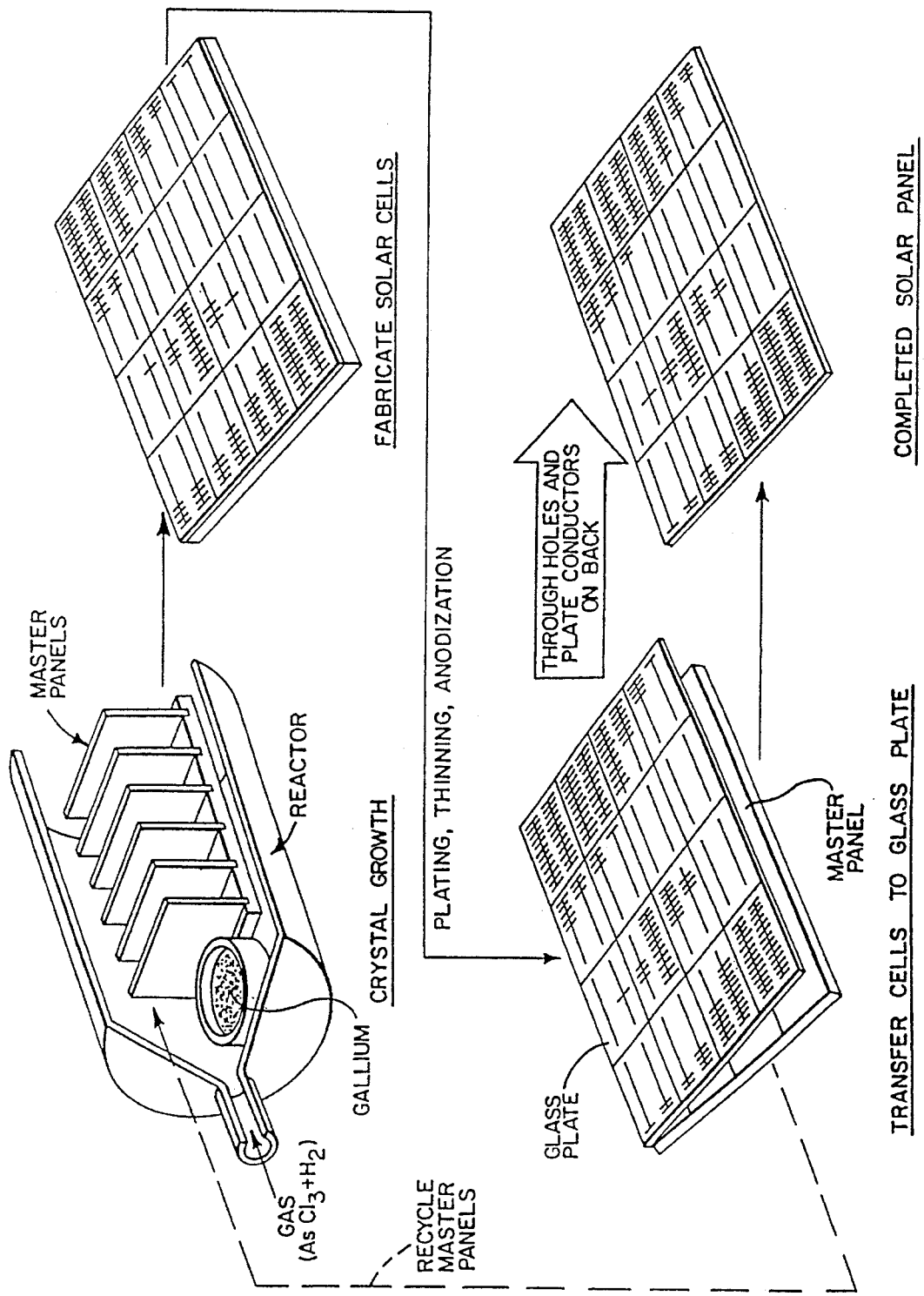
FIG. 46 is a schematic illustration of a process for forming solar panels according to this invention; and, FIGS. 47 and 48 illustrate a solar cell fabricated by the techniques described herein.

One method for using reuseable master panels 90 in mass production of solar cell panels is schematically illustrated in FIG. 46. A gallium arsenide vapor-phase epitaxy reactor capable of holding many reuseable master panels is provided. Gallium arsenide lateral epitaxial films are grown in this reactor over reuseable master panel 90 as follows.

Initially, a crystallization growth mask is applied to the single crystal gallium arsenide layer on film inserts 91. This mask might be capable of repeated cycles through the reactor. In the reactor, a laterally grown gallium arsenide film is grown up through the mask and over the surfaces of inserts 91 to form a continuous gallium arsenide film over panel 90.

The panels 90 are removed from the reactor and solar cells are then fabricated by traditional steps, such as plating, anodization, etc., on the surface of each film insert 91. The gallium arsenide laterally grown epitaxial film containing the cells is then bonded to a glass plate having a size similar to the reuseable master panel 90. Gallium arsenide cells are transferred to the glass sheet from master panel 90 by cleaving along a plane of,;weakness as described above. The reuseable master panel 90 can then be recycled through the reactor. The epitaxial film on the glass substrate requires a few additional steps to complete fabrication of a solar panel. Clearly, lateral epitaxial films of other semiconductor materials could be employed in the fabrication of such solar panels.

This invention can be more specifically illustrated by the following examples.

EXAMPLE 1

A single crystal gallium arsenide substrate, 15 mils thick, and doped with chromium to make it an insulator was employed. The substrate was oriented in the [110] direction, which is a cleavage plane. Shipley 1350J Photoresist was spun onto the surface and dried in a pre-exposure bake. A pattern of stripe openings, each 2.5 μm wide, each on 50 μm centers was contact printed onto the photoresist oriented 60° clockwise from the [110] plane. The coated substrate was then heated to 400° C. in air for one minute to carbonize the photoresist.

After brief chemically etching, the coated substrate was placed in an $AsCl_3$—Ga—$H_2$ epitaxial reactor and the substrate was heated to a temperature of 740° C. Crystal growth occurred in the stripe openings through the carbon layer and subsequently out over the surface of the carbon layer. The lateral growth from adjacent openings joined when the thickness of the film was approximately 1 μm. Growth was continued until this continuous film has a thickness of 5.8 μm.

In order to transfer the laterally-grown film from its original substrate, the surface was bonded to a 10 mil thick glass plate employing Hysol white epoxy-patch kit, Number 0151. This epoxy is rigid and contains no bubbles. The epoxied sandwich was bonded between two rigid glass plates using wax. In order to separate the film from the substrate, the tip of a screwdriver was inserted into the gap between the two plates and then tapped lightly with a hammer. The layers separated easily along the [110] cleavage plane where GaAs grew up through the carbonized mask because of the low adhesion of carbon to gallium arsenide and crystal weakness. Thus, the entire epitaxial film was bonded to its new substrate while the original substrate remained attached to the glass plate.

The substrate was removed from the glass plate and cleaned with a detergent spray to remove the carbon film after which it was in nearly the same condition as at the beginning of the process. Approximately 1,000 Å of gallium arsenide was then removed from the substrate using a light cleaning etch and the substrate was reusable.

EXAMPLE 2

The procedures and materials of Example 1 were employed, except as otherwise noted, to produce four films of gallium arsenide on glass substrates using the same substrate. These films were 5, 10, 10 and 8 μm, and the area of each film was about 3.8 cm. From these results, it was estimated that at least 1000 films could be generated from one 25 mil thick gallium arsenide substrate.

EXAMPLE 3

The electrical characteristics of a film produced according to this invention were evaluated as follows. An epitaxial, sulphur-doped layer was grown on two wafers, one with preparation for the process employing reuseable substrates described herein, and the other as a control sample without any photoresist masking. Both were chromium doped, semi-insulating substrates with [110] orientation. After growth, Hall measurements were made on both wafers using the Van der Pau technique with ohmic contacts at the corners of one-quarter $cm^2$ Hall samples. The epitaxial film on the reuseable substrate sample was transferred to a glass substrate with contacts and wires still attached. Measurements of this transferred film were then made again and the results of all measurements are presented in Table 1.

TABLE I

| Sample | | Thickness (μm) | Temperature (°K.) | Electron Density (σ/$cm^3$) | Electron Mobility ($cm^2$/V-sec) | $N_A/N_D$ |
|---|---|---|---|---|---|---|
| Epitaxial Film on Semi-Insulating Substrate | | 9.4 | 300 | $3.3 \times 10^{16}$ | 5,900 | 0.31 |
|  | | | 77 | $2.6 \times 10^{16}$ | 11,100 | |
| Lateral Epitaxial Film Over | Before | 5.8 | 300 | $3.6 \times 10^{16}$ | 4,900 | — |

TABLE I-continued

| Sample | Thickness (μm) | Temperature (°K.) | Electron Density (σ/cm$^3$) | Electron Mobility (cm$^2$/V-sec) | $N_A/N_D$ |
|---|---|---|---|---|---|
| Carbonized Photo-Resist on Semi-Insulating Substrate | Transfer | 77 | — | — | |
| | After | 300 | $3.5 \times 10^{16}$ | 4,800 | 0.42 |
| | 5.8 Transfer | 77 | $2.7 \times 10^{16}$ | 9,100 | |

The electron mobility of the laterally-grown layer were slightly less than the control sample, but the $N_A/N_D$ of 0.4 indicated that it was a very high quality. There were essentially no changes after film transfer.

The electrical properties of these films were comparable to the best results previously attainable for gallium arsenide films produced by any previously known growth process at these doping levels.

EXAMPLE 4

The procedures of Example 1 were employed, except as otherwise noted, to produce a separated crystalline sheet of GaAs Using a single crystal GaAs substrate oriented in the [100] direction 5° off toward the nearest [110] plane. The layer separated easily leaving the separated sections of GaAs a little more uneven than if a [110] substrate was chosen. Although the [110] substrate is preferred, other orientations may be used depending on the application.

EXAMPLE 5

A silicon wafer is used for the substrate and it is oriented [111], which is the cleavage plane. A 500 Å thick SiO$_2$ layer is provided using thermal oxidation of the entire surface of the wafer. This layer is part of the growth mask which provides a barrier against growth so that the silicon will not grow through the silica powder which is to be used as the other part of the growth mask. The powder is applied to the surface using a mixture of 1375 Shippley Resist and silica powder with a particle size of about 1 μm. Using conventional photolithographic techniques stripe openings are formed aligned 45° with the [110] direction which are 4 μm wide spaced 50 μm center to center in the resist layer which is about 6 μm thick. The photoresist is removed from among the particles of the powder by rinsing the wafer acetone. The particles remain in place on the surface with the same pattern as before.

The following conditions were used to obtain silicon overgrowth. The epitaxial reactor is a SiCl$_4$—H$_2$—HCl system. The amount of HCl was adjusted so as to maximize lateral overgrowth. The typical growth temperature was about 1,000° C., with a growth rate of about 0.5 μm per minute. The flow rates of SiCl$_4$, H$_2$ and HCl were 1.5 g/min, 55 cc/min and 8 cc/min., respectively. The overgrowth ratio was about 1. The Si films became continuous when the film was about 25 μm thick. A separation procedure similar to Example 1 was employed.

EXAMPLE 6

The preparation of InP films is very similar to those for GaAs. The VPE reactor uses the PCl$_3$—In—H$_2$ process. The growth temperature is about 600° C., and an overgrowth ratio of five is easily obtained. For InP, the carbonized photoresist, as in the case of GaAs, works well. The cleavage plane in InP is [110], and it was found that lateral overgrowth could be achieved by orienting the slits 30° clockwise from the (110) direction. This was determined using the FAN pattern. Separation was done by the procedure of Example 1.

EXAMPLE 7

Fabrication of a solar cell, as illustrated in FIGS. 47, 47A and 48, was achieved, as follows.

A growth substrate was first prepared. The GaAs substrate used to fabricate the film was a single crystal with a surface oriented as close as possible to the (110) plane. The wafer was finally thinned to a working thickness of 16 mils from 24 mils by chemically polishing 3 mils each side with 50:50 NH$_4$OH:H$_2$O$_2$ at 53° C., Clorox polishing 1 mil from one side, and finally etching ½ mil each side using 5:1:1 H$_2$SO$_4$:H$_2$O$_2$:H$_2$O at 27° C.

A mixture of 7:2 thinner and Shipley 1350J photoresist was uniformly spun onto the substrate by manually increasing the rpm from 0 to 7000 fairly quickly. This was followed by a heat treatment of 400° C. for 30 seconds after reaching 400° C. within 2 minutes which forms the layer of carbonized photoresist (CPR). A thin layer of about 300 Å of pyrolytic SiO$_2$ was deposited at 400° C. for 20 seconds. The line openings were then accomplished by conventional photolithographic techniques.

The line openings were opened in the SiO$_2$ film by a 15 second soak in buffered HF. The photoresist was then removed using acetone. To remove the CPR a plasma etch was used in the strip mode for 5 minutes at 1 Torr using a He/O$_2$ gas mixture and 50 watts of power. A light etch of 963 ml of H$_2$O:7 ml H$_2$O$_2$:30 ml NH$_4$OH for 15 seconds at room temperature was the final treatment prior to loading into the epitaxial reactor.

An epitaxial layer 10–11 μm thick was then grown on top of the SiO$_2$-CPR structure by growing at a temperature of 700° C. for a total of 2 hours and 10 minutes. Under these conditions, the necessary n$^+$/p/p$^+$ homojunction solar cell material was produced by introducing the proper dopants at the proper times.

After removing the sample from the reactor, a solar cell was fabricated and tested in the following manner. Using conventional photolithographic procedures, 20 finger openings were made in a photoresist film on the epitaxial film and 2–3 μm of tin was plotted in the finger openings. This first resist layer was removed and a second layer applied and patterned in a rectangular area defining the active area of the solar cell. The top 1 μm of the gallium arsenide epitaxial layer outside the active area was then etched away.

Cell performance was optimized by an anodization-thinning technique. This was accomplished by contacting the p$^+$ layer with a wire followed by mounting the sample in black wax being careful to leave the free end of the uncovered wire. Using an anodization solution of propylene glycol, acetic acid, and NH$_4$OH, the cell was anodized to 43 volts which produced an antireflection coating. This mounted cell was then measured under a simulated sunlight source. The current was low which meant that the top n⁺ layer was too thick and required thinning. This was accomplished by immersing the sample in 1% HCl for 1 minute. The cell was then re-anodized and re-measured. The current was still low and the cycle was repeated until the cell produced an open circuit voltage of 0.943 volts and a short circuit current of 11.89 mA.

The next step was to transfer the cell from its substrate to a second substrate. The cell was demounted from the black wax and the lead was removed. Epoxy Stycast 12 was mixed using 3 drops of catalyst to 7 drops of resin. One drop of this epoxy was placed on the surface of the cell. Both cell and an antireflection coated 10 mil glass plate were placed on a hot plate at 60° C. and allowed to reach that temperature in about 2–3 minutes. The glass with the antireflection coating facing up was then placed on top of the cell making absolutely sure that no bubbles form in the epoxy and epoxy filled in between the fingers. This assembly was left to cure on the hot plate for 1 hour at 60° C.

To actually separate the cell, this sandwich was placed with the glass side down in an adhesive wax (Sears hot wax) on a thick 2"×2"×¼" glass block at 60° C. A second thick plate glass with adhesive wax was placed on top of the back side of the cell's substrate. After placing a wedge between the two thick glass blocks and lightly tapping with a hammer, the two halves separated at the carbon-GaAs interface. The cell mounted on its magnesium fluoride coated glass was then cleaned using acetone.

Prior to testing this separated solar cell, it was necessary to plate 2 μm of gold on the back side where the cell separated from its substrate. It was also necessary to etch some GaAs away to expose a tin contact pad connecting to the contact fingers. This was accomplished by covering the back with black wax leaving an exposed area near the contact and etching using F.E. until the tin pad was exposed.

The cell was tested by making contact to the tin pad and the plated gold with the following results.

| | |
|---|---|
| Area (Sq Cm) | .510 |
| Spectral Type AM | 1 |
| Cell Temp (°C.) | 25.7 |
| Normd. Source PWR (mW) | 100 |
| ISC (mA) | 11.89 |
| VOC (Volts) | .943 |
| JSC (mA/Cm²) | 22.99 |
| Fill Factor | .785 |
| Efficiency (%) | 17. |

INDUSTRIAL APPLICABILITY

This invention has industrial applicability in the production of Sheets of crystalline material, including semiconductors, oxides and other crystalline materials.

EQUIVALENTS

Although most of the description above is limited to gallium arsenide, silicon and indium phosphide, other semiconductors, including germanium, cadmium telluride, etc., or their associated alloys (e.g., InGaAsP, GaAlAs, HgCdTe) can also be employed in the fabrication of sheets of crystalline materials according to this invention. Similarly, other growth techniques for growing crystalline semiconductor layers over growth masks could be employed instead of the vapor-phase epitaxial overgrowth technique described. Instead of the. AsCl₃—GaH₂ vapor-phase epitaxial overgrowth technique described, other growth techniques including metal-organic epitaxy, molecular beam epitaxy, liquid-phase epitaxy, vapor-phase epitaxy using other chloride systems and pyrollitic decomposition could be employed. Similarly, other growth mask patterns other than the parallel slits specifically described could be employed and also could be used to encourage lateral growth. Also, the mask need not be a separate material from the substrate, but might be substrate material treated to act as a mask.

Those skilled in the art will recognize other equivalents to the specific embodiments described herein, which equivalents are intended to be encompased by the claims attached hereto.

We claim:

1. An electronic device comprising:

a substrate for supporting the electronic device;

a first thin-film layer of semiconductor material, a second thin-film layer of semiconductor material, and a third thin-film layer of semiconductor material, each layer of semiconductor material comprising a respective electronic circuit having a thickness of about 10 microns or less; and two layers of adhesive material, a first layer of adhesive material being between the first thin-film layer and the second thin-film layer of semiconductor material to attach the first and second thin-film layers of semiconductor material together to form a circuit structure and a second layer of adhesive material to attach the circuit structure to the third thin-film layer of semiconductor material to form the electronic device.

2. The electronic device of claim 1 wherein the layers of semiconductor material include at least one layer of single crystal silicon material.

3. The electronic device of claim 1 wherein the substrate is optically transparent.

4. The electronic device of claim 1 wherein the adhesive material is an epoxy.

5. The electronic device of claim 1 wherein the first, second, and third layers of semiconductor material are coupled together to interconnect the respective electronic circuits.

6. The electronic device of claim 1 wherein the electronic circuits are separately and independently fabricated.

7. The electronic device of claim 6 wherein the electronic circuits are integrated circuits.

8. An electronic device comprising:

an optically transmissive substrate for supporting the electronic device;

a first thin-film layer of single crystal silicon material, a second thin-film layer of single crystal silicon material being positioned over the first layer, and a third thin-film layer of single crystal silicon material being positioned over the second layer, each layer of the silicon material comprising a respective prefabricated electronic circuit;

a first layer of adhesive material, the first layer adhesive material being positioned between the first layer of silicon material to attach the first layer of silicon material to the second layer of silicon material to provide a circuit structure; and a second layer of adhesive material to attach the circuit structure to the third layer of silicon material to provide the electronic device.

9. The electronic device of claim 8 wherein the substrate is glass.

10. The electronic device of claim 8 wherein at least one layer of silicon is recrystallized essentially single crystal silicon material.

11. The electronic device of claim 8 wherein the layers of first adhesive material includes conductive material to interconnect adjacent electronic circuits.

12. The electronic device of claim 8 wherein the first adhesive material is an epoxy.

13. The electronic device of claim 8 wherein the second adhesive material is an epoxy.

14. The electronic device of claim 8 wherein the first and second layers of adhesive material are the same type of adhesive.

15. The electronic device of claim 8 wherein the electronic circuits are integrated circuits.

16. A method of fabricating an electronic device comprising the steps of:
   fabricating at least two electronic circuits, each electronic circuit being formed with a respective thin-film of semiconductor material on a respective fabrication substrate;
   providing a device substrate for supporting the electronic device; and
   transferring each electronic circuit from the respective fabrication substrate to the device substrate in a sequential order to form a vertical stacked electronic device, each electronic circuit being attached to the electronic device with an adhesive layer.

17. The method of claim 6 wherein the step of transferring comprises:
   applying a layer of epoxy adhesive material over the semiconductor material;
   adhering the electronic circuit to the device substrate; and
   removing the fabrication substrate from the semiconductor material.

18. The method of claim 7 further comprising an integrated circuit in one of the electronic circuits.

19. The method of claim 6 wherein the step of fabricating comprises forming transistors in single crystal silicon over an insulating layer.

20. The method of claim 6 further comprising the step of interconnecting the transferred electronic circuits.

21. An electronic device comprising:
   a substrate for supporting the electronic device;
   a first thin-film layer of semiconductor material and a second thin-film layer of semiconductor material, each layer of semiconductor material comprising a respective integrated circuit; and
   a layer of adhesive material, between the first and second thin-film layers of semiconductor material to attach the layers of semiconductor material together to form a circuit structure, the integrated circuit in the first thin-film layer being connected to the integrated circuit in the second thin-film layer.

22. The electronic device of claim 21 wherein the layers of semiconductor material include at least one layer of single crystal silicon material.

23. The electronic device of claim 21 wherein the substrate is optically transparent.

24. The electronic device of claim 21 wherein the adhesive material is an epoxy.

25. The electronic device of claim 21 wherein the layers of semiconductor material are connected together through the adhesive layer.

26. The electronic device of claim 21 wherein the integrated circuits are separately and independently fabricated.

\* \* \* \* \*

UNITED STATES PATENT AND TRADEMARK OFFICE
CERTIFICATE OF CORRECTION

PATENT NO. : 5,588,994
DATED : December 31, 1996
INVENTOR(S) : Carl O. Bozler, John C.C. Fan and Robert W. McClelland It is certified that error appears in the above-indentified patent and that said Letters Patent is hereby corrected as shown below:

Claim 17, line 27, delete "6" and subtitute therefor --16--.
Claim 18, line 1, delete "7" and substitute therefor --17--.
Claim 19, line 3, delete "6" and substitute therefor --16--.
Claim 20, line 6, delete "6" and substitute therefor --16--.

Signed and Sealed this

Sixteenth Day of December, 1997

Attest:

BRUCE LEHMAN

*Attesting Officer*     *Commissioner of Patents and Trademarks*